US012619326B2

(12) United States Patent
Yamazaki et al.

(10) Patent No.: US 12,619,326 B2
(45) Date of Patent: May 5, 2026

(54) DISPLAY DEVICE AND ELECTRONIC DEVICE

(71) Applicant: SEMICONDUCTOR ENERGY LABORATORY CO., LTD., Atsugi (JP)

(72) Inventors: Shunpei Yamazaki, Tokyo (JP); Hajime Kimura, Kanagawa (JP)

(73) Assignee: Semiconductor Energy Laboratory Co., Ltd., Atsugi (JP)

( * ) Notice: Subject to any disclaimer, the term of this patent is extended or adjusted under 35 U.S.C. 154(b) by 0 days.

(21) Appl. No.: 19/101,617

(22) PCT Filed: Jul. 27, 2023

(86) PCT No.: PCT/IB2023/057608
§ 371 (c)(1),
(2) Date: Feb. 6, 2025

(87) PCT Pub. No.: WO2024/033738
PCT Pub. Date: Feb. 15, 2024

(65) Prior Publication Data
US 2026/0050338 A1      Feb. 19, 2026

(30) Foreign Application Priority Data

Aug. 10, 2022    (JP) ................................. 2022-127782

(51) Int. Cl.
*G06F 3/041*          (2006.01)
*G06F 3/044*          (2006.01)
(Continued)

(52) U.S. Cl.
CPC ........ *G06F 3/0412* (2013.01); *G06F 3/04164* (2019.05); *G06F 3/0443* (2019.05);
(Continued)

(58) Field of Classification Search
None
See application file for complete search history.

(56) References Cited

U.S. PATENT DOCUMENTS 7,399,991 B2      7/2008  Seo et al.
9,316,857 B2 *    4/2016  Yamazaki ........... G02F 1/13338
(Continued)

FOREIGN PATENT DOCUMENTS

CN          104752484 A      7/2015
CN          109085943 A      12/2018
(Continued)

OTHER PUBLICATIONS

International Search Report (Application No. PCT/IB2023/057608) Dated Oct. 24, 2023.
(Continued)

*Primary Examiner* — Krishna P Neupane
(74) *Attorney, Agent, or Firm* — Fish & Richardson P.C.

(57) ABSTRACT
A display device including a touch sensor and a driver for driving the touch sensor is provided. The display device has a touch panel function, an electrode of the touch sensor is electrically connected to a first driver circuit formed mono-lithically on a substrate where a pixel circuit is formed. A transistor including a metal oxide in a semiconductor layer can be used in the first driver circuit. The transistor included in the first driver circuit is easily downsized and can operate at high speed. Thus, the area occupied by the circuit can be reduced, which contributes to a narrower bezel.

18 Claims, 21 Drawing Sheets

(51) Int. Cl.

| | |
|---|---|
| *H10K 59/121* | (2023.01) |
| *H10K 59/123* | (2023.01) |
| *H10K 59/124* | (2023.01) |
| *H10K 59/131* | (2023.01) |
| *H10K 59/65* | (2023.01) |
| *H10D 86/60* | (2025.01) |

(52) U.S. Cl.

CPC ....... *G06F 3/0446* (2019.05); *H10K 59/1213* (2023.02); *H10K 59/123* (2023.02); *H10K 59/124* (2023.02); *H10K 59/131* (2023.02); *H10K 59/65* (2023.02); *H10D 86/60* (2025.01)

(56) References Cited

U.S. PATENT DOCUMENTS

| | | | | |
|---|---|---|---|---|
| 9,772,706 | B2 * | 9/2017 | Sakuishi | G06F 3/0412 |
| 9,831,309 | B2 | 11/2017 | Miyairi | |
| 11,747,938 | B2 | 9/2023 | Miyake | |
| 2015/0185942 | A1 * | 7/2015 | Kim | H10K 59/40 |
| | | | | 345/173 |
| 2016/0154435 | A1 | 6/2016 | Yanagisawa | |
| 2016/0195983 | A1 | 7/2016 | Miyake | |
| 2016/0233343 | A1 | 8/2016 | Miyairi | |
| 2018/0364845 | A1 | 12/2018 | Lee | |
| 2019/0043927 | A1 | 2/2019 | Jang et al. | |
| 2020/0006575 | A1 | 1/2020 | Dewey et al. | |
| 2020/0257402 | A1 * | 8/2020 | Miyake | G06F 3/04164 |
| 2021/0193754 | A1 | 6/2021 | Han et al. | |
| 2023/0320135 | A1 | 10/2023 | Hosaka et al. | |
| 2023/0393688 | A1 | 12/2023 | Miyake | |
| 2024/0057427 | A1 | 2/2024 | Jinta | |

FOREIGN PATENT DOCUMENTS

| | | | |
|---|---|---|---|
| CN | 110444125 | A | 11/2019 |
| CN | 113013199 | A | 6/2021 |
| JP | 2002-324673 | A | 11/2002 |
| JP | 2016-149552 | A | 8/2016 |
| JP | 2021-077385 | A | 5/2021 |
| KR | 2015-0075688 | A | 7/2015 |
| KR | 2016-0045583 | A | 4/2016 |
| KR | 10-1832831 | | 2/2018 |
| KR | 2019-0015002 | A | 2/2019 |
| KR | 2021-0079816 | A | 6/2021 |
| WO | WO-2016/128859 | | 8/2016 |
| WO | WO-2020/259473 | | 12/2020 |

OTHER PUBLICATIONS

Written Opinion (Application No. PCT/IB2023/057608) Dated Oct. 24, 2023.

Yeom.H et al., "Oxide Vertical TFTs for the Application to the Ultra High Resolution Display", SID Digest '16 : SID International Symposium Digest of Technical Papers, May 22, 2016, pp. 820-822.

* cited by examiner

FIG. 6A
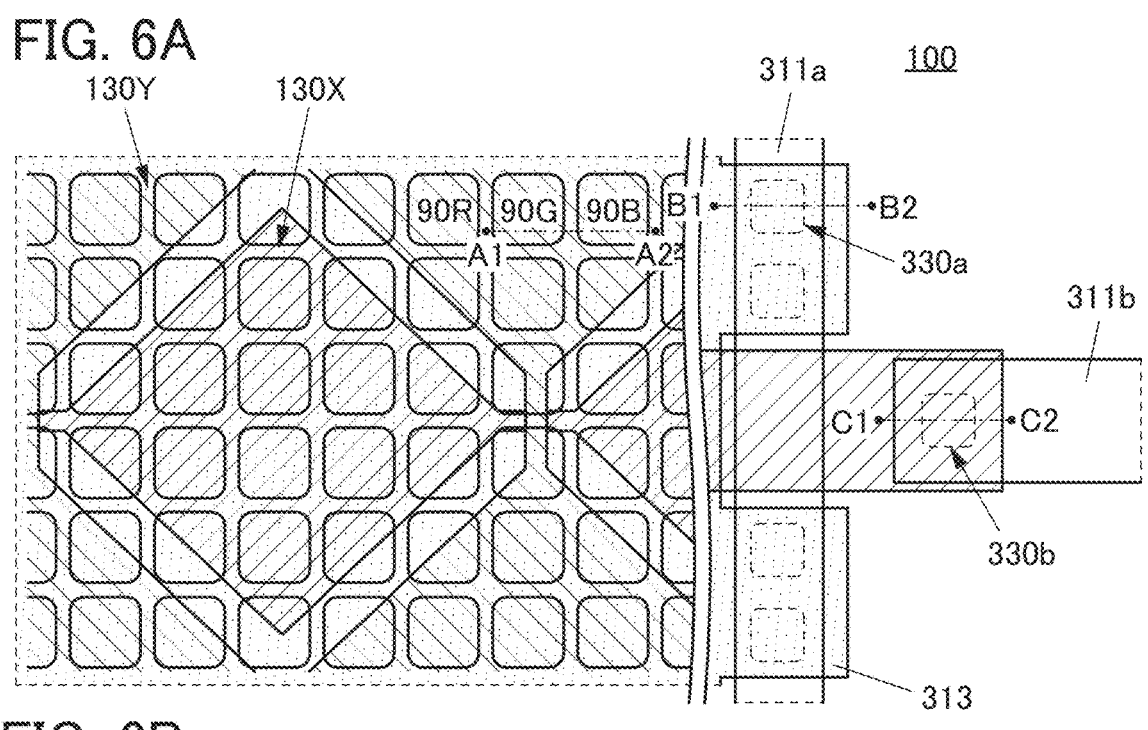
FIG. 6B
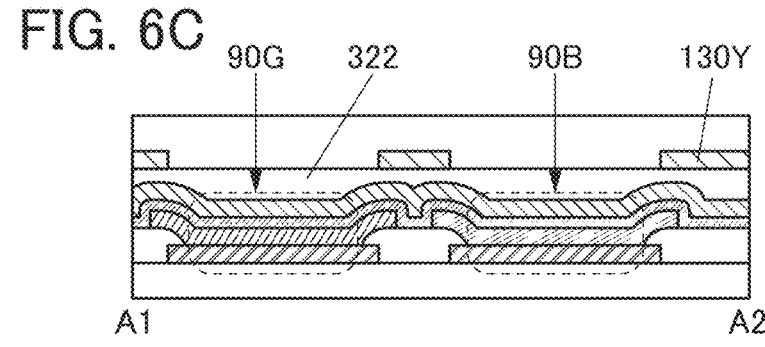
FIG. 6C
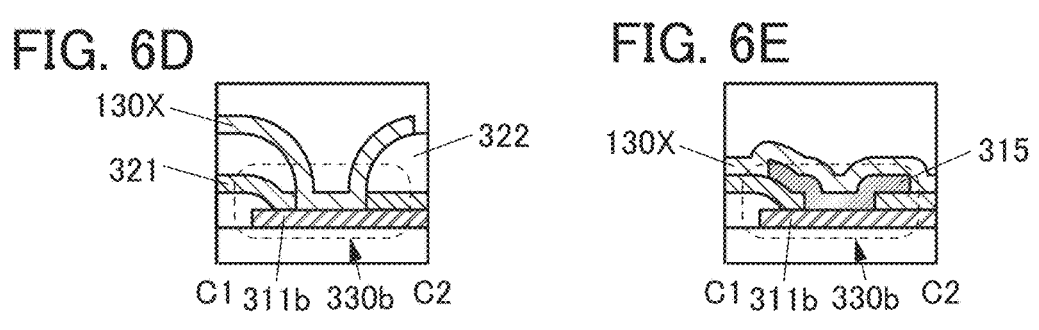
FIG. 6D
FIG. 6E

FIG. 18A
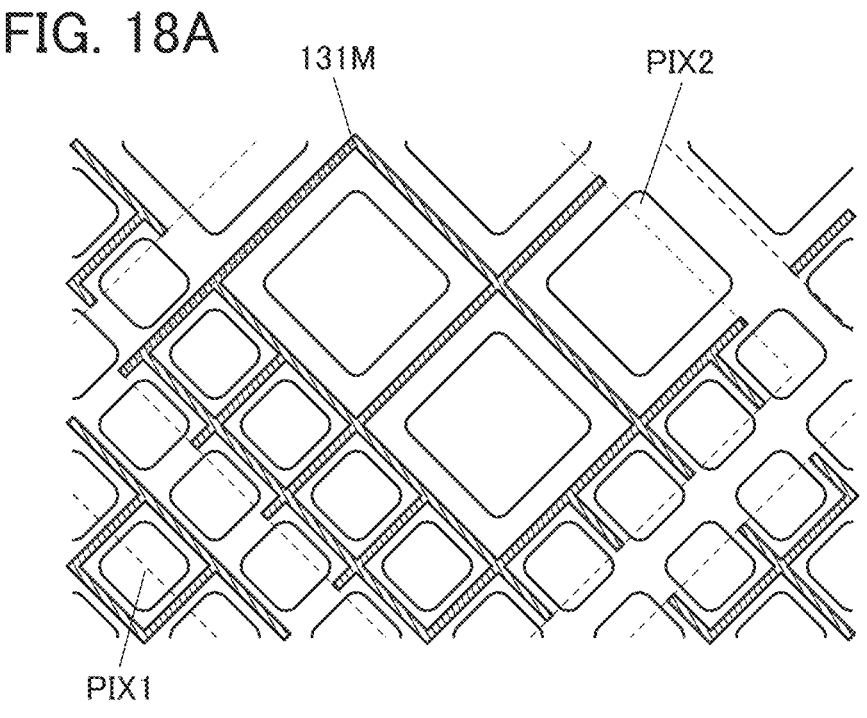
FIG. 18B
FIG. 18C
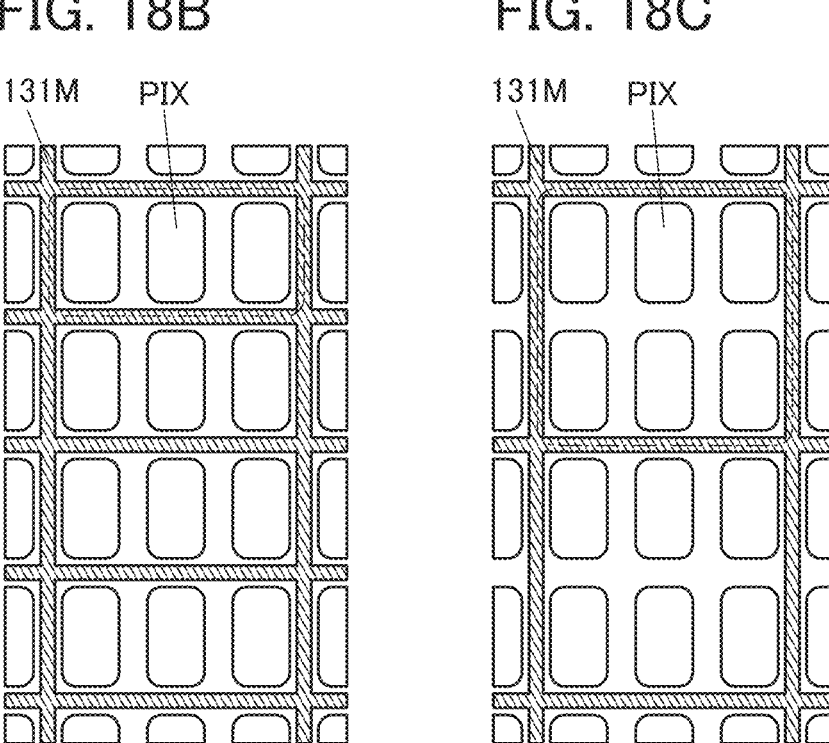

6100

6102

6101

6103

6105

6204  6209  6200

6202

6203

6201

6205

6300

6302  6301

6305

6310

6304

6303

6400

6401

6403

6404

6402

6405

6409

6406

6407

6408

6500

6502

6501

6503

6503

7160

FIG. 21A
500
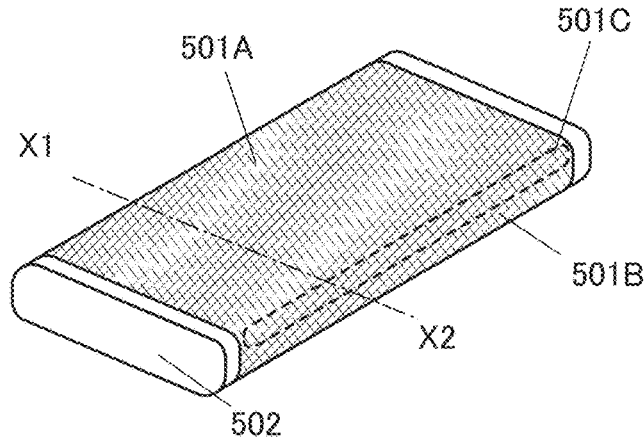
FIG. 21B
500
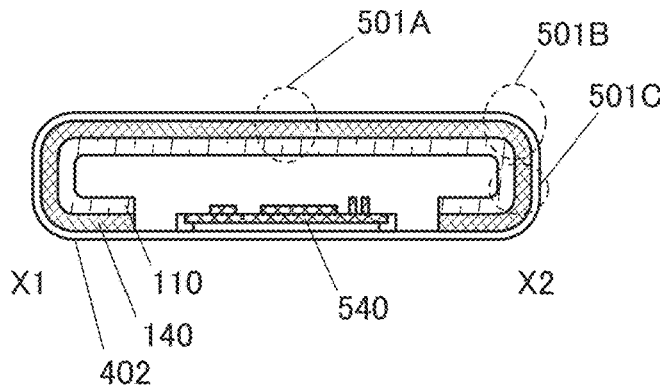
FIG. 21C
500A

DISPLAY DEVICE AND ELECTRONIC DEVICE

CROSS REFERENCE TO RELATED APPLICATIONS

This application is a U.S. National Phase Application under 35 U.S.C. § 371 of International Application PCT/IB2023/057608, filed on Jul. 27, 2023, which is incorporated by reference and claims the benefit of a foreign priority application filed in Japan on Aug. 10, 2022, as Application No. 2022-127782.

TECHNICAL FIELD

One embodiment of the present invention relates to a display device.

Note that one embodiment of the present invention is not limited to the above technical field. Examples of the technical field of one embodiment of the present invention include a semiconductor device, a display device, a light-emitting apparatus, a power storage device, a memory device, a lighting device, an input device (e.g., a touch sensor), an input/output device (e.g., an antenna and a touch panel), a driving method thereof, an usage thereof, or a manufacturing method thereof.

Note that in this specification and the like, a semiconductor device generally means a device that can function by utilizing semiconductor characteristics. A transistor and a semiconductor circuit are embodiments of semiconductor devices. In addition, in some cases, a memory device, a display device, an image capturing device, or an electronic device includes a semiconductor device.

BACKGROUND ART

In recent years, display devices have been used in various applications. Usage examples of a large display device include a television device for home use, digital signage, and a PID (Public Information Display). In addition, many display devices have been used for smartphones, tablet terminals, and the like.

Light-emitting apparatuses including light-emitting devices (also referred to as light-emitting elements) have been developed as display devices. Light-emitting devices (also referred to as EL devices or EL elements) utilizing electroluminescence (hereinafter referred to as EL) phenomenon have features such as ease of reduction in thickness and weight, high-speed response to input signals, and driving with a constant DC voltage power source. Patent Document 1 discloses an example of a display device using an organic EL element.

REFERENCE

Patent Document

[Patent Document 1] Japanese Published Patent Application No. 2002-324673

SUMMARY OF THE INVENTION

Problems to be Solved by the Invention

An active-matrix display device includes a gate driver for selecting a pixel to which data is to be written and a source driver for supplying data to the selected pixel. In addition, to provide a function of a touch panel to the display device, a touch sensor and a driver for driving the touch sensor are needed.

For these drivers, IC chips having the respective functions can be used. For example, on a bezel of a substrate over which a pixel circuit is formed, the IC chip is mounted with the use of a technique such as a chip on glass (COG), a chip on film (COF), or a tape carrier package (TCP).

As the number of mounted IC chips increases due to an increase in the area, resolution, or the like of the display device, the manufacturing cost of the display device increases. This also hinders a narrower frame. In consideration of the above problems, the driver is desired to be monolithically formed over the same substrate as the pixel circuit.

Therefore, an object of one embodiment of the present invention is to provide a display device including a touch sensor. Another object is to provide a display device including a touch sensor and a driver for driving the touch sensor. Another object is to provide a display device including a gate driver, a source driver, and a driver for a touch sensor. Another object is to provide a display device or the like with a novel structure. Another object is to provide a novel semiconductor device or the like.

Note that the description of these objects does not preclude the existence of other objects. Note that one embodiment of the present invention does not necessarily achieve all the objects. Other objects will be apparent from the description of the specification, the drawings, the claims, and the like, and other objects can be derived from the description of the specification, the drawings, the claims, and the like.

Means for Solving the Problems

One embodiment of the present invention relates to a display device including a touch sensor.

One embodiment of the present invention is a display device including a pixel circuit, a light-emitting device, a sensor electrode, and a first driver circuit; the first driver circuit has a function of supplying a signal potential to the sensor electrode; the pixel circuit and the first driver circuit are provided over the same substrate; the pixel circuit is provided in a display portion; the pixel circuit includes a first transistor; the first driver circuit includes a second transistor; the light-emitting device includes a first electrode, a light-emitting layer, and a second electrode; the light-emitting layer is provided between the first electrode and the second electrode; the first electrode is electrically connected to one of a source and a drain of the first transistor; the second electrode is electrically connected to a power supply line in a region outside the display portion; a first insulating layer is provided over the second electrode; an opening is provided in the first insulating layer in a region outside a connection portion between the second electrode and the power supply line; the sensor electrode is provided over the first insulating layer; the sensor electrode is electrically connected to a source or a drain of the second transistor through the opening; and the second transistor is a transistor including a channel formation region along a side surface of a second insulating layer provided over the substrate.

The sensor electrode can be electrically connected to the source or the drain of the second transistor through a connection electrode.

A conductive layer formed in the same step as the first electrode can be used for the connection electrode.

The first transistor may be a transistor including a channel formation region along the side surface of the second insulating layer.

As the second transistor, a transistor including a metal oxide in a channel formation region is preferably used.

In addition, the display device includes a second driver circuit; the pixel circuit includes a third transistor; the second driver circuit has a function of a gate driver; the second driver circuit includes a fourth transistor; one of a source and a drain of the fourth transistor is electrically connected to a gate of the third transistor; and the fourth transistor may be a transistor including a channel formation region along the side surface of the second insulating layer.

As the fourth transistor, a transistor including a metal oxide in a channel formation region is preferably used.

In addition, the display device includes a third driver circuit; the pixel circuit includes a fifth transistor; the third driver circuit has a function of a source driver; the third driver circuit includes a sixth transistor; one of a source and a drain of the sixth transistor is electrically connected to one of a source and a drain of the fifth transistor; and the sixth transistor may be a transistor including a channel formation region along the side surface of the second insulating layer.

As the sixth transistor, a transistor including a metal oxide in a channel formation region is preferably used.

In addition, a camera is provided on a surface of the substrate opposite to a surface provided with the pixel circuit, and in the display portion, a first region overlapping with a lens of the camera may have a larger pixel pitch than a second region not overlapping with the lens of the camera.

In the first region and the second region, the sensor electrode may be provided using a metal layer so as to include a region overlapping with a wiring electrically connected to the pixel circuit.

Alternatively, in the first region, the sensor electrode may be provided using a light-transmitting conductive film; in the second region, the sensor electrode may be provided using a metal layer so as to include a region overlapping with a wiring electrically connected to the pixel circuit; and the light-transmitting conductive film may extend to the second region to be electrically connected to the metal layer.

Alternatively, in the second region, the sensor electrode may be provided using a metal layer so as to include a region overlapping with a wiring electrically connected to the pixel circuit; and in the first region, the sensor electrode may not be provided.

Effect of the Invention

In one embodiment of the present invention, a display device including a touch sensor can be provided. A display device including a touch sensor and a driver for driving the touch sensor can be provided. A display device including a gate driver, a source driver, and a driver for a touch sensor can be provided. A display device or the like with a novel structure can be provided. A novel semiconductor device or the like can be provided.

The description of a plurality of effects does not preclude the existence of other effects. In addition, one embodiment of the present invention does not necessarily achieve all the effects described as examples. In one embodiment of the present invention, other objects, effects, and novel features are apparent from the description of this specification and the drawings.

BRIEF DESCRIPTION OF THE DRAWINGS

FIG. 4A to FIG. 4F are diagrams each illustrating a pixel layout.

FIG. 6A to FIG. 6E are diagrams each illustrating a structure example of a display device.

FIG. 18A to FIG. 18C are diagrams each illustrating a sensor electrode.

FIG. 21A to FIG. 21C are diagrams each illustrating a structure example of an electronic device.

MODE FOR CARRYING OUT THE INVENTION

Figure 1:
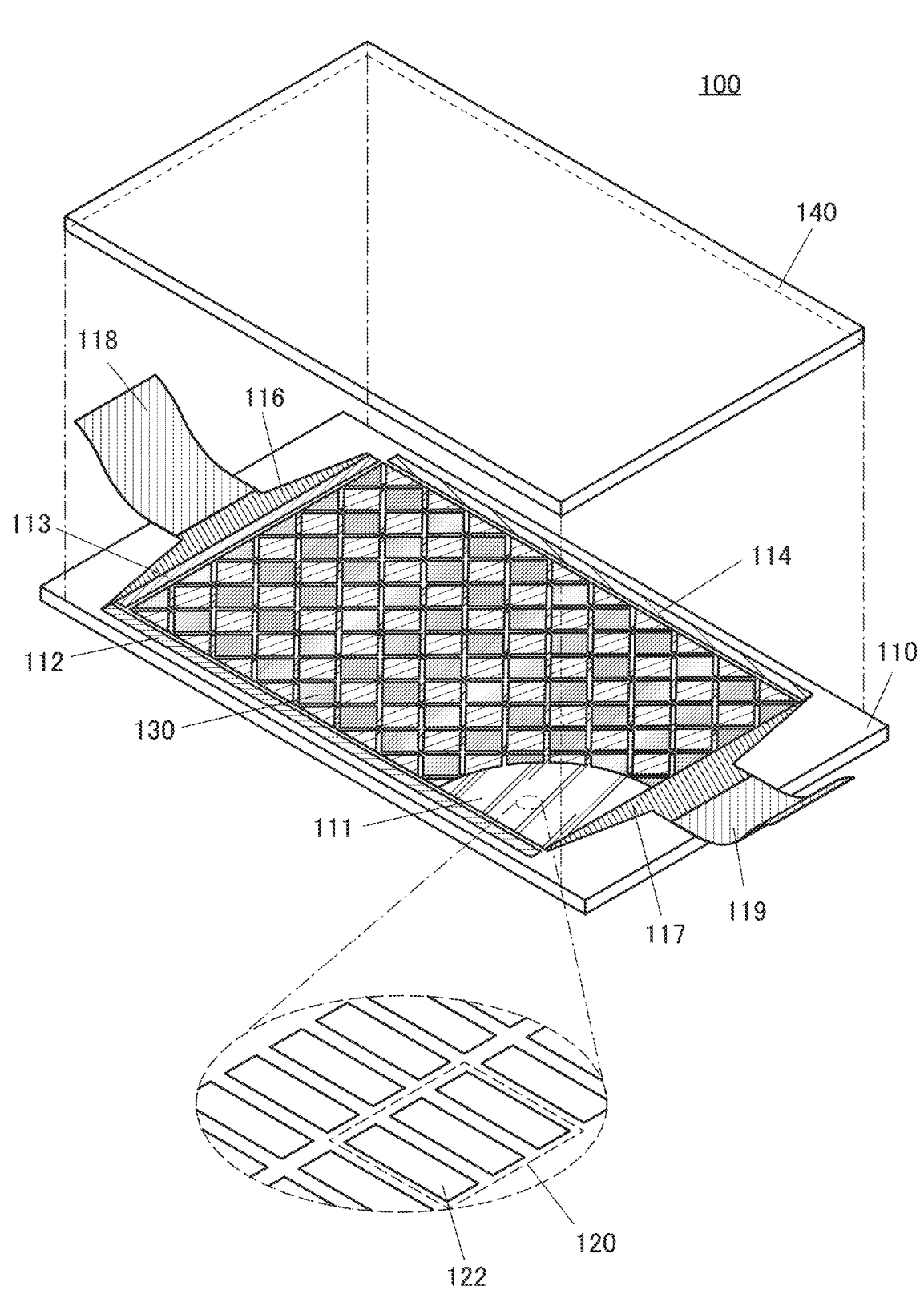
FIG. 1 is a diagram illustrating a display device.

Hereinafter, embodiments will be described with reference to the drawings. Note that the embodiments can be implemented in many different modes, and it is readily understood by those skilled in the art that modes and details thereof can be changed in various ways without departing from the spirit and scope thereof. Thus, the present invention should not be interpreted as being limited to the following description of the embodiments.

In the case where there is description "X and Y are connected" in this specification and the like, the case where X and Y are electrically connected, the case where X and Y are functionally connected, and the case where X and Y are directly connected are regarded as being disclosed in this specification and the like. Accordingly, without being limited to a predetermined connection relationship, for example, a connection relationship shown in drawings or texts, a connection relationship other than one shown in drawings or texts is regarded as being disclosed in the drawings or the texts. Each of X and Y denotes an object (e.g., a device, an element, a circuit, a wiring, an electrode, a terminal, a conductive film, or a layer).

For example, in the case where X and Y are electrically connected, one or more elements that allow electrical connection between X and Y (e.g., a switch, a transistor, a capacitor, an inductor, a resistor, a diode, a display device, a light-emitting device, and a load) can be connected between X and Y. Note that a switch is controlled to be in an on state or an off state. That is, a switch has a function of controlling whether or not current flows by being in a conduction state (on state) or a non-conduction state (off state).

For example, in the case where X and Y are functionally connected, one or more circuits that allow functional connection between X and Y (e.g., a logic circuit (an inverter, a NAND circuit, a NOR circuit, or the like); a signal converter circuit (a digital-analog converter circuit, an analog-digital converter circuit, a gamma correction circuit, or the like); a potential level converter circuit (a power supply circuit (a step-up circuit, a step-down circuit, or the like), a level shifter circuit for changing the potential level of a signal, or the like); a voltage source; a current source; a switching circuit; an amplifier circuit (a circuit that can increase signal amplitude, the amount of current, or the like, an operational amplifier, a differential amplifier circuit, a source follower circuit, a buffer circuit, or the like); a signal generation circuit; a memory circuit; a control circuit; or the like) can be connected between X and Y. For instance, even if another circuit is interposed between X and Y, X and Y are regarded as being functionally connected when a signal output from X is transmitted to Y.

Note that an explicit description that X and Y are electrically connected includes the case where X and Y are electrically connected (i.e., the case where X and Y are connected with another element or another circuit interposed therebetween) and the case where X and Y are directly connected (i.e., the case where X and Y are connected without another element or another circuit interposed therebetween).

It can be expressed as, for example, "X, Y, a source (or a first terminal or the like) of a transistor, and a drain (or a second terminal or the like) of the transistor are electrically connected to each other, and X, the source (or the first terminal or the like) of the transistor, the drain (or the second terminal or the like) of the transistor, and Y are electrically connected to each other in this order". Alternatively, it can be expressed as "a source (or a first terminal or the like) of a transistor is electrically connected to X, a drain (or a second terminal or the like) of the transistor is electrically connected to Y, and X, the source (or the first terminal or the like) of the transistor, the drain (or the second terminal or the like) of the transistor, and Y are electrically connected to each other in this order". Alternatively, it can be expressed as "X is electrically connected to Y through a source (or a first terminal or the like) and a drain (or a second terminal or the like) of a transistor, and X, the source (or the first terminal or the like) of the transistor, the drain (or the second terminal or the like) of the transistor, and Y are provided in this connection order". When the connection order in a circuit structure is defined by an expression similar to the above examples, a source (or a first terminal or the like) and a drain (or a second terminal or the like) of a transistor can be distinguished from each other to specify the technical scope. Note that these expressions are examples and the expression is not limited to these expressions. Here, X and Y each denote an object (e.g., a device, an element, a circuit, a wiring, an electrode, a terminal, a conductive film, or a layer).

Even when independent components are electrically connected to each other in a circuit diagram, one component has functions of a plurality of components in some cases. For example, when part of a wiring also functions as an electrode, one conductive film has functions of both components: a function of the wiring and a function of the electrode. Thus, electrical connection in this specification includes, in its category, such a case where one conductive film has functions of a plurality of components.

In this specification and the like, a "capacitor" can be, for example, a circuit element having an electrostatic capacitance value higher than 0 F, a region of a wiring having an electrostatic capacitance value higher than 0 F, parasitic capacitance, or gate capacitance of a transistor. Therefore, in this specification and the like, a "capacitor" includes not only a circuit element that has a pair of electrodes and a dielectric between the electrodes, but also parasitic capacitance generated between wirings, gate capacitance generated between a gate and one of a source and a drain of a transistor, and the like. The terms "capacitor", "parasitic capacitance", "gate capacitance", and the like can be replaced with the term "capacitance" and the like; conversely, the term "capacitance" can be replaced with the terms "capacitor", "parasitic capacitance", "gate capacitance", and the like. The term "pair of electrodes" of "capacitor" can be replaced with "pair of conductors", "pair of conductive regions", "pair of regions", and the like. Note that the electrostatic capacitance value can be higher than or equal to 0.05 fF and lower than or equal to 10 pF, for example. As another example, the electrostatic capacitance value may be higher than or equal to 1 pF and lower than or equal to 10 μF.

In this specification and the like, a transistor includes three terminals called a gate, a source, and a drain. The gate is a control terminal for controlling the conduction state of the transistor. Two terminals functioning as the source and the drain are input/output terminals of the transistor. One of the two input/output terminals serves as the source and the other serves as the drain depending on the conductivity type (n-channel type or p-channel type) of the transistor and the levels of potentials applied to the three terminals of the transistor. Thus, the terms "source" and "drain" can be replaced with each other in this specification and the like. Furthermore, in this specification and the like, expressions "one of a source and a drain" (or a first electrode or a first terminal) and "the other of the source and the drain" (or a second electrode or a second terminal) are used in the description of the connection relationship of a transistor. Depending on the transistor structure, a transistor may include a back gate in addition to the above three terminals. In this case, in this specification and the like, one of the gate and the back gate of the transistor may be referred to as a first gate and the other of the gate and the back gate of the transistor may be referred to as a second gate. Moreover, the terms "gate" and "back gate" can be replaced with each other in one transistor in some cases. In the case where a transistor includes three or more gates, the gates may be referred to as a first gate, a second gate, and a third gate, for example, in this specification and the like.

In this specification and the like, a "node" can be referred to as a terminal, a wiring, an electrode, a conductive layer, a conductor, an impurity region, or the like depending on the circuit structure, the device structure, or the like. Furthermore, a terminal, a wiring, or the like can be referred to as a "node".

Ordinal numbers such as "first", "second", and "third" in this specification and the like are used to avoid confusion among components. Thus, the ordinal numbers do not limit the number of components. In addition, the ordinal numbers do not limit the order of components. For example, a "first" component in one embodiment in this specification and the like can be referred to as a "second" component in other embodiments, the scope of claims, or the like. For another example, a "first" component in one embodiment in this specification and the like can be omitted in other embodiments, the scope of claims, or the like.

In this specification and the like, terms for describing arrangement, such as "over", "under", "above", and "below" are sometimes used for convenience to describe the positional relationship between components with reference to drawings. The positional relationship between components is changed as appropriate in accordance with a direction in which each component is described. Thus, the positional relationship is not limited to the terms described in the specification and the like, and can be described with another term as appropriate depending on the situation. For example, the expression "an insulator positioned over (on) a top surface of a conductor" can be replaced with the expression "an insulator positioned under (on) a bottom surface of a conductor" when the direction of a drawing illustrating these components is rotated by 180°.

Note that the term "over" or "below" does not necessarily mean that a component is placed "directly over" or "directly below" and "directly in contact with" another component. For example, the expression "electrode B over insulating layer A" does not necessarily mean that the electrode B is formed over and in direct contact with the insulating layer A, and does not exclude the case where another component is provided between the insulating layer A and the electrode B.

Furthermore, the term "overlap", for example, in this specification and the like does not limit a state such as the stacking order of components. For example, the expression "electrode B overlapping with insulating layer A" does not necessarily mean the state where "electrode B is formed over insulating layer A", and does not exclude the state where "electrode B is formed under insulating layer A" and the state where "electrode B is formed on the right side (or the left side) of insulating layer A".

Each of the terms "adjacent" and "proximity" in this specification and the like does not necessarily mean that a component is directly in contact with another component. For example, the expression "electrode B adjacent to insulating layer A" does not necessarily mean that the electrode B is formed in direct contact with the insulating layer A and does not exclude the case where another component is provided between the insulating layer A and the electrode B.

In this specification and the like, the terms "film", "layer", and the like can be interchanged with each other depending on the situation. For example, the term "conductive layer" can be changed into the term "conductive film" in some cases. Also, for example, the term "insulating film" can be changed into the term "insulating layer" in some cases. Alternatively, the term "film", "layer", or the like is not used and can be interchanged with another term depending on the case or the situation. For example, the term "conductive layer" or "conductive film" can be changed into the term "conductor" in some cases. Alternatively, the term "conductor" can be changed into the term "conductive layer" or "conductive film" in some cases. Furthermore, for example, the term "insulating layer" or "insulating film" can be changed into the term "insulator" in some cases. Also, the term "insulator" can be changed into the term "insulating layer" or "insulating film" in some cases.

In this specification and the like, the term such as "electrode", "wiring", or "terminal" does not limit the function of a component. For example, an "electrode" is used as part of a "wiring" in some cases, and vice versa. Furthermore, for example, the term "electrode" or "wiring" also includes the case where a plurality of "electrodes" or "wirings" are formed in an integrated manner. For example, a "terminal" is used as part of a "wiring" or an "electrode" in some cases, and vice versa. Furthermore, the term "terminal" also includes the case where a plurality of "electrodes", "wirings", "terminals", or the like are formed in an integrated manner, for example. Therefore, for example, an "electrode" can be part of a "wiring" or a "terminal", and a "terminal" can be part of a "wiring" or an "electrode". Moreover, the term "electrode", "wiring", "terminal", or the like is sometimes replaced with the term "region" depending on the case.

In this specification and the like, the term such as "wiring", "signal line", or "power supply line" can be interchanged with each other depending on the case or the situation. For example, the term "wiring" can be changed into the term "signal line" in some cases. As another example, the term "wiring" can be changed into the term "power supply line" or the like in some cases. Conversely, the term such as "signal line" or "power supply line" can be changed into the term "wiring" in some cases. The term "power supply line" or the like can be changed into the term "signal line" or the like in some cases. Conversely, the term "signal line" or the like can be changed into the term "power supply line" or the like in some cases. Moreover, the term "potential" that is applied to a wiring can sometimes be changed into the term such as "signal" depending on the case or the situation. Conversely, the term "signal" or the like can be changed into the term "potential" in some cases.

In this specification, "parallel" indicates a state where two straight lines are placed at an angle greater than or equal to −10° and less than or equal to 10°. Thus, the case where the angle is greater than or equal to −5° and less than or equal to 5° is also included. In addition, "approximately parallel" or "substantially parallel" indicates a state where two straight lines are placed at an angle greater than or equal to −30° and less than or equal to 30°. Moreover, "perpendicular" indicates a state where two straight lines are placed at an angle greater than or equal to 80° and less than or equal to 100°. Thus, the case where the angle is greater than or equal to 85° and less than or equal to 95° is also included. Furthermore, "approximately perpendicular" or "substantially perpendicular" indicates a state where two straight lines are placed at an angle greater than or equal to 60° and less than or equal to 120°.

Note that in this specification and the like, the terms "identical", "the same", "equal", "uniform", or the like (including synonyms thereof) used in describing calculation values and measurement values contain an error of ±20% unless otherwise specified.

Embodiments described in this specification are described with reference to the drawings. Note that the embodiments can be implemented in many different modes, and it will be readily understood by those skilled in the art that the modes and details can be changed in various ways without departing from the spirit and scope thereof. Therefore, the present invention should not be interpreted as being limited to the description in the embodiments. Note that in the structures of the invention in the embodiments, the same reference numerals are used in common for the same portions or portions having similar functions in different drawings, and repeated description thereof is omitted in some cases. Furthermore, the same hatch pattern is used for the portions having similar functions, and the portions are not especially denoted by reference numerals in some cases. Moreover, some components are omitted in a perspective view, a top view, and the like for easy understanding of the drawings in some cases.

In the drawings and the like related to this specification, the size, the layer thickness, or the region is exaggerated for clarity in some cases. Therefore, embodiments of the present invention are not limited to the size, aspect ratio, and the like shown in the drawings. Note that drawings are schematic views of ideal examples, and the embodiments of the present invention are not limited to the shape or the value illustrated in the drawings. For example, variation in signal, voltage, or current due to noise or variation in signal, voltage, or current due to difference in timing can be included.

In the drawings and the like related to this specification, arrows indicating the X direction, the Y direction, and the Z direction are illustrated in some cases. In this specification and the like, the "X direction" is a direction along the X-axis, and the forward direction and the reverse direction are not distinguished in some cases, unless otherwise specified. The same applies to "Y direction" and "Z direction". The X direction, the Y direction, and the Z direction are directions intersecting with each other. More specifically, the X direction, the Y direction, and the Z direction are directions orthogonal to each other. In this specification and the like, one of the X direction, the Y direction, and the Z direction is referred to as a "first direction" in some cases. Another one of the directions is referred to as a "second direction" in some cases. The remaining one of the directions is referred to as a "third direction" in some cases.

In this specification and the like, when a plurality of components are denoted by the same reference numerals, and in particular need to be distinguished from each other, an identification sign such as "A", "b", "_1", "[n]", or "[m,n]" is sometimes added to the reference numerals.

In this specification and the like, a structure in which a connector such as an FPC (Flexible Printed Circuit) or a TCP (Tape Carrier Package) is attached to a substrate included in a display device, or a structure in which an IC (integrated circuit) is directly mounted on a substrate included in a display device by a COG (Chip On Glass) method is referred to as a display device or a display module, in some cases.

Embodiment 1

In this embodiment, display devices of one embodiment of the present invention will be described. One embodiment of the present invention is a display device having a touch panel function. An electrode of a touch sensor is provided to overlap with a display portion, and the electrode is electrically connected to a first driver circuit formed monolithically over a substrate provided with a pixel circuit.

An in-cell touch panel in which a touch sensor is incorporated in a display device can include a small number of components, which leads to a reduction in cost.

A transistor including a metal oxide in a semiconductor layer can be used in the pixel circuit and the first driver circuit. The transistor included in the first driver circuit is easily downsized and can operate at high speed. Thus, the area occupied by the circuit can be reduced, which contributes to a narrower bezel.

Furthermore, a second driver circuit (a gate driver) and a third driver circuit (a source driver) for driving the pixel circuit can also be formed using transistors including a metal oxide in a semiconductor layer, and three driver circuits can be monolithically formed over a substrate provided with the pixel circuit.

With the use of one embodiment of the present invention having such a feature, the cost of mounting an IC chip can be reduced, and the display device can have a narrower bezel.

FIG. 1 is a schematic diagram for illustrating a display device of one embodiment of the present invention. The display device of one embodiment of the present invention includes a pixel and a conductive layer included in the electrode of the touch sensor (hereinafter referred to as a sensor electrode) between a pair of substrates. The display device of one embodiment of the present invention includes a plurality of sensor electrodes overlapping with the display portion. In FIG. 1, part of the sensor electrode is cut away.

In a display device 100, a sensor electrode 130 is provided between a substrate 110 and a substrate 140. A display portion 111 is provided over the substrate 110, and the sensor electrode 130 is provided over the display portion 111. A pixel 120 included in the display portion 111 includes a plurality of subpixels 122 as illustrated in an enlarged view. The use of a plurality of the subpixels 122 that emit light of different colors enables full-color display.

A driver circuit 114 (a sensor driver) for driving the touch sensor is provided over the substrate 110. The driver circuit 114 is electrically connected to the sensor electrode 130 and an FPC 119. The sensor electrode 130 is also electrically connected to the FPC 119.

A driver circuit 112 and a driver circuit 113 for driving the pixel circuit included in the pixel 120 are provided over the substrate 110. The driver circuit 112 and the driver circuit 113 are electrically connected to an FPC 118.

Note that the FPC 118 and the FPC 119 may be integrated into one. Although an example in which the driver circuits 112, 113, and 114 are monolithically provided is illustrated, any one or more of them may be replaced with a mode in which an IC chip is mounted. The driver circuit 114 is sometimes unnecessary depending on the kind of the touch sensor provided.

Figure 2:
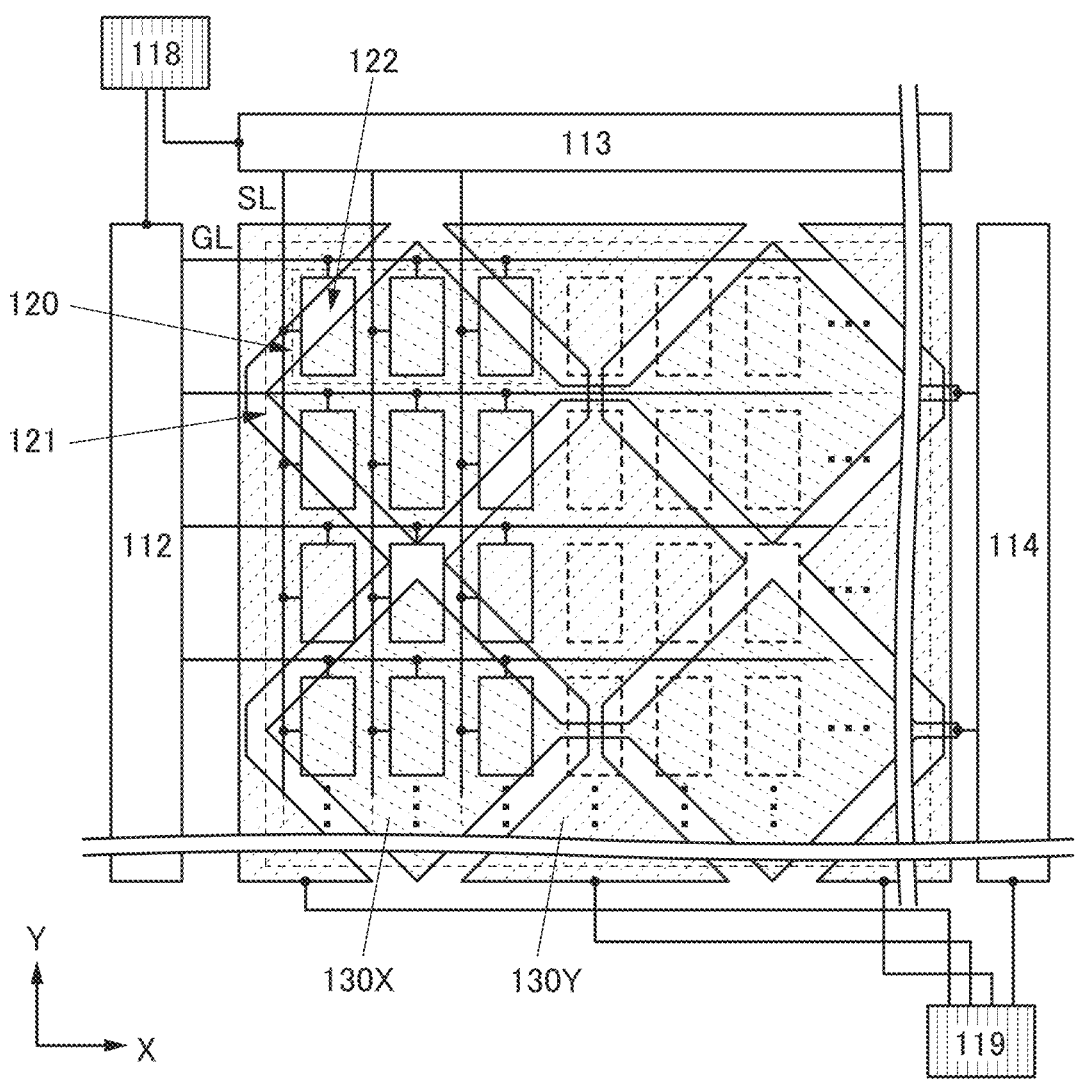
FIG. 2 is a block diagram illustrating a display device.

FIG. 2 is a block diagram illustrating the display device 100. The display device 100 includes a pixel array 121 provided in the display portion 111, the driver circuit 112, the driver circuit 113, and the driver circuit 114. The pixel array 121 includes the pixels 120 arranged in the column direction and the row direction.

The pixel 120 includes a subpixel 122. The subpixel 122 has a function of emitting light for display.

Note that in this specification and the like, although a minimum unit in which independent operation is performed in one "pixel" is defined as a "subpixel" in the description for convenience, a "pixel" may be replaced with a "region" and a "subpixel" may be replaced with a "pixel".

The subpixel 122 includes a light-emitting device that emits visible light. An EL element such as an OLED (Organic Light Emitting Diode) or a QLED (Quantum-dot Light Emitting Diode) is preferably used as the light-emitting device. As a light-emitting substance contained in the EL element, a substance that emits fluorescent light (a fluorescent material), a substance that emits phosphorescent light (a phosphorescent material), a substance that exhibits thermally activated delayed fluorescence (a thermally activated delayed fluorescent (TADF) material), an inorganic compound (a quantum dot material or the like), and the like can be given. In addition, an LED (Light Emitting Diode) such as a micro LED can be also used as the light-emitting device.

The driver circuit 112 and the driver circuit 113 are drivers for driving the pixel 120. The driver circuit 114 is a driver for driving the touch sensor. As the driver circuit 112, the driver circuit 113, and the driver circuit 114, a shift register circuit that operates at high speed can be used, for example.

The driver circuit 112 can have a function of a gate driver and the driver circuit 113 can have a function of a source driver. The driver circuit 112 is electrically connected to the subpixel 122 through a gate line GL. The driver circuit 113 is electrically connected to the subpixel 122 through a source line SL. The FPC 118 is electrically connected to the driver circuit 112 and the driver circuit 113, and a signal potential can be input from the outside through the FPC 118. Note that a demultiplexer may be provided between the driver circuit 112 and the subpixel 122.

A sensor electrode 130X and a sensor electrode 130Y functioning as electrodes of the touch sensor are provided over the pixel array 121. The sensor electrode 130X has a structure in which a plurality of conductive layers each having a shape illustrated as quadrangles are connected in the X direction. The sensor electrode 130Y has a structure in which a plurality of conductive layers each having a shape illustrated as quadrangles are connected in the Y direction.

Note that in drawings described in this embodiment, the sizes of the sensor electrodes 130X and 130Y are examples, and the size is not limited to the illustrated size. The sizes of the sensor electrodes 130X and 130Y may be set in accordance with the product specification. For example, the conductive layers having a shape illustrated as quadrangles can be placed to each include a region overlapping with one to 100000 pixels.

The driver circuit 114 can be electrically connected to the sensor electrode 130X, for example. The driver circuit 114 is connected to the FPC 119, and a signal potential can be input to the sensor electrode 130X from the outside through the FPC 119. The sensor electrode 130Y can be connected to the FPC 119, and current flowing through the sensor electrode 130Y can be read through the FPC 119.

Figures 3A, 3B, 3C:
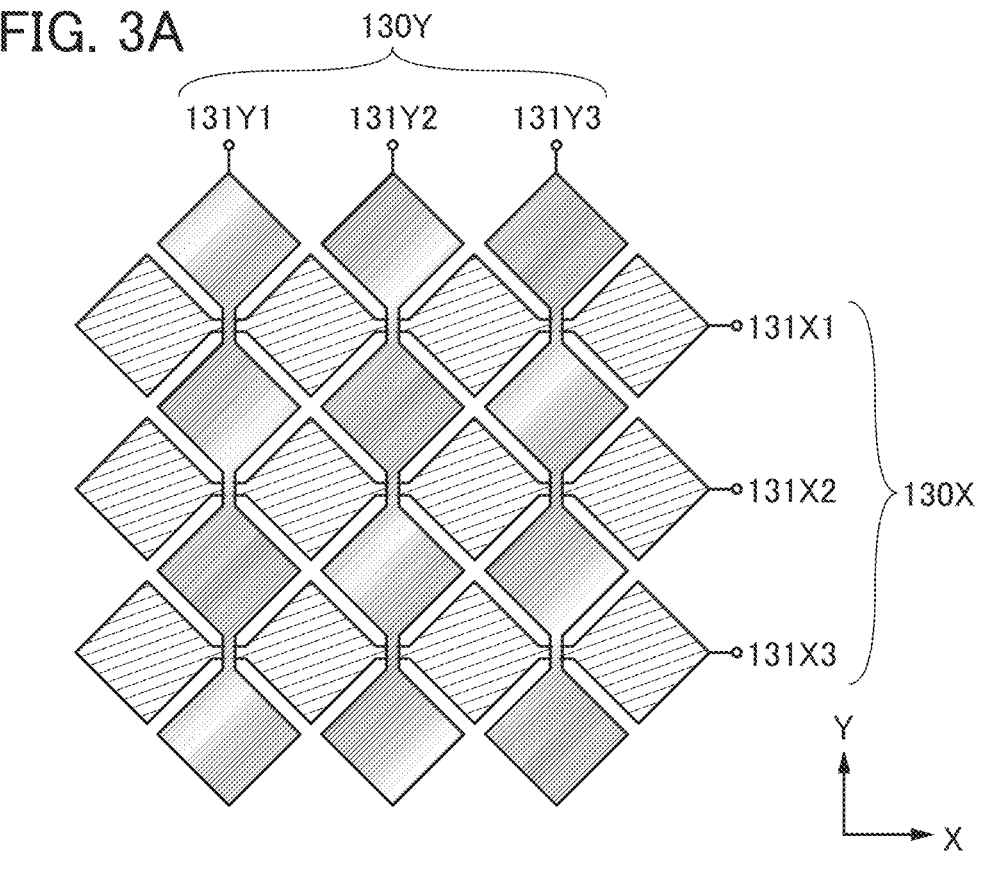
FIG. 3A to FIG. 3C are diagrams each illustrating a touch sensor.

FIG. 3A is a top view illustrating part of the touch sensor. The touch sensor includes a conductive layer 131X (131X1-131X3) functioning as the sensor electrode 130X provided in the X direction and a conductive layer 131Y (131Y1-131Y3) functioning as the sensor electrode 130Y provided in the Y direction.

Although FIG. 3A illustrates a structure in which the conductive layer 131X and the conductive layer 131Y that are quadrangular conductive layers are arranged in a regular pattern, one embodiment of the present invention is not limited thereto. The outer shape of the conductive layers may be a circle, a triangle, a pentagon, a hexagon, an octagon, or the like, for example.

The conductive layer 131X and the conductive layer 131Y can function as electrodes of capacitive touch sensors. Examples of the capacitive touch sensor include a surface capacitive touch sensor and a projected capacitive touch sensor. Examples of the projected capacitive touch sensor include a self-capacitive touch sensor and a mutual-capacitive touch sensor, which differ mainly in the driving method. The use of a mutual-capacitive touch sensor is preferable because multiple points can be sensed simultaneously.

In the case of a projected self-capacitive touch sensor, a pulse voltage is applied to each of the conductive layer 131X and the conductive layer 131Y so that they are scanned, and the value of a current flowing in themselves at that time is detected. The amount of current is changed when an object to be detected approaches, and therefore, positional information of the object to be detected can be obtained by detecting the difference between the values. In the case of a projected mutual-capacitive type, a pulse voltage is applied to either the conductive layer 131X or the conductive layer 131Y so that they are scanned, and a current flowing in the other is detected to obtain positional information of the object to be detected.

This embodiment shows an example of the projected mutual capacitive type touch sensor in which the driver circuit 114 is connected to the conductive layer 131X to sense current flowing through the conductive layer 131Y. In the case of using the projected self-capacitive touch sensor, the driver circuit 114 can be omitted.

An insulating layer is sandwiched between each intersection portion between the conductive layer 131X and the conductive layer 131Y, so that a short circuit does not occur. The insulating layer may be provided only at the intersection portion or may be provided to cover the conductive layer 131X. As illustrated in FIG. 3B, a conductive layer 132 electrically connecting the adjacent quadrangular conductive layers may be provided in the intersection portion.

A conductive material having a light-transmitting property is preferably used for the conductive layer 131X and the conductive layer 131Y. As the conductive material having alight-transmitting property, a conductive oxide such as indium oxide, indium tin oxide, indium zinc oxide, zinc oxide, or zinc oxide to which gallium is added can be used. Note that a film containing graphene can be used as well. The film containing graphene can be formed, for example, by reducing a film containing graphene oxide. As a reducing method, a method with application of heat or the like can be employed.

Alternatively, a metal or an alloy that is thin enough to have a light-transmitting property can be used. For example, a metal such as gold, silver, platinum, magnesium, nickel, tungsten, chromium, molybdenum, iron, cobalt, copper, palladium, or titanium, or an alloy containing the metal can be used. Alternatively, a nitride of the metal or the alloy (e.g., titanium nitride) or the like may be used. Alternatively, a layered film in which two or more of conductive films containing the above materials are stacked may be used.

As the conductive layer 131X and the conductive layer 131Y, a conductive film that is processed to be thin enough to be invisible to a user may be used. Such a conductive film is processed into a lattice shape (a mesh shape), for example, which makes it possible to achieve both high conductivity and high visibility of the display device. At this time, it is preferable that the conductive film have a portion with a width greater than or equal to 30 nm and less than or equal to 100 m, preferably greater than or equal to 50 nm and less than or equal to 50 m, and further preferably greater than or equal to 50 nm and less than or equal to 20 m. In particular, the conductive film preferably has a pattern width of 10 μm or less, which is hardly visible to the users.

FIG. 3C is an enlarged view illustrating an example of the case where a lattice-shaped conductive film is used as the conductive layer 131X. In the case where the lattice-shaped conductive film is used, the conductive film is placed not to overlap with the light-emitting device, whereby the transmittance of light emitted from the light-emitting device can be increased.

Conductive nanowires may be used for the conductive layer 131X and the conductive layer 131Y. The nanowires are distributed at appropriate density so that the adjacent nanowires are in contact with each other, which can form a two-dimensional network, and the nanowires can function as a conductive film with an extremely high light-transmitting property. For example, nanowires that have a mean diameter of greater than or equal to 1 nm and less than or equal to 100 nm, preferably greater than or equal to 5 nm and less than or equal to 50 nm, and further preferably greater than or equal to 5 nm and less than or equal to 25 nm, can be used. As the nanowire, a metal nanowire such as an Ag nanowire, a Cu nanowire, or an Al nanowire, a carbon nanotube, or the like can be used. For example, in the case of using the Ag nanowire, a light transmittance of 89% or more and a sheet resistance of greater than or equal to 40 $\Omega$/square and less than or equal to 100 $\Omega$/square can be achieved.

FIG. 4A to FIG. 4F are diagrams illustrating pixel layouts. There is no particular limitation on the arrangement of subpixels, and a variety of methods can be employed. Examples of the arrangement of subpixels include stripe arrangement, S-stripe arrangement, matrix arrangement, delta arrangement, Bayer arrangement, and pentile arrangement.

Examples of a top surface shape of the subpixel include polygons such as a triangle, a quadrangle (including a rectangle and a square), and a pentagon; polygons with rounded corners; an ellipse; and a circle. Here, the top surface shape of the subpixel corresponds to a top surface shape of a light-emitting region of the light-emitting device.

Figures 4A, 4B, 4C:
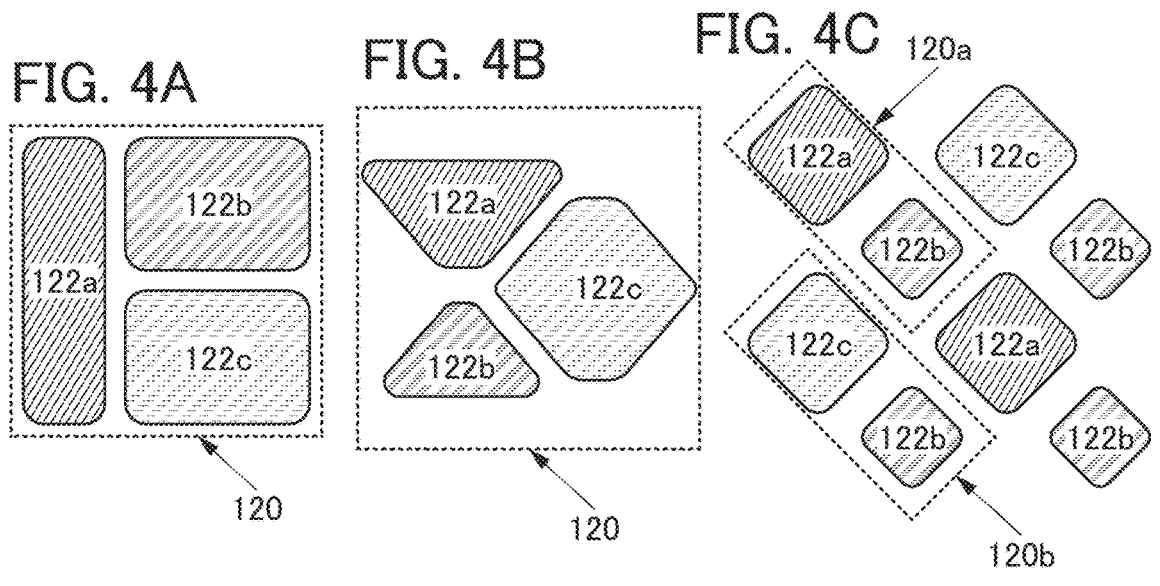

The pixel 120 illustrated in FIG. 4A employs S-stripe arrangement. The pixel 120 illustrated in FIG. 4A is composed of three subpixels 122 i.e., subpixels 122*a*, 122*b*, and 122*c*. For example, the subpixel 122*a* can be a blue subpixel, the subpixel 122*b* can be a red subpixel, and the subpixel 122*c* can be a green subpixel.

The pixel 120 illustrated in FIG. 4B includes the subpixel 122*a* whose top surface has a rough trapezoidal or rough triangle shape with rounded corners, the subpixel 122*b* whose top surface has a rough trapezoidal or rough triangle shape with rounded corners, and the subpixel 122*c* whose top surface has a rough quadrangular or rough hexagonal shape with rounded corners. The subpixel 122*a* has a larger light-emitting area than the subpixel 122*b*. In this manner, the shapes and sizes of the subpixels can be determined independently. For example, the size of a subpixel including a light-emitting device with higher reliability can be smaller. For example, the subpixel 122*a* can be a green subpixel, the subpixel 122*b* can be a red subpixel, and the subpixel 122*c* can be a blue subpixel.

Pixels 120*a* and 120*b* illustrated in FIG. 4C employ a PenTile arrangement. FIG. 4C illustrates an example where the pixel 120*a* including the subpixel 122*a* and the subpixel 122*b* and the pixels 120*b* including the subpixel 122*b* and the subpixel 122*c* are alternately arranged. For example, the subpixel 122*a* can be a red subpixel, the subpixel 122*b* can be a green subpixel, and the subpixel 122*c* can be a blue subpixel.

The pixels 120*a* and 120*b* illustrated in FIG. 4D and FIG. 4E employ delta arrangement. FIG. 4D is an example where each subpixel has a rough quadrilateral top surface shape with rounded corners, and FIG. 4E is an example where each subpixel has a circular top surface shape.

The pixel 120*a* includes two subpixels (the subpixels 122*a* and 122*b*) in the upper row (first row) and one subpixel (the subpixel 122*c*) in the lower row (second row). The pixel 120*b* includes one subpixel (the subpixel 122*c*) in the upper row (first row) and two subpixels (the subpixels 122*a* and 122*b*) in the lower row (second row). For example, the subpixel 122*a* can be a red subpixel, the subpixel 122*b* can be a green subpixel, and the subpixel 122*c* can be a blue subpixel.

FIG. 4F illustrates an example in which subpixels of different colors are arranged in a zigzag manner. Specifically, the positions of the top sides of two subpixels arranged in the column direction (e.g., the subpixel 122*a* and the subpixel 122*b*, or the subpixel 122*b* and the subpixel 122*c*)

are not aligned in the top view. For example, the subpixel 122*a* can be a red subpixel, the subpixel 122*b* can be a green subpixel, and the subpixel 122*c* can be a blue subpixel.

In a photolithography method, as a pattern to be processed becomes finer, the influence of light diffraction becomes more difficult to ignore; therefore, the fidelity in transferring a photomask pattern by light exposure is degraded, and it becomes difficult to process a resist mask into a desired shape. Thus, a pattern with rounded corners is likely to be formed even with a rectangular photomask pattern. Consequently, the top surface of a subpixel sometimes has a polygonal shape with rounded corners, an elliptical shape, a circular shape, or the like.

Figures 5A, 5B, 5C:
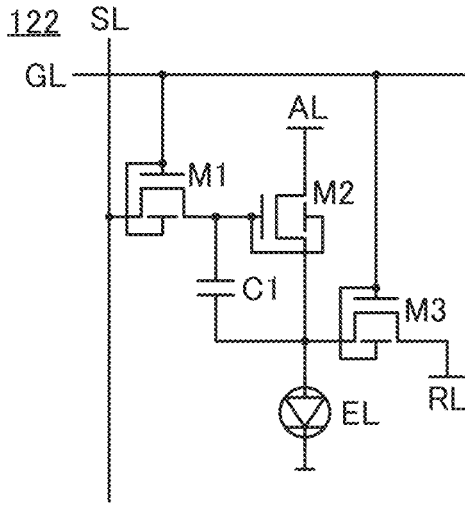
FIG. 5A to FIG. 5C are diagrams each illustrating a pixel circuit.

FIG. 5A illustrates an example of a pixel circuit applicable to the subpixel 122. The pixel circuit includes a transistor M1, a transistor M2, a transistor M3, a capacitor C1, and a light-emitting device EL. The gate line GL and the source line SL are electrically connected to the pixel circuit (see FIG. 2).

A gate of the transistor M1 is electrically connected to the gate line GL, one of a source and a drain of the transistor M1 is electrically connected to the source line SL, and the other of the source and the drain of the transistor M1 is electrically connected to one electrode of the capacitor C1 and a gate of the transistor M2. One of a source and a drain of the transistor M2 is electrically connected to a wiring AL, and the other of the source and the drain of the transistor M2 is electrically connected to one electrode of the light-emitting device EL, the other electrode of the capacitor C1, and one of a source and a drain of the transistor M3. A gate of the transistor M3 is electrically connected to the gate line GL, and the other of the source and the drain of the transistor M3 is electrically connected to a wiring RL. The other electrode of the light-emitting device EL is electrically connected to a wiring CL.

A data potential D is supplied to the source line SL. A selection signal is supplied to the gate line GL. The selection signal includes a potential for bringing a transistor into a conducting state and a potential for bringing a transistor into a non-conducting state.

A reset potential is supplied to the wiring RL. An anode potential is supplied to the wiring AL. A cathode potential is supplied to the wiring CL. In the subpixel 122, the anode potential is higher than the cathode potential. The reset potential supplied to the wiring RL can be set such that the potential difference between the reset potential and the cathode potential is lower than the threshold voltage of the light-emitting device EL. The reset potential can be a potential higher than the cathode potential, a potential equal to the cathode potential, or a potential lower than the cathode potential.

The transistor M1 and the transistor M3 function as switches. The transistor M2 functions as a transistor for controlling current flowing through the light-emitting device EL. For example, it can be said that the transistor M1 functions as a selection transistor and the transistor M2 functions as a driving transistor.

Here, a transistor containing a metal oxide in their channel formation region (hereinafter, referred to as an OS transistor) can be used as each of the transistor M1 to the transistor M3. Alternatively, a transistor containing silicon (single crystal silicon, polycrystalline silicon, microcrystalline silicon, or amorphous silicon) in their channel formation region (hereinafter, referred to as a Si transistor) can be used as all of the transistor M1 to the transistor M3. Alternatively, it is preferable to use OS transistors as the transistor M1 and the transistor M3 and to use a Si transistor as the transistor M2.

A Si transistor can be used as one or more of a plurality of transistors included in the driver circuits 112, 113, and 114 and an OS transistor can be used as the other transistors. One or more of the driver circuits 112, 113, and 114 may be formed using a Si transistor and the other may be formed using an OS transistor.

As the OS transistor, a transistor that includes an oxide semiconductor in its semiconductor layer where a channel is formed can be used. A semiconductor layer preferably contains indium, M (M is one or more selected from gallium, aluminum, silicon, boron, yttrium, tin, copper, vanadium, beryllium, titanium, iron, nickel, germanium, zirconium, molybdenum, lanthanum, cerium, neodymium, hafnium, tantalum, tungsten, and magnesium), and zinc, for example. Specifically, M is preferably one or more selected from aluminum, gallium, yttrium, and tin. It is particularly preferable to use an oxide containing indium, gallium, and zinc (also referred to as IGZO) for the semiconductor layer of the OS transistor. Alternatively, it is preferable to use an oxide containing indium, tin, and zinc. Alternatively, it is preferable to use an oxide containing indium, gallium, tin, and zinc.

A transistor containing an oxide semiconductor having a wider band gap and a lower carrier concentration than silicon can achieve an extremely low off-state current. Thus, such a low off-state current enables long-term retention of electric charge accumulated in a capacitor that is connected to the transistor in series. Hence, it is particularly preferable to use transistors including an oxide semiconductor as each of the transistor M1 and the transistor M3 that is connected to the capacitor C1 in series. The use of the transistor containing an oxide semiconductor as each of the transistor M1 and the transistor M3 can prevent leakage of electric charge retained in the capacitor C1 through the transistor M1 or the transistor M3. Furthermore, since charge retained in the capacitor C1 can be retained for a long time, a still image can be displayed for a long period without rewriting data in the pixel.

Although n-channel transistors are shown as the transistors in FIG. 5A, p-channel transistors can be used A transistor including a pair of gates overlapping with a semiconductor layer therebetween can be used as the transistor included in the pixel circuit.

In the transistor including a pair of gates, the same potential is supplied to the pair of gates electrically connected to each other, whereby the on-state current of the transistor can be increased and the saturation characteristics can be improved. A potential for controlling the threshold voltage of the transistor may be supplied to one of the pair of gates. Furthermore, when a constant potential is supplied to one of the pair of gates, the stability of the electrical characteristics of the transistor can be improved. For example, one of the gates of the transistor may be electrically connected to a wiring to which a constant potential is supplied or may be electrically connected to a source or a drain of the transistor.

The pixel circuit illustrated in FIG. 5B is an example where a transistor including a pair of gates is used as the transistor M1 and the transistor M3. The pair of gates are electrically connected to each other in each of the transistor M1 and the transistor M3. Such a structure makes it possible to shorten the period in which data is written to the pixel circuit.

The pixel circuit illustrated in FIG. 5C is an example where a transistor including a pair of gates is used as the transistor M2 in addition to the transistor M1 and the transistor M3. A pair of gates of the transistor M2 are electrically connected to each other. When such a transistor is used as the transistor M2, the saturation characteristics are improved, whereby emission luminance of the light-emitting device EL can be controlled easily and the display quality can be increased.

Next, a mode of the light-emitting device and a connection mode between the sensor electrode and the driver circuit 114 will be described.

One embodiment of the present invention is a display device including a light-emitting device. For example, three kinds of light-emitting devices emitting red (R), green (G), and blue (B) light are included in the pixel, whereby a full-color display device can be achieved. Note that in the following description, components such as a light-emitting layer sandwiched between a pair of electrodes included in the light-emitting device are referred to as an EL layer.

In this specification and the like, a device manufactured using a metal mask or an FMM (a fine metal mask, a high-resolution metal mask) may be referred to as a device having an MM (a metal mask) structure. In this specification and the like, a device manufactured without using a metal mask or an FMM is referred to as a device having an MML (metal maskless) structure in some cases. A display device including a device having the MML structure is manufactured without using a metal mask and thus has a higher degree of freedom in designing the pixel arrangement, the pixel shape, and the like than a display device having the FMM structure or the MM structure device.

Note that in the method for manufacturing a display device having an MML structure, an island-shaped organic layer (hereinafter, an EL layer) that makes up an organic EL element is formed not by patterning with the use of a metal mask but by processing after formation of an EL layer over an entire surface. Accordingly, a high-resolution display device or a display device with a high aperture ratio, which has been difficult to achieve, can be manufactured. Moreover, EL layers can be formed separately for each color, enabling the display device to perform extremely clear display with high contrast and high display quality. In addition, a sacrificial layer provided over an EL layer can reduce damage to the EL layer in the manufacturing process of the display device, increasing the reliability of the light-emitting device.

It is difficult to set the distance between adjacent two EL layers to be less than 10 m, for example with a manufacturing method using a metal mask; however, with use of the above method, the distance can be decreased to be less than or equal to 3 m, less than or equal to 2 m, or less than or equal to 1 m. For example, with the use of an exposure apparatus for LSI, the distance can be decreased to be less than or equal to 500 nm, less than or equal to 200 nm, less than or equal to 100 nm, or less than or equal to 50 nm. Accordingly, the area of a non-light-emitting region that could exist between two light-emitting devices can be significantly reduced, and the aperture ratio can be close to 100%. For example, the aperture ratio higher than or equal to 50%, higher than or equal to 60%, higher than or equal to 70%, higher than or equal to 80%, or higher than or equal to 90% and lower than 100% can be achieved.

Furthermore, sizes of the EL layers themselves can be made much smaller than those in the case of using a metal mask. For example, in the case of using a metal mask for forming EL layers separately, a variation in the thickness occurs between the center and the edge of the island-shaped EL layer. This causes a reduction in an effective area that can be used as a light-emitting region with respect to the area of the entire EL layer. In contrast, in the above manufacturing method, an island-shaped EL layer is formed by processing a film deposited to have a uniform thickness (deleted), which enables a uniform thickness; hence, even when the EL layer has a minute size (deleted), almost the whole area can be used as a light-emitting region. Therefore, the above manu- facturing method makes it possible to achieve high defini- tion and a high aperture ratio.

In many cases, an organic film formed using a fine metal mask (FMM) has an extremely small taper angle (e.g., a taper angle of greater than 0° and less than 30°) so that the thickness of the film becomes smaller in a portion closer to an end portion. Therefore, it is difficult to clearly observe a side surface of an organic film formed using an FMM because the side surface and a top surface are continuously connected. In contrast, an EL layer included in one embodi- ment of the present invention is processed without using an FMM, and has a clear side surface. In particular, part of the taper angle of the EL layer included in one embodiment of the present invention is preferably greater than or equal to 30° and less than 90°, preferably greater than or equal to 60° and less than 90°.

Note that in this specification and the like, an end portion of an object having a tapered shape indicates that the end portion of the object has a cross-sectional shape in which the angle between a side surface (a surface) of the object and a surface on which the object is formed (a bottom surface) is greater than 0° and less than 90° in a region of the end portion, and the thickness continuously increases from the end portion. A taper angle refers to an angle between a bottom surface (a surface on which an object is formed) and a side surface (a surface) at an end portion of the object.

Hereinafter, a more specific example will be described.

FIG. 6A is a schematic top view of the display device 100. The display device 100 includes a plurality of light-emitting devices 90R emitting red light, a plurality of light-emitting devices 90G emitting green light, and a plurality of light- emitting devices 90B emitting blue light. Over these light- emitting devices, the sensor electrode 130X or the sensor electrode 130Y, which is the electrode of the touch sensor, is provided.

The light-emitting devices 90R, the light-emitting devices 90G, and the light-emitting devices 90B are each arranged in a matrix. Note that the arrangement method of the light-emitting devices is not limited thereto; another arrangement method such as a stripe arrangement, an S-stripe arrangement, a delta arrangement, a Bayer arrange- ment, or a zigzag arrangement may be employed; a PenTile arrangement, a diamond arrangement, or the like may also be used.

FIG. 6A illustrates a connection electrode 311a that is electrically connected to a common electrode 313. The connection electrode 311a is supplied with a potential (e.g., an anode potential or a cathode potential) that is to be supplied to the common electrode 313. In other words, the connection electrode 311a can be regarded as part of a power supply line. The connection electrode 311a is provided outside the display portion where the light-emitting devices 90R and the like are arranged, and is electrically connected to the common electrode 313 through a connection portion 330a.

The connection electrode 311a can be provided along the outer periphery of the display portion. For example, the connection electrode 311a may be provided along one side of the outer periphery of the display portion or two or more sides of the outer periphery of the display portion. That is, in the case where the display region has a rectangular top surface shape, a top surface of the connection electrode 311a can have a band shape, an L shape, a square bracket shape, a quadrangular shape, or the like.

FIG. 6A also illustrates a connection electrode 311b that is electrically connected to the sensor electrode 130X. The connection electrode 311b is electrically connected to the transistor included in the driver circuit 114. The connection portion 330b between the sensor electrode 130X and the connection electrode 311b is provided outside the connec- tion portion 330a between the common electrode 313 and the connection electrode 311a (the side opposite to the display portion).

Note that the transistor has a function of inputting a pulse voltage to the connection electrode 311b. That is, the con- nection electrode 311b is electrically connected to the source or the drain of the transistor.

Although FIG. 6A illustrates an example in which the conductive layer included in the sensor electrode 130X extends to the connection portion 330b with the connection electrode 311b, the conductive layer may be electrically connected to the low-resistance metal layer and the metal layer may be electrically connected to the connection elec- trode 311b.

FIG. 6B is a schematic cross-sectional view taken along dashed-dotted lines A1-A2 and B1-B2 and a dashed-dotted line C1-C2 in FIG. 6A. FIG. 6B illustrates a schematic cross-sectional view of the light-emitting device 90G, the light-emitting device 90B, the connection electrode 311a, and the connection electrode 311b provided over an insu- lating layer 301.

Note that the light-emitting device 90R that is not illus- trated in the schematic cross-sectional view can have a structure similar to that of the light-emitting device 90G or the light-emitting device 90B.

The light-emitting device 90G includes a pixel electrode 311, an organic layer 312G, and the common electrode 313. The light-emitting device 90B includes the pixel electrode 311, an organic layer 312B, and the common electrode 313. The common electrode 313 is shared by the light-emitting device 90G and the light-emitting device 90B. The pixel electrodes 311 are provided to be apart from each other between the light-emitting devices.

The organic layer 312G contains at least a light-emitting organic compound that emits light with intensity in the green wavelength range. The organic layer 312B contains at least a light-emitting organic compound that has a peak wave- length in the blue wavelength range. The organic layer 312G and the organic layer 312B can each be called an EL layer.

The organic layer 312G and the organic layer 312B may each include one or more of an electron-injection layer, an electron-transport layer, a hole-injection layer, and a hole- transport layer.

Here, the uppermost layer in the stacked-layer structure of each of the organic layer 312G and the organic layer 312B, i.e., the layer in contact with the common electrode 313 is preferably a layer other than the light-emitting layer. For example, a structure is preferable in which an electron- injection layer, an electron-transport layer, a hole-injection layer, a hole-transport layer, or a layer other than those covers the light-emitting layer so as to be in contact with the common electrode 313. When a top surface of the light- emitting layer is protected by another layer in manufacturing each light-emitting device, the reliability of the light-emit- ting device can be improved.

The pixel electrode 311 is provided in each of the light- emitting devices. The common electrode 313 is provided as one continuous layer shared by the light-emitting devices. A conductive film that transmits visible light is used for either the pixel electrode 311 or the common electrode 313, and a reflective conductive film is used for the other. When the pixel electrodes are light-transmitting electrodes and the common electrode 313 is a reflective electrode, a bottom-emission display device can be obtained; in contrast, when the pixel electrodes are reflective electrodes and the common electrode 313 is a light-transmitting electrode, a top-emission display device can be obtained. Note that when both the pixel electrodes and the common electrode 313 transmit light, a dual-emission display device can be obtained.

A insulating layer 340 is provided to cover end portions of the pixel electrode 311. The end portions of the insulating layer 340 preferably have tapered shapes. Note that in this specification and the like, an end portion of an object having a tapered shape indicates that the end portion of the object has a cross-sectional shape in which the angle between a surface of the object and a surface on which the object is formed is greater than 0° and less than 90° in a region of the end portion, and the thickness continuously increases from the end portion.

When an organic resin is used for the insulating layer 340, a surface thereof can be moderately curved. Thus, coverage with a film formed over the insulating layer 340 can be improved.

Examples of materials that can be used for the insulating layer 340 include an acrylic resin, a polyimide resin, an epoxy resin, a polyamide resin, a polyimide-amide resin, a siloxane resin, a benzocyclobutene-based resin, a phenol resin, and precursors of these resins.

Alternatively, an inorganic insulating material may be used for the insulating layer 340. Examples of inorganic insulating materials that can be used for the insulating layer 340 include oxides or nitride films such as silicon oxide, silicon oxynitride, silicon nitride oxide, silicon nitride, aluminum oxide, aluminum oxynitride, and hafnium oxide. Yttrium oxide, zirconium oxide, gallium oxide, tantalum oxide, magnesium oxide, lanthanum oxide, cerium oxide, neodymium oxide, or the like may be used.

As illustrated in FIG. 6B, two organic layers are provided to be apart from each other between the light-emitting devices that emit light of different colors, and a gap is provided between the two organic layers. In this manner, the organic layer 312G and the organic layer 312B are preferably provided so as not to be in contact with each other. This suitably prevents unintentional light emission from being caused by current flowing through adjacent two organic layers. As a result, the contrast can be increased to achieve a display device with high display quality.

The end portions of the organic layer 312G and the organic layer 312B each preferably have a taper angle of greater than or equal to 30°. In an end portion of each of the organic layer 312G and the organic layer 312B, the angle between a side surface (a surface) and a bottom surface (a surface on which an object is formed) is preferably greater than or equal to 30° and less than or equal to 120°, further preferably greater than or equal to 45° and less than or equal to 120°, still further preferably greater than or equal to 60° and less than or equal to 120°. Alternatively, the organic layer 312G and the organic layer 312B each preferably have a taper angle of 90° or a neighborhood thereof (greater than or equal to 80° and less than or equal to 100°, for example).

A protective layer 321 is provided over the common electrode 313. The protective layer 321 has a function of preventing diffusion of impurities such as water into each light-emitting device from the above.

The protective layer 321 can have, for example, a single-layer structure or a stacked-layer structure including at least an inorganic insulating film. Examples of the inorganic insulating film include an oxide film or a nitride film such as a silicon oxide film, a silicon oxynitride film, a silicon nitride oxide film, a silicon nitride film, an aluminum oxide film, an aluminum oxynitride film, or a hafnium oxide film. Alternatively, a semiconductor material such as indium gallium oxide or indium gallium zinc oxide may be used for the protective layer 321.

As the protective layer 321, a stacked film of an inorganic insulating film and an organic insulating film can be used. For example, a structure in which an organic insulating film is sandwiched between a pair of inorganic insulating films is preferable. Furthermore, it is preferable that the organic insulating film function as a planarization film. With this structure, a top surface of the organic insulating film can be flat, and accordingly, coverage with the inorganic insulating film over the organic insulating film is improved, leading to an improvement in barrier properties. Moreover, in the case where a component (e.g., an antenna, an electrode of a touch sensor, a color filter, a lens array, or the like) is provided above the protective layer 321, the influence of an uneven shape due to a lower structure is preferably reduced.

FIG. 6B illustrates an example in which an insulating layer 322 functioning as a planarization film is provided over the protective layer 321 and the sensor electrodes 130X and 130Y functioning as electrodes of the touch sensor are provided over the insulating layer 322. Note that the insulating layer 322 sometimes has a function of a solid sealing layer for increasing the reliability of the light-emitting device. The layer corresponding to the insulating layer 322 is not limited to one layer and may be formed of a plurality of layers.

Note that FIG. 6B illustrates an example in which light-transmitting conductive films are provided as the sensor electrodes 130X and 130Y. In the case where lattice-shaped metal conductive films or the like are provided as the sensor electrodes 130X and 130Y, the films are each preferably provided at a position not or hardly overlapping with the light-emitting devices 90G and 90B as illustrated in FIG. 6C.

In the connection portion 330a, the common electrode 313 is provided on and in contact with the connection electrode 311a, and the protective layer 321 is provided to cover the common electrode 313. In addition, the insulating layer 340 is provided to cover end portions of the connection electrode 311a.

In the connection portion 330b, the connection electrode 311b is electrically connected to the sensor electrode 130X through an opening provided in the insulating layer 322 and the protective layer 321. Here, since a material with relatively high resistance is used for the sensor electrode 130X in some cases, the metal layer 315 is preferably provided between the sensor electrode 130X and the connection electrode 311b. Providing the metal layer 315 can reduce a contact resistance between the sensor electrode 130X and the connection electrode 311b.

Note that in the case where the contact resistance does not matter, the sensor electrode 130 and the connection electrode 311b may be in direct contact with each other as illustrated in FIG. 6D. Alternatively, as illustrated in FIG. 6E, a structure in which the insulating layer 322 is not provided in the vicinity of the connection portion 330b may be employed.

A structure example of the display device that is partly different from that in FIG. 6B is described below. Specifically, an example in which the insulating layer 340 is not provided is described.

Figure 7A:
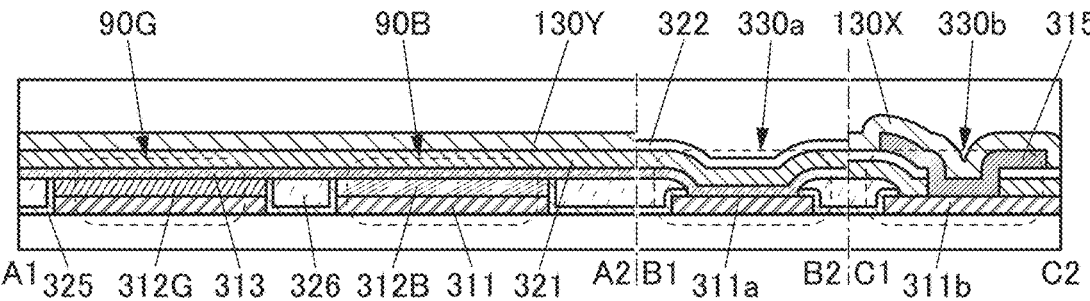
FIG. 7A to FIG. 7D are diagrams each illustrating a structure example of a display device.

FIG. 7A illustrates an example of the case where a side surface of the pixel electrode 311 is substantially aligned with side surfaces of the organic layer 312G or the organic layer 312B.

In FIG. 7A, an insulating layer 325 is provided in contact with the side surfaces of the organic layer 312G, the organic layer 312B, and the pixel electrode 311. The insulating layer 325 can inhibit the pixel electrode 311 and the common electrode 313 from being electrically short-circuited and effectively inhibit leakage current therebetween.

The insulating layer 325 can be an insulating layer containing an inorganic material. As the insulating layer 325, an inorganic insulating film such as an oxide insulating film, a nitride insulating film, an oxynitride insulating film, or a nitride oxide insulating film can be used, for example. The insulating layer 325 may have a single-layer structure or a stacked-layer structure. Examples of the oxide insulating film include a silicon oxide film, an aluminum oxide film, a magnesium oxide film, an indium gallium zinc oxide film, a gallium oxide film, a germanium oxide film, an yttrium oxide film, a zirconium oxide film, a lanthanum oxide film, a neodymium oxide film, a hafnium oxide film, and a tantalum oxide film. Examples of the nitride insulating film include a silicon nitride film and an aluminum nitride film. Examples of the oxynitride insulating film include a silicon oxynitride film and an aluminum oxynitride film. Examples of the nitride oxide insulating film include a silicon nitride oxide film and an aluminum nitride oxide film. In particular, when an inorganic insulating film such as an aluminum oxide film, a hafnium oxide film, or a silicon oxide film formed by an ALD method is used as the insulating layer 325, the insulating layer 325 can have a small number of pin holes and excel in a function of protecting the organic layer.

Note that in this specification and the like, oxynitride refers to a material that contains more oxygen than nitrogen in its composition, and nitride oxide refers to a material that contains more nitrogen than oxygen in its composition. For example, a silicon oxynitride refers to a material that contains oxygen at a higher proportion than nitrogen, and a silicon nitride oxide refers to a material that contains nitrogen at a higher proportion than oxygen.

The insulating layer 325 can be formed by a sputtering method, a CVD method, a PLD method, an ALD method, or the like. The insulating layer 325 is preferably formed by an ALD method achieving good coverage.

A resin layer 326 is provided between two adjacent light-emitting devices so as to fill the gap between two facing pixel electrodes and two facing organic layers. The resin layer 326 can planarize a surface on which the common electrode 313 and the like are formed, which prevents disconnection of the common electrode 313 due to poor coverage in a step between adjacent light-emitting devices.

As the resin layer 326, an insulating layer containing an organic material can be suitably used. For example, the resin layer 326 can be formed using an acrylic resin, a polyimide resin, an epoxy resin, an imide resin, a polyamide resin, a polyimide-amide resin, a silicone resin, a siloxane resin, a benzocyclobutene-based resin, a phenol resin, precursors of these resins, or the like. The resin layer 326 may be formed using an organic material such as polyvinyl alcohol (PVA), polyvinyl butyral, polyvinylpyrrolidone, polyethylene glycol, polyglycerin, pullulan, water-soluble cellulose, or an alcohol-soluble polyamide resin. Moreover, the resin layer 326 can be formed using a photosensitive resin. A photoresist may be used as the photosensitive resin. The photosensitive resin can be a material of positive type or a material of negative type.

Furthermore, a material absorbing visible light is preferably used for the resin layer 326. When a material absorbing visible light is used for the resin layer 326, light emitted from the EL layer can be absorbed by the resin layer 326, whereby stray light from an adjacent pixel can be blocked and color mixture can be inhibited. Thus, a display device with high display quality can be provided.

Since the insulating layer 325 is provided between the resin layer 326 and the organic layer 312G or the like, impurities such as moisture included in the resin layer 326 can be prevented from being diffused into the organic layer 312G or the like, whereby a highly reliable display device can be provided.

A reflective film (e.g., a metal film containing one or more of silver, palladium, copper, titanium, aluminum, and the like) may be provided between the insulating layer 325 and the resin layer 326 so as to provide a mechanism in which light emitted from the light-emitting layer is reflected by the reflective film and thus the light extraction efficiency is increased.

Figure 7B:
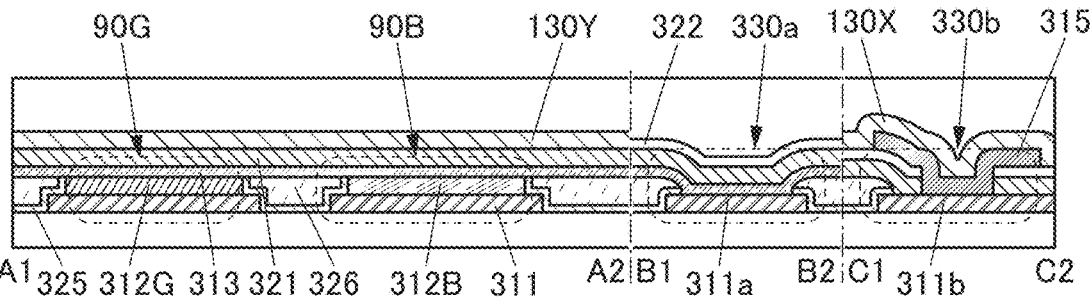

FIG. 7B illustrates an example in which the width of the pixel electrode 311 is larger than the width of the organic layer 312B or the organic layer 312G. The organic layer 312G or the like is provided on the inner side than end portions of the pixel electrode 311.

The insulating layer 325 is provided to cover the side surfaces of the organic layer included in the light-emitting device and the side surfaces and part of a top surface of the pixel electrode 311. The resin layer 326 is positioned between two adjacent light-emitting devices and is provided in contact with the insulating layer 325.

Figure 7C:
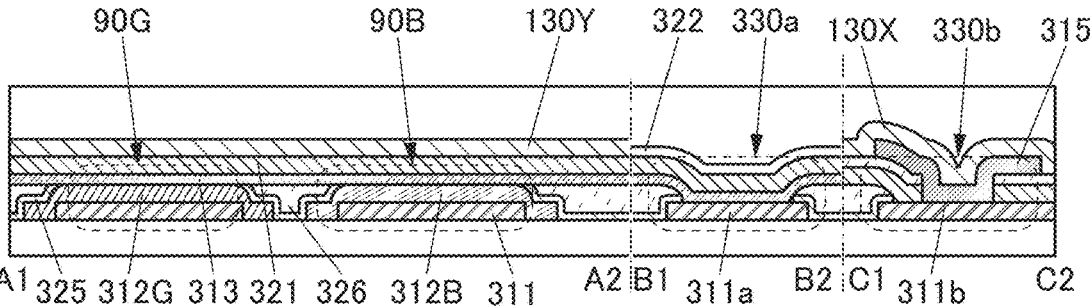

FIG. 7C illustrates an example in which the width of the pixel electrode 311 is smaller than the width of the organic layer 312G or the organic layer 312B. The organic layer 312G or the like extends to an outer side beyond the end portions of the pixel electrode 311.

The insulating layer 325 is provided in contact with the side surfaces of the organic layers of two adjacent light-emitting devices. The insulating layer 325 may be provided to cover not only the side surface but also part of atop surface of the organic layer 312G or the like. The resin layer 326 is positioned between two adjacent light-emitting devices and is provided in contact with the insulating layer 325.

Here, a structure example of the resin layer 326 is described.

A top surface of the resin layer 326 is preferably as flat as possible; however, a surface of the resin layer 326 may have a depressed shape or projecting shape depending on an uneven shape of a surface on which the resin layer 326 is formed, the formation conditions of the resin layer 326, or the like.

Figure 7D:
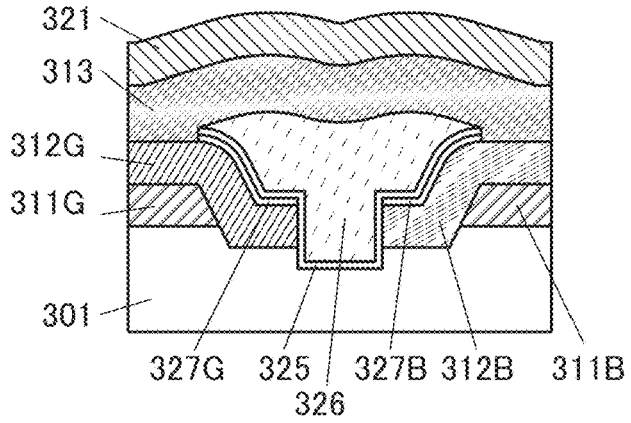

FIG. 7D is an enlarged cross-sectional view illustrating an example of the case where the surface of the resin layer 326 has an uneven shape in the structure of FIG. 7C.

The end portions of the pixel electrode 311G and the pixel electrode 311B each have a tapered shape. The organic layer 312G is formed to cover the end portion of the pixel electrode 311G, and the organic layer 312B is formed to cover the end portion of the pixel electrode 311B. The insulating layer 301 has a depressed portion between the pixel electrode 311G and the pixel electrode 311B. The depressed portion is formed when the pixel electrode 311G and the pixel electrode 311B are processed.

The insulating layer 325 is provided so as to cover end portions of the organic layer 312G and the organic layer 312B, and a protective layer 327G is provided in a region between the organic layer 312G and the insulating layer 325. A protective layer 327B is provided in a region between the organic layer 312B and the insulating layer 325. The protective layer 327G and the protective layer 327B function as masks (also referred to as hard masks) for processing the organic layer 312G and the organic layer 312B, respectively. The organic layer 312G and the organic layer 312B can be formed using an inorganic film, more specifically, an inorganic conductive film (typically, tungsten) or an inorganic insulating film (typically, silicon oxide, silicon nitride, or aluminum oxide).

A depressed portion is formed in the insulating layer 301 positioned in a region between the organic layer 312G and the organic layer 312B. The depressed portion is formed when the organic layer 312G and the organic layer 312B are processed.

Note that the common electrode 313 and the protective layer 321 are provided to cover the organic layer 312G, the organic layer 312B, the protective layer 327G, the protective layer 327B, the insulating layer 325, and the resin layer 326.

In a cross-sectional view, when at least part of end portions of the resin layer 326 preferably has a tapered shape, in which case coverage with the common electrode 313 can be improved.

Note that the modes and components illustrated in FIG. 6A to FIG. 6E and FIG. 7A to FIG. 7D are examples, and other structures can also be used in one embodiment of the present invention.

At least part of this embodiment can be implemented in combination with any of the other embodiments described in this specification, as appropriate.

Embodiment 2

In this embodiment, vertical transistors that can be used in the pixel 120 and the driver circuits 112, 113, and 114 described in Embodiment 1 will be described. The vertical transistor has a structure that facilitates reduction in size and high-speed operation.

Figure 8A:
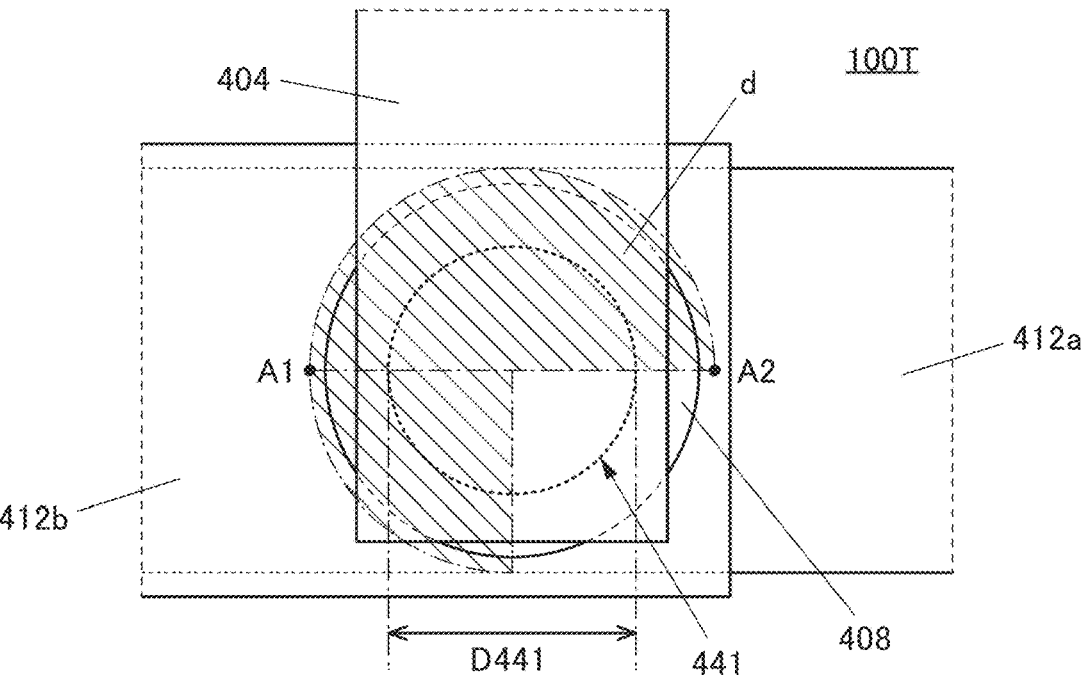
FIG. 8A and FIG. 8B are diagrams each illustrating a vertical transistor.
Figure 8B:
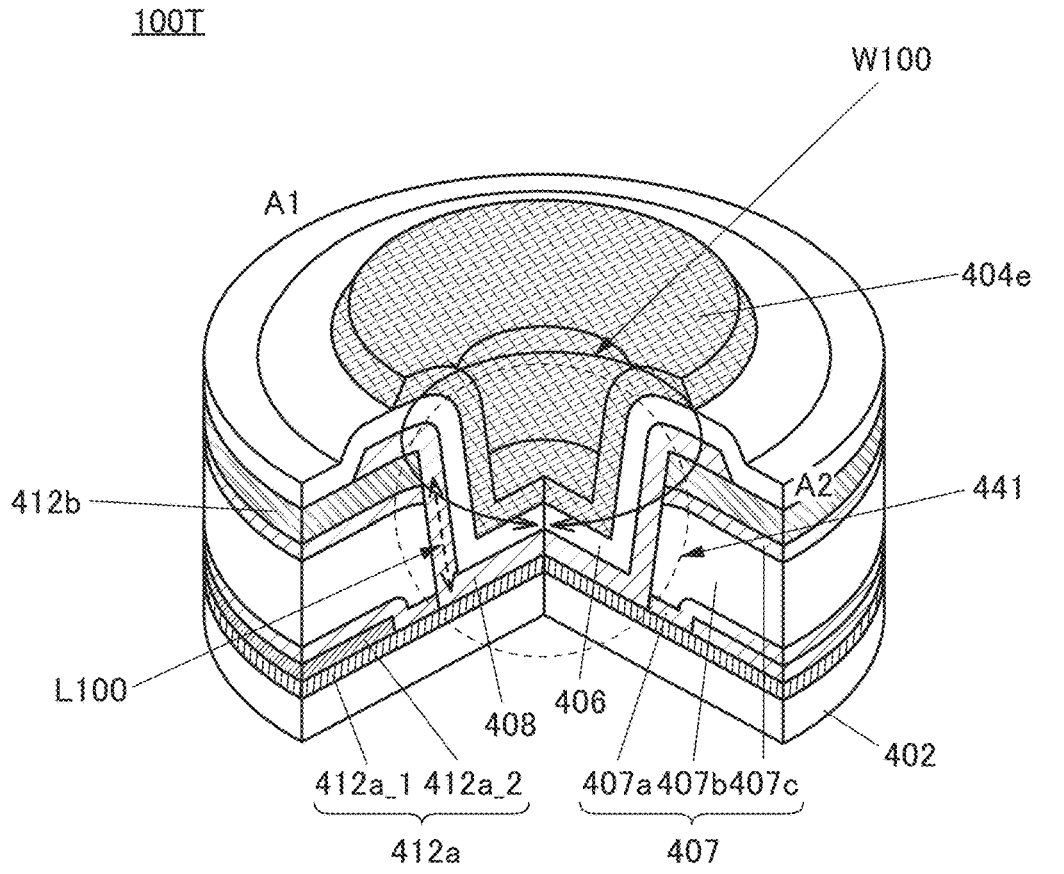

FIG. 8A and FIG. 8B are diagrams each illustrating a vertical transistor. FIG. 8A is a top view. FIG. 8B is a cross-sectional perspective view in the depth direction of a region d illustrated in FIG. 8A. Note that for simplification, some components are not illustrated in FIG. 8A and FIG. 8B.

A transistor 100T, which is a vertical transistor, can be provided over a substrate 402. The transistor 100T includes a conductive layer 404, a conductive layer 404e, an insulating layer 406, a semiconductor layer 408, a conductive layer 412a, and a conductive layer 412b. The conductive layer 404 is a gate wiring electrically connected to the conductive layer 404e functioning as a gate electrode. Part of the insulating layer 406 functions as a gate insulating layer. The conductive layer 412a functions as one of a source electrode and a drain electrode. The conductive layer 412b functions as the other of the source electrode and the drain electrode.

In the semiconductor layer 408, the whole region that is between the source electrode and the drain electrode and overlaps with the gate electrode with the gate insulating layer therebetween functions as a channel formation region. In the semiconductor layer 408, a region in contact with the source electrode functions as a source region, and a region in contact with the drain electrode functions as a drain region.

The conductive layer 412a is provided over the substrate 402, an insulating layer 407 is provided over the conductive layer 412a, and the conductive layer 412b is provided over the insulating layer 407. The insulating layer 407 includes a region interposed between the conductive layer 412a and the conductive layer 412b. The conductive layer 412a includes a region overlapping with the conductive layer 412b with the insulating layer 407 therebetween. An opening 441 reaching the conductive layer 412a is provided in the insulating layer 407 and the conductive layer 412b.

The conductive layer 412a and the conductive layer 412b may each have a stacked-layer structure. FIG. 8B and the like illustrate an example in which the conductive layer 412a has a stacked-layer structure of a conductive layer 412a_1 and a conductive layer 412a_2. Note that although FIG. 8B illustrates an example in which the conductive layer 412a_1 includes a region over which the conductive layer 412a_2 is not provided and the region is in contact with the semiconductor layer 408, the conductive layer 412a_2 may be in contact with the semiconductor layer 408. Alternatively, the conductive layer 412a_2 may be omitted.

The top surface shape of the opening 441 can be a circle or an ellipse, for example. When the top surface shape of the opening 441 is a circle, the opening 441 can be formed with high processing accuracy and the opening 441 having a minute size can be formed. Note that the top surface shape of the opening 441 may be a polygon such as a triangle, a quadrilateral (including a rectangle, a rhombus, and a square), or a pentagon, or the polygon with rounded corners. The opening 441 can be formed using a resist mask, for example.

The semiconductor layer 408 is provided to cover the opening 441. The semiconductor layer 408 includes a region in contact with a top surface and a side surface of the conductive layer 412b, a side surface of the insulating layer 407, and a top surface of the conductive layer 412a. The semiconductor layer 408 is electrically connected to the conductive layer 412a through the opening 441. The semiconductor layer 408 has a shape along the shapes of the top surface and the side surface of the conductive layer 412b, the side surface of the insulating layer 407, and the top surface of the conductive layer 412a.

Although the semiconductor layer 408 has a single-layer structure in FIG. 8B and the like, one embodiment of the present invention is not limited thereto. The semiconductor layer 408 may have a stacked-layer structure of two or more layers.

The insulating layer 406 functioning as the gate insulating layer of the transistor 100T is provided over the semiconductor layer 408, the conductive layer 412b, and the insulating layer 407 to cover a depressed portion originating from the opening 441.

The conductive layer 404e of the transistor 100T is provided over the insulating layer 406 to cover the depressed portion originating from the opening 441. Here, an insulating layer (not illustrated) is preferably provided over the conductive layer 404e and the insulating layer 406. An opening reaching the conductive layer 404e is formed in the insulating layer and the conductive layer 404 functioning as a gate line is electrically connected to the conductive layer 404e in the opening.

The conductive layer 404e includes a region overlapping with the semiconductor layer 408 with the insulating layer 406 therebetween in the opening 441. The conductive layer

404*e* also includes a region overlapping with the conductive layer 412*a* and a region overlapping with the conductive layer 412*b* with the insulating layer 406 and the semiconductor layer 408 therebetween. The conductive layer 404*e* preferably covers an end portion of the conductive layer 412*b* on the opening 441 side. With such a structure, in the semiconductor layer 408, the whole region that is between the source electrode and the drain electrode and overlaps with the gate electrode with the gate insulating layer therebetween can function as a channel formation region.

The transistor 100T is what is called a top-gate transistor including the gate electrode above the semiconductor layer 408. Furthermore, since a bottom surface of the semiconductor layer 408 is in contact with the source electrode or the drain electrode, the transistor 100T can be referred to as a TGBC (Top Gate Bottom Contact) transistor.

The conductive layer 412*a*, the conductive layer 412*b*, and the conductive layer 404 can function as wirings, and the transistor 100T can be provided in a region where these wirings overlap with each other. That is, the areas occupied by the transistor 100T and the wirings can be reduced in the circuit including the transistor 100T and the wirings. This can reduce the area occupied by the circuit.

In the transistor of one embodiment of the present invention, the conductive layer 412*a*, the conductive layer 412*b*, and the conductive layer 404 functioning as wirings can be provided by processing different conductive films. Thus, any one of the conductive layers can be provided to overlap with at least one of the other conductive layers, leading to high layout flexibility and a reduction in the area occupied by the circuit.

Next, the channel length and the channel width of the transistor 100T will be described. In the semiconductor layer 408, a region in contact with the conductive layer 412*a* functions as one of the source region and the drain region, a region in contact with the conductive layer 412*b* functions as the other of the source region and the drain region, and a region between the source region and the drain region functions as the channel formation region.

The channel length of the transistor 100T is the distance between the source region and the drain region. In FIG. 8B, a channel length L100 of the transistor 100T is indicated by a dashed double-headed arrow. In the cross-sectional view, the channel length L100 is the distance between an end portion of the region where the semiconductor layer 408 is in contact with the conductive layer 412*a* and an end portion of the region where the semiconductor layer 408 is in contact with the conductive layer 412*b*.

That is, the channel length L100 is determined by the thickness of the insulating layer 407 and the angle formed by the side surface of the insulating layer 407 on the opening 441 side and the top surface of the conductive layer 412*a*, and is not affected by the performance of a light-exposure apparatus used for manufacturing the transistor. Thus, the channel length L100 can be a value smaller than that of the resolution limit of a light-exposure apparatus, which enables a transistor having a minute size.

The reduction in the channel length L100 can increase the on-state current of the transistor 100T. With use of the transistor 100T, a circuit capable of high-speed operation can be manufactured. Furthermore, the transistor can be downsized, which enables a reduction in the area occupied by the circuit.

Although FIG. 8B and the like illustrate the structure in which the side surface of the insulating layer 407 on the opening 441 side is linear in the cross-sectional view, one embodiment of the present invention is not limited thereto.

In the cross-sectional view, the side surface of the insulating layer 407 on the opening 441 side may be curved, or the side surface may include both a linear region and a curved region.

The channel width of the transistor 100T is the width of the source region or the width of the drain region in a direction orthogonal to the channel length direction. That is, the channel width is a width of a region where the semiconductor layer 408 is in contact with the conductive layer 412*a* or a width of a region where the semiconductor layer 408 is in contact with the conductive layer 412*b* in the direction orthogonal to the channel length direction. Here, the channel width of the transistor 100T is described as the width of the region where the semiconductor layer 408 is in contact with the conductive layer 412*b* in the direction orthogonal to the channel length direction. In FIG. 8A and FIG. 8B, a channel width W100 of the transistor 100T is indicated by a solid double-headed arrow. In the top view, the channel width W100 is the length of the end portion of the bottom surface of the conductive layer 412*b* on the opening 441 side.

The channel width W100 is determined by the top surface shape of the opening 441. Note that in the case where the top surface shape of the opening 441 is a circle, the channel width W100 can be calculated to be "D441×π" assuming that the diameter of the opening 441 is D441 and the thickness of the conductive layer 412*b* is negligible.

In other words, it can be said that the transistor 100T has a large channel width with respect to its occupation area. The transistor 100T with the large channel width W100 can have a high on-state current and thus a circuit capable of high-speed operation can be manufactured.

Figure 9A:
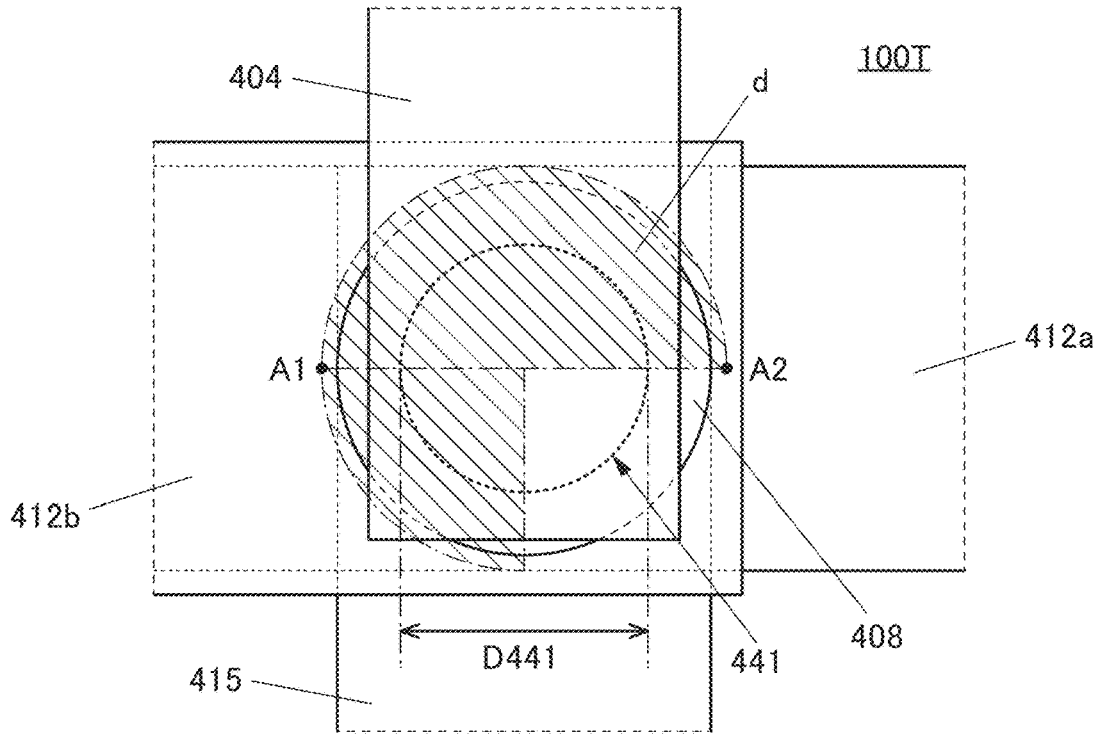
FIG. 9A and FIG. 9B are diagrams each illustrating a vertical transistor.
Figure 9B:
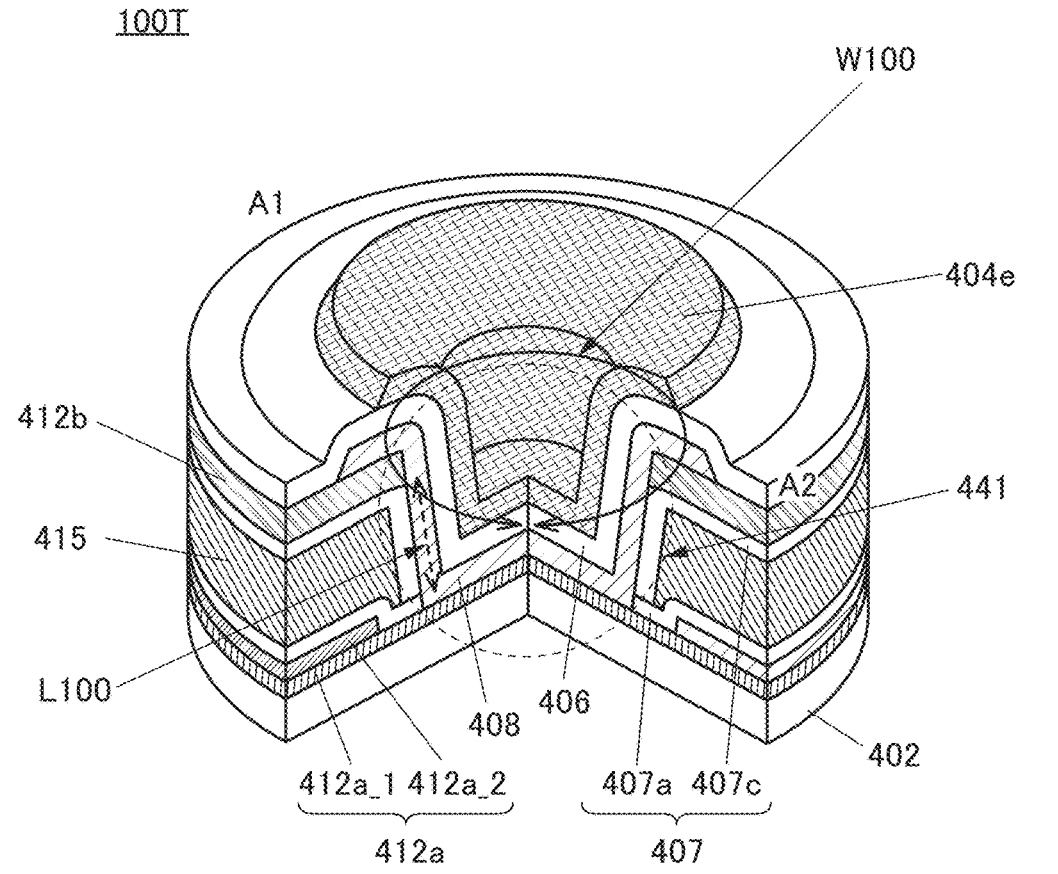

FIG. 9A and FIG. 9B illustrate an example where a back gate is added to the structure in FIG. 8A and FIG. 8B. A conductive layer 415 functioning as a back gate electrode is provided to be embedded in the insulating layer 407 (the insulating layers 407*a* and 407*c*) and part of the insulating layer 407*c* provided between the semiconductor layer 408 and the conductive layer 415 functions as a gate insulating layer. Note that an insulating layer different from the insulating layer 407*c* may be used as a gate insulating layer.

Components included in the transistor 100T of this embodiment will be described below.

[Components of Transistor]

[Semiconductor Layer 408]

A semiconductor material that can be used for the semiconductor layer 408 is not particularly limited. For example, a single-element semiconductor or a compound semiconductor can be used. As the single-element semiconductor, silicon or germanium can be used, for example. Examples of the compound semiconductor include gallium arsenide and silicon germanium. As the compound semiconductor, an organic substance having semiconductor characteristics or a metal oxide having semiconductor characteristics (also referred to as an oxide semiconductor) can be used. These semiconductor materials may contain an impurity as a dopant.

There is no particular limitation on the crystallinity of a semiconductor material used for the semiconductor layer 408, and any of an amorphous semiconductor and a semiconductor having crystallinity (a single crystal semiconductor, a polycrystalline semiconductor, a microcrystalline semiconductor, or a semiconductor partly including crystal regions) may be used. A semiconductor having crystallinity is preferably used, in which case deterioration of the transistor characteristics can be inhibited.

The semiconductor layer 408 preferably includes a metal oxide (an oxide semiconductor). Examples of the metal oxide that can be used for the semiconductor layer 408 include indium oxide, gallium oxide, and zinc oxide. The metal oxide preferably contains at least indium (In) or zinc (Zn). The metal oxide preferably contains two or three kinds selected from indium, an element M, and zinc. The element M is one or more kinds selected from gallium, aluminum, silicon, boron, yttrium, tin, antimony, copper, vanadium, beryllium, titanium, iron, nickel, germanium, zirconium, molybdenum, lanthanum, cerium, neodymium, hafnium, tantalum, tungsten, cobalt, and magnesium. Specifically, the element M is preferably one or more kinds selected from aluminum, gallium, yttrium, and tin. The element M is further preferably gallium.

For the semiconductor layer 408, for example, any of indium oxide, indium gallium oxide (In—Ga oxide), indium zinc oxide (In—Zn oxide), indium tin oxide (In—Sn oxide), indium titanium oxide (In—Ti oxide), gallium zinc oxide (Ga—Zn oxide), indium aluminum zinc oxide (In—Al—Zn oxide, also referred to as IAZO), indium tin zinc oxide (In—Sn—Zn oxide), indium titanium zinc oxide (In—Ti—Zn oxide), indium gallium zinc oxide (In—Ga—Zn oxide, also referred to as IGZO), indium gallium tin zinc oxide (In—Ga—Sn—Zn oxide, also referred to as IGZTO), and indium gallium aluminum zinc oxide (In—Ga—Al—Zn oxide, also referred to as IGAZO or IAGZO) can be used. Alternatively, indium tin oxide containing silicon, or the like can also be used.

Here, the composition of the metal oxide included in the semiconductor layer 408 greatly affects the electrical characteristics and reliability of the transistor 100T. For example, by increasing the proportion of the number of indium atoms in the total number of atoms of all the metal elements contained in the metal oxide, a transistor having a high on-state current can be provided.

In the case of using In—Zn oxide for the semiconductor layer 408, a metal oxide in which the atomic proportion of indium is higher than or equal to the atomic proportion of zinc is preferably used. For example, it is possible to use a metal oxide in which the atomic ratio of metal elements is In:Zn=1:1, In:Zn=2:1, In:Zn=3:1, In:Zn=4:1, In:Zn=5:1, In:Zn=7:1, or In:Zn=10:1, or in the neighborhood thereof.

In the case of using In—Sn oxide for the semiconductor layer 408, a metal oxide in which the atomic proportion of indium is higher than or equal to the atomic proportion of tin is preferably used. For example, it is possible to use a metal oxide in which the atomic ratio of metal elements is In:Sn=1:1, In:Sn=2:1, In:Sn=3:1, In:Sn=4:1, In:Sn=5:1, In:Sn=7:1, or In:Sn=10:1, or in the neighborhood thereof.

In the case of using In—Sn—Zn oxide for the semiconductor layer 408, a metal oxide in which the atomic proportion of indium is higher than the atomic proportion of tin can be used. It is further preferable to use a metal oxide in which the atomic proportion of zinc is higher than the atomic proportion of tin. For example, it is possible to use a metal oxide in which the atomic ratio of metal elements is In:Sn:Zn=2:1:3, In:Sn:Zn=3:1:2, In:Sn:Zn=4:2:3, In:Sn:Zn=4:2:4.1, In:Sn:Zn=5:1:3, In:Sn:Zn=5:1:6, In:Sn:Zn=5:1:7, In:Sn:Zn=5:1:8, In:Sn:Zn=6:1:6, In:Sn:Zn=10:1:3, In:Sn:Zn=10:1:6, In:Sn:Zn=10:1:7, In:Sn:Zn=10:1:8, In:Sn:Zn=5:2:5, In:Sn:Zn=10:1:10, In:Sn:Zn=20:1:10, or In:Sn:Zn=40:1:10, or in the neighborhood thereof.

In the case of using In—Al—Zn oxide for the semiconductor layer 408, a metal oxide in which the atomic proportion of indium is higher than the atomic proportion of aluminum can be used. It is further preferable to use a metal oxide in which the atomic proportion of zinc is higher than the atomic proportion of aluminum. For example, it is possible to use a metal oxide in which the atomic ratio of metal elements is In:Al:Zn=2:1:3, In:Al:Zn=3:1:2, In:Al:Zn=4:2:3, In:Al:Zn=4:2:4.1, In:Al:Zn=5:1:3, In:Al:Zn=5:1:6, In:Al:Zn=5:1:7, In:Al:Zn=5:1:8, In:Al:Zn=6:1:6, In:Al:Zn=10:1:3, In:Al:Zn=10:1:6, In:Al:Zn=10:1:7, In:Al:Zn=10:1:8, In:Al:Zn=5:2:5, In:Al:Zn=10:1:10, In:Al:Zn=20:1:10, or In:Al:Zn=40:1:10, or in the neighborhood thereof.

In the case of using In—Ga—Zn oxide for the semiconductor layer 408, a metal oxide in which the proportion of the number of indium atoms in the total number of atoms of all the contained metal elements is higher than the proportion of the number of gallium atoms can be used. It is further preferable to use a metal oxide in which the proportion of the number of zinc atoms is higher than the proportion of the number of gallium atoms. For example, a metal oxide having any of the following atomic ratios of metal elements can be used for the semiconductor layer 408: In:Ga:Zn=2:1:3, In:Ga:Zn=3:1:2, In:Ga:Zn=4:2:3, In:Ga:Zn=4:2:4.1, In:Ga:Zn=5:1:3, In:Ga:Zn=5:1:6, In:Ga:Zn=5:1:7, In:Ga:Zn=5:1:8, In:Ga:Zn=6:1:6, In:Ga:Zn=10:1:3, In:Ga:Zn=10:1:6, In:Ga:Zn=10:1:7, In:Ga:Zn=10:1:8, In:Ga:Zn=5:2:5, In:Ga:Zn=10:1:10, In:Ga:Zn=20:1:10, In:Ga:Zn=40:1:10, and the neighborhood thereof.

In the case of using In-M-Zn oxide for the semiconductor layer 408, a metal oxide in which the proportion of the number of indium atoms in the total number of atoms of all the contained metal elements is higher than the proportion of the number of element M atoms can be used. It is further preferable to use a metal oxide in which the proportion of the number of zinc atoms is higher than the proportion of the number of element M atoms. For example, a metal oxide having any of the following atomic ratios of metal elements can be used for the semiconductor layer 408: In:M:Zn=2:1:3, In:M:Zn=3:1:2, In:M:Zn=4:2:3, In:M:Zn=4:2:4.1, In:M:Zn=5:1:3, InM:Zn=5:1:6, In:M:Zn=5:1:7, In:M:Zn=5:1:8, In:M:Zn=6:1:6, In:M:Zn=10:1:3, InM:Zn=10:1:6, In:M:Zn=10:1:7, In:M:Zn=10:1:8, In:M:Zn=5:2:5, In:M:Zn=10:1:10, In:M:Zn=20:1:10, In:M:Zn=40:1:10, and the neighborhood thereof.

A higher indium content percentage in the metal oxide enables the transistor to have a high on-state current. By using such a transistor as a transistor requiring a high on-state current, a circuit having excellent electrical characteristics can be formed.

As an analysis method of the composition of a metal oxide, for example, energy dispersive X-ray spectroscopy (EDX), X-ray photoelectron spectrometry (XPS), inductively coupled plasma-mass spectrometry (ICP-MS), or inductively coupled plasma-atomic emission spectrometry (ICP-AES) can be used. Alternatively, such kinds of analysis methods may be performed in combination. Note that as for an element whose content percentage is low, the actual content percentage may be different from the content percentage obtained by analysis because of the influence of the analysis accuracy. In the case where the content percentage of the element M is low, for example, the content percentage of the element M obtained by analysis may be lower than the actual content percentage.

Note that a composition in the neighborhood in this specification and the like includes the range of ±30% of an intended atomic ratio. For example, when the atomic ratio is described as In:M:Zn=4:2:3 or a composition in the neighborhood thereof, the case is included where the atomic ratio of the element M is greater than or equal to 1 and less than or equal to 3 and the atomic ratio of zinc is greater than or equal to 2 and less than or equal to 4 with the atomic ratio of indium being 4. When the atomic ratio is described as In:M:Zn=5:1:6 or a composition in the neighborhood thereof, the case is included where the atomic ratio of the element M is greater than 0.1 and less than or equal to 2 and the atomic ratio of zinc is greater than or equal to 5 and less than or equal to 7 with the atomic ratio of indium being 5. When the atomic ratio is described as In:M:Zn=1:1:1 or a composition in the neighborhood thereof, the case is included where the atomic ratio of the element M is greater than 0.1 and less than or equal to 2 and the atomic ratio of zinc is greater than 0.1 and less than or equal to 2 with the atomic ratio of indium being 1.

A sputtering method or an atomic layer deposition (ALD) method can be suitably used to form the metal oxide. Note that in the case where the metal oxide is formed by a sputtering method, the atomic ratio of a target may be different from the atomic ratio of the metal oxide. In particular, the atomic ratio of zinc in the metal oxide is lower than the atomic ratio of zinc in the target in some cases. Specifically, the atomic ratio of zinc contained in the metal oxide may be approximately 40% to 90% of the atomic ratio of zinc contained in the target.

The semiconductor layer 408 may have a stacked-layer structure including two or more metal oxide layers. The two or more metal oxide layers included in the semiconductor layer 408 may have the same composition or substantially the same compositions. Employing a stacked-layer structure of metal oxide layers having the same composition can reduce the manufacturing cost because the metal oxide layers can be formed using the same sputtering target.

The two or more metal oxide layers included in the semiconductor layer 408 may have different compositions. For example, a stacked-layer structure of a first metal oxide layer having In:M:Zn=1:3:4 [atomic ratio] or a composition in the neighborhood thereof and a second metal oxide layer having In:M:Zn=1:1:1 [atomic ratio] or a composition in the neighborhood thereof and being provided over the first metal oxide layer can be suitably employed. In particular, gallium or aluminum is preferably used as the element M. A stacked-layer structure of any one selected from indium oxide, indium gallium oxide, and IGZO and any one selected from IAZO, IAGZO, and ITZO (registered trademark) may be employed, for example.

It is preferable to use a metal oxide layer having crystallinity as the semiconductor layer 408. For example, a metal oxide layer having a CAAC (c-axis aligned crystal) structure, a polycrystalline structure, a nano-crystal (nc) structure, or the like can be used. With use of a metal oxide layer having crystallinity as the semiconductor layer 408, the density of defect states in the semiconductor layer 408 can be reduced, which enables the transistor to have high reliability.

The higher the crystallinity of the metal oxide layer used as the semiconductor layer 408 is, the lower the density of defect states in the semiconductor layer 408 can be. By contrast, the use of a metal oxide layer having low crystallinity enables a transistor to flow a large amount of current.

The semiconductor layer 408 may have a stacked-layer structure of two or more metal oxide layers having different crystallinities. For example, in a stacked-layer structure of a first metal oxide layer and a second metal oxide layer provided over the first metal oxide layer, the second metal oxide layer can include a region having higher crystallinity than the first metal oxide layer. Alternatively, the second metal oxide layer can include a region having lower crystallinity than the first metal oxide layer. The two or more metal oxide layers included in the semiconductor layer 408 may have the same composition or substantially the same compositions. Employing a stacked-layer structure of metal oxide layers having the same composition can reduce the manufacturing cost because the metal oxide layers can be formed using the same sputtering target. For example, with use of the same sputtering target and different oxygen flow rate ratios, a stacked-layer structure of two or more metal oxide layers having different crystallinities can be formed. The two or more metal oxide layers included in the semiconductor layer 408 may have different compositions.

When an oxide semiconductor is used for the semiconductor layer 408, the carrier concentration of the oxide semiconductor in a region functioning as the channel formation region is preferably lower than or equal to $1 \times 10^{18}$ cm$^{-3}$, further preferably lower than $1 \times 10^{17}$ cm$^{-3}$, still further preferably lower than $1 \times 10^{16}$ cm$^{-3}$, yet further preferably lower than $1 \times 10^{13}$ cm$^{-3}$, yet still further preferably lower than $1 \times 10^{12}$ cm$^{-3}$. Note that the lower limit of the carrier concentration of the oxide semiconductor in the region functioning as the channel formation region is not particularly limited and can be, for example, $1 \times 10^{-9}$ cm$^{-3}$.

A transistor including an oxide semiconductor (hereinafter referred to as an OS transistor) has much higher field-effect mobility than a transistor including amorphous silicon. In addition, the OS transistor has an extremely low leakage current between a source and a drain in an off state (hereinafter also referred to as off-state current), and charge accumulated in a capacitor that is connected in series with the transistor can be held for along period. Furthermore, the power consumption of the semiconductor device can be reduced with the OS transistor.

[Insulating Layer 407]

In the case where an oxide semiconductor is used for the semiconductor layer 408, an inorganic insulating material can be suitably used for the insulating layer 407 (an insulating layer 407a, an insulating layer 407b, and an insulating layer 407c). Note that the insulating layer 407 may have a stacked-layer structure of an inorganic insulating material and an organic insulating material.

As the inorganic insulating material, one or more of an oxide, an oxynitride, a nitride oxide, and a nitride can be used. For the insulating layer 407, for example, one or more of silicon oxide, silicon oxynitride, aluminum oxide, hafnium oxide, yttrium oxide, zirconium oxide, gallium oxide, tantalum oxide, magnesium oxide, lanthanum oxide, cerium oxide, neodymium oxide, silicon nitride, silicon nitride oxide, and aluminum nitride can be used.

Note that in this specification and the like, an oxynitride refers to a material that contains more oxygen than nitrogen in its composition. A nitride oxide refers to a material that contains more nitrogen than oxygen in its composition. For example, silicon oxynitride refers to a material that contains more oxygen than nitrogen in its composition, and silicon nitride oxide refers to a material that contains more nitrogen than oxygen in its composition.

It is preferable to use an oxide or an oxynitride for the insulating layer 407b. A film from which oxygen is released by heating is preferably used as the insulating layer 407b. For example, silicon oxide or silicon oxynitride can be suitably used for the insulating layer 407b.

When oxygen is released from the insulating layer 407b, oxygen can be supplied from the insulating layer 407b to the semiconductor layer 408. Supplying oxygen from the insulating layer 407b to the semiconductor layer 408, particularly to the channel formation region in the semiconductor layer 408, can reduce the amount of oxygen vacancy ($V_O$) and $V_O H$ (defect in which hydrogen enters oxygen vacancy) in the semiconductor layer 408, so that a highly reliable transistor having favorable electrical characteristics can be obtained. The insulating layer 407b preferably has a high oxygen diffusion coefficient. When the insulating layer 407b has a high oxygen diffusion coefficient, oxygen is easily diffused in the insulating layer 407b, so that oxygen can be efficiently supplied from the insulating layer 407b to the semiconductor layer 408. Examples of treatment for supplying oxygen to the semiconductor layer 408 include heat treatment in an oxygen-containing atmosphere and plasma treatment in an oxygen-containing atmosphere.

It is preferable that the amount of oxygen vacancy ($V_O$) and $V_O H$ be small in the channel formation region of the transistor 100T. Particularly in the case where the channel length L100 is short, oxygen vacancy ($V_O$) and $V_O H$ in the channel formation region greatly affect electrical characteristics and reliability. For example, diffusion of $V_O H$ from the source region or the drain region into the channel formation region increases the carrier concentration in the channel formation region, which might cause a change in the threshold voltage or a reduction in the reliability in the transistor 100T. As the channel length L100 of the transistor 100T is shorter, such diffusion of $V_O H$ greatly affects electrical characteristics and reliability. Supplying oxygen from the insulating layer 407b to the semiconductor layer 408, particularly to the channel formation region in the semiconductor layer 408, can reduce the amount of oxygen vacancy ($V_O$) and $V_O H$. Thus, the transistor with a short channel length can have favorable electrical characteristics and high reliability.

The insulating layer 407a and the insulating layer 407c are preferably less likely to transmit oxygen. The insulating layer 407a and the insulating layer 407c function as blocking films that inhibit release of oxygen from the insulating layer 407b. Moreover, the insulating layer 407a and the insulating layer 407c are preferably less likely to transmit hydrogen. The insulating layer 407a and the insulating layer 407c function as blocking films that inhibit diffusion of hydrogen into the semiconductor layer 408 from the outside of the transistor through the insulating layer 407. The insulating layer 407a and the insulating layer 407c preferably have high film densities. The insulating layer 407a and the insulating layer 407c having high film densities can have a high blocking property against oxygen and hydrogen. The film densities of the insulating layer 407a and the insulating layer 407c are preferably higher than the film density of the insulating layer 407b. In the case where silicon oxide or silicon oxynitride is used for the insulating layer 407b, silicon nitride, silicon nitride oxide, or aluminum oxide can be suitably used for each of the insulating layer 407a and the insulating layer 407c, for example. The insulating layer 407a and the insulating layer 407c each preferably include a region containing more nitrogen than the insulating layer 407b. A material containing more nitrogen than the insulating layer 407b can be used for each of the insulating layer 407a and the insulating layer 407c. A nitride or a nitride oxide is preferably used for each of the insulating layer 407a and the insulating layer 407c. For example, silicon nitride or silicon nitride oxide can be suitably used for each of the insulating layer 407a and the insulating layer 407c.

When oxygen contained in the insulating layer 407b is diffused upward from a region of the insulating layer 407b that is not in contact with the semiconductor layer 408 (e.g., a top surface of the insulating layer 407b), the amount of oxygen supplied from the insulating layer 407b to the semiconductor layer 408 might be reduced. Provision of the insulating layer 407c over the insulating layer 407b can inhibit diffusion of oxygen contained in the insulating layer 407b from the region of the insulating layer 407 that is not in contact with the semiconductor layer 408. Similarly, provision of the insulating layer 407a under the insulating layer 407b can inhibit downward diffusion of oxygen from the region of the insulating layer 407 that is not in contact with the semiconductor layer 408. Accordingly, the amount of oxygen supplied from the insulating layer 407b to the semiconductor layer 408 is increased, whereby the amount of oxygen vacancy ($V_O$) and $V_O H$ in the semiconductor layer 408 can be reduced. Consequently, the transistor can have favorable electrical characteristics and high reliability.

The conductive layer 412a and the conductive layer 412b are oxidized by oxygen contained in the insulating layer 407b and have high resistance in some cases. Moreover, when the conductive layer 412a and the conductive layer 412b are oxidized by oxygen contained in the insulating layer 407b, the amount of oxygen supplied from the insulating layer 407b to the semiconductor layer 408 might be reduced. Provision of the insulating layer 407a between the insulating layer 407b and the conductive layer 412a can inhibit the conductive layer 412a from being oxidized and having high resistance. Similarly, provision of the insulating layer 407c between the insulating layer 407b and the conductive layer 412b can inhibit the conductive layer 412b from being oxidized and having high resistance. In addition, the amount of oxygen supplied from the insulating layer 407b to the semiconductor layer 408 is increased and the amount of oxygen vacancy ($V_O$) and $V_O H$ in the semiconductor layer 408 can be reduced, whereby the transistor can have favorable electric characteristics and high reliability.

Hydrogen diffused in the semiconductor layer 408 reacts with an oxygen atom contained in an oxide semiconductor to be water, and thus sometimes forms oxygen vacancy ($V_O$). Furthermore, $V_O H$ is formed and the carrier concentration is increased in some cases. Provision of the insulating layer 407a and the insulating layer 407c can reduce the amount of oxygen vacancy ($V_O$) and $V_O H$ in the semiconductor layer 408, whereby the transistor can have favorable electric characteristics and high reliability.

The insulating layer 407a and the insulating layer 407c preferably have thicknesses with which the insulating layers function as blocking films against oxygen and hydrogen. When the insulating layer 407a and the insulating layer 407c are thin, the function of a blocking film might deteriorate. Meanwhile, when the insulating layer 407a and the insulating layer 407c are thick, a region where the semiconductor layer 408 is in contact with the insulating layer 407b is narrowed and the amount of oxygen supplied from the insulating layer 407b to the semiconductor layer 408 might be reduced. The insulating layer 407a and the insulating layer 407c may each be thinner than the insulating layer 407b.

In the transistor 100T, oxygen is supplied from the insulating layer 407 to the semiconductor layer 408, whereby the amount of oxygen vacancy ($V_O$) and $V_O H$ in the channel formation region is reduced. Consequently, the transistor can have favorable electrical characteristics and high reliability.

Note that one or both of the insulating layer 407a and the insulating layer 407c are not necessarily provided.

[Conductive Layer 412a, Conductive Layer 412b, Conductive Layer 404e, and Conductive Layer 415]

The conductive layer 412a, the conductive layer 412b, the conductive layer 404e, and the conductive layer 415 functioning as a source electrode, a drain electrode, and a gate electrode can each be formed using one or more of chromium, copper, aluminum, gold, silver, zinc, tantalum, titanium, tungsten, manganese, nickel, iron, cobalt, molybdenum, and niobium; or an alloy including one or more of these metals as its components. For each of the conductive layer 412a, the conductive layer 412b, the conductive layer 404e, and the conductive layer 415, a conductive material with low resistance that contains one or more of copper, silver, gold, and aluminum can be suitably used. Copper or aluminum is particularly preferable because of its high mass-productivity.

As the conductive layer 412a, the conductive layer 412b, the conductive layer 404e, and the conductive layer 415, metal oxide films (also referred to as oxide conductors) can be used. Examples of the oxide conductor (OC) include In—Sn oxide (ITO), In—W oxide, In—W—Zn oxide, In—Ti oxide, In—Ti—Sn oxide, In—Zn oxide, In—Sn—Si oxide (ITSO), and In—Ga—Zn oxide.

Here, an oxide conductor (OC) is described. For example, when oxygen vacancy is formed in a metal oxide having semiconductor characteristics and hydrogen is added to the oxygen vacancy, a donor level is formed in the vicinity of the conduction band. As a result, the conductivity of the metal oxide is increased, so that the metal oxide becomes a conductor. The metal oxide having become a conductor can be referred to as an oxide conductor.

Each of the conductive layer 412a, the conductive layer 412b, the conductive layer 404e, and the conductive layer 415 may have a stacked-layer structure of a conductive film containing the oxide conductor (the metal oxide) and a conductive film containing a metal or an alloy. The use of the conductive film containing a metal or an alloy can reduce the wiring resistance.

A Cu—X alloy film (X is Mn, Ni, Cr, Fe, Co, Mo, Ta, or Ti) may be used for each of the conductive layer 412a, the conductive layer 412b, the conductive layer 404e, and the conductive layer 415. The use of a Cu—X alloy film enables the manufacturing cost to be reduced because a wet etching method can be used in the processing.

Note that the conductive layer 412a, the conductive layer 412b, the conductive layer 404e, and the conductive layer 415 may be formed using the same material or different materials.

Here, the conductive layer 412a and the conductive layer 412b will be described in detail with use of a structure in which a metal oxide is used for the semiconductor layer 408 as an example.

When an oxide semiconductor is used for the semiconductor layer 408, the conductive layer 412a and the conductive layer 412b are oxidized by oxygen contained in the semiconductor layer 408 and have high resistance in some cases. The conductive layer 412a and the conductive layer 412b are oxidized by oxygen contained in the insulating layer 407b and have high resistance in some cases. Moreover, when the conductive layer 412a and the conductive layer 412b are oxidized by oxygen contained in the semiconductor layer 408, the amount of oxygen vacancy ($V_O$) in the semiconductor layer 408 is increased in some cases. When the conductive layer 412a and the conductive layer 412b are oxidized by oxygen contained in the insulating layer 407b, the amount of oxygen supplied from the insulating layer 407b to the semiconductor layer 408 might be reduced.

A material that is less likely to be oxidized is preferably used for each of the conductive layer 412a and the conductive layer 412b. An oxide conductor is preferably used for each of the conductive layer 412a and the conductive layer 412b. For example, In—Sn oxide (ITO) or In—Sn—Si oxide (ITSO) can be suitably used. A nitride conductor may be used for the conductive layer 412a. Examples of the nitride conductor include tantalum nitride and titanium nitride. The conductive layer 412a may have a stacked-layer structure of the above-described materials.

The conductive layer 412a and the conductive layer 412b each containing a material that is less likely to be oxidized can be inhibited from being oxidized by oxygen contained in the semiconductor layer 408 or oxygen contained in the insulating layer 407b and having high resistance. Furthermore, it is possible to increase the amount of oxygen supplied from the insulating layer 407b to the semiconductor layer 408 while an increase in the amount of oxygen vacancy ($V_O$) in the semiconductor layer 408 is inhibited. Accordingly, the amount of oxygen vacancy ($V_O$) and $V_OH$ in the semiconductor layer 408 can be reduced, whereby the transistor can have favorable electric characteristics and high reliability.

Similarly, the conductive layer 412b containing a material that is less likely to be oxidized can be inhibited from having high resistance. Note that the conductive layer 412a and the conductive layer 412b may be formed using the same material or different materials.

The conductive layer 412b has a region in contact with the transistor 100T. When a material that is less likely to be oxidized is used for the conductive layer 412b, the amount of oxygen vacancy ($V_O$) and $V_OH$ in the semiconductor layer 408 can be reduced.

As described above, a material that is less likely to be oxidized is preferably used for each of the conductive layer 412a and the conductive layer 412b in contact with the semiconductor layer 408. However, the use of a material that is less likely to be oxidized might increase resistance. The conductive layer 412a and the conductive layer 412b function as wirings and thus preferably have low resistance. In view of this, a material that is less likely to be oxidized is used for the conductive layer 412a_1 including a region in contact with the semiconductor layer 408, and a material with low resistance is used for the conductive layer 412a_2 not including a region in contact with the semiconductor layer 408, whereby the resistance of the conductive layer 412a can be reduced. Furthermore, the amount of oxygen vacancy ($V_O$) and $V_OH$ in the semiconductor layer 408 can be reduced, whereby the transistor can have favorable electric characteristics and high reliability.

In particular, in the case where the channel length L100 is short, oxygen vacancy ($V_O$) and $V_OH$ in the channel formation region greatly affect electrical characteristics and reliability, as described above. When a material that is less likely to be oxidized is used for the conductive layer 412a_1, an increase in the amount of oxygen vacancy ($V_O$) and $V_OH$ in the semiconductor layer 408 can be inhibited. Thus, the transistor with a short channel length can have favorable electrical characteristics and high reliability.

One or more of an oxide conductor and a nitride conductor can be suitably used for the conductive layer 412a_1. For the conductive layer 412a_2, a material having lower resistance than the conductive layer 412a_1 is preferably used. For the conductive layer 412a_2, one or more of copper, aluminum, titanium, tungsten, and molybdenum or an alloy containing one or more of these metals as its components can be suitably used, for example. Specifically, In—Sn—Si oxide (ITSO) and tungsten can be suitably used for the conductive layer 412a_1 and the conductive layer 412a_2, respectively.

Note that the structure of the conductive layer 412a is determined in accordance with wiring resistance required for the conductive layer 412a. For example, when the wiring (the conductive layer 412a) is short and requires relatively high wiring resistance, the conductive layer 412a may have a single-layer structure using a material that is less likely to be oxidized. Meanwhile, when the wiring (the conductive layer 412a) is long and requires relatively low wiring resistance, the conductive layer 412a preferably has a stacked-layer structure using a material that is less likely to be oxidized and a material with low resistance.

The structure of the conductive layer 412a can be applied to another conductive layer.

[Insulating Layer 406]

The insulating layer 406 functioning as the gate insulating layer preferably has low defect density. With the insulating layer 406 having low defect density, the transistor can have favorable electrical characteristics. In addition, the insulating layer 406 preferably has high withstand voltage. With the insulating layer 406 having high withstand voltage, the transistor can have high reliability.

For the insulating layer 406, one or more of an insulating oxide, an insulating oxynitride, an insulating nitride oxide, and an insulating nitride can be used, for example. For the insulating layer 406, one or more of silicon oxide, silicon oxynitride, silicon nitride oxide, silicon nitride, aluminum oxide, aluminum oxynitride, aluminum nitride oxide, aluminum nitride, hafnium oxide, hafnium oxynitride, gallium oxide, gallium oxynitride, yttrium oxide, yttrium oxynitride, and Ga—Zn oxide can be used. The insulating layer 406 may be either a single layer or a stacked layer. The insulating layer 406 may have a stacked-layer structure of an oxide and a nitride, for example.

A transistor having a minute size and including a thin gate insulating layer may have a high leakage current. When a high dielectric constant material (also referred to as a high-k material) is used for the gate insulating layer, the voltage at the time of operation of the transistor can be reduced while the physical thickness is maintained. Examples of the high-k material include gallium oxide, hafnium oxide, zirconium oxide, an oxide containing aluminum and hafnium, an oxynitride containing aluminum and hafnium, an oxide containing silicon and hafnium, an oxynitride containing silicon and hafnium, and a nitride containing silicon and hafnium.

The amount of impurities (e.g., water and hydrogen) released from the insulating layer 406 itself is preferably small. With the insulating layer 406 from which a small amount of impurities is released, diffusion of impurities into the semiconductor layer 408 is inhibited, and the transistor can have favorable electrical characteristics and high reliability.

Here, the insulating layer 406 will be described in detail with use of a structure with use of a structure in which a metal oxide is used for the semiconductor layer 408 as an example.

To improve the properties of the interface with the semiconductor layer 408, at least the side of a region in the insulating layer 406, which is in contact with the semiconductor layer 408, preferably includes an oxide. For example, one or more of silicon oxide and silicon oxynitride can be suitably used for the insulating layer 406. A film from which oxygen is released by heating is further preferably used for the insulating layer 406.

Note that the insulating layer 406 may have a stacked-layer structure. The insulating layer 406 can have a stacked-layer structure of an oxide film on the side in contact with the semiconductor layer 408 and a nitride film on the side in contact with the conductive layer 404e. For example, one or more of silicon oxide and silicon oxynitride can be suitably used for the oxide film. Silicon nitride can be suitably used for the nitride film.

[Substrate 402]

Although there is no great limitation on a material of the substrate 402, it is necessary that the substrate have heat resistance high enough to withstand at least heat treatment performed later. For example, a single crystal semiconductor substrate or a polycrystalline semiconductor substrate of silicon or silicon carbide, a compound semiconductor substrate of silicon germanium or the like, an SOI substrate, a glass substrate, a quartz substrate, a sapphire substrate, a ceramic substrate, or an organic resin substrate may be used as the substrate 402. Alternatively, any of these substrates over which a semiconductor element is provided may be used as the substrate 402. Note that the shape of the semiconductor substrate and an insulating substrate may be a circular shape or a shape with corners.

A flexible substrate may be used as the substrate 402, and the transistor 100T and the like may be formed directly on the flexible substrate. Alternatively, a separation layer may be provided between the substrate 402 and the transistor 100T and the like. The separation layer can be used when part or the whole of a semiconductor device completed thereover is separated from the substrate 402 and transferred onto another substrate. In such a case, the transistor 100T and the like can be transferred to a substrate having low heat resistance or a flexible substrate as well.

The above is the description of the components of the transistor 100T.

At least part of this embodiment can be implemented in combination with any of the other embodiments described in this specification, as appropriate.

Embodiment 3

In this embodiment, display devices of one embodiment of the present invention will be described.

FIG. 10 is a cross-sectional view of the display device 100 that is one embodiment of the present invention.

FIG. 10 illustrates an example of cross sections of part of a region including the FPC 118, part of a region including the driver circuit 112, part of a region including the driver circuit 113, part of a region including the display portion 111, part of a region including the driver circuit 114, and part of a region including the FPC 119 in the display device 100 illustrated in FIG. 1.

Figures 10A, 10B, 10C:
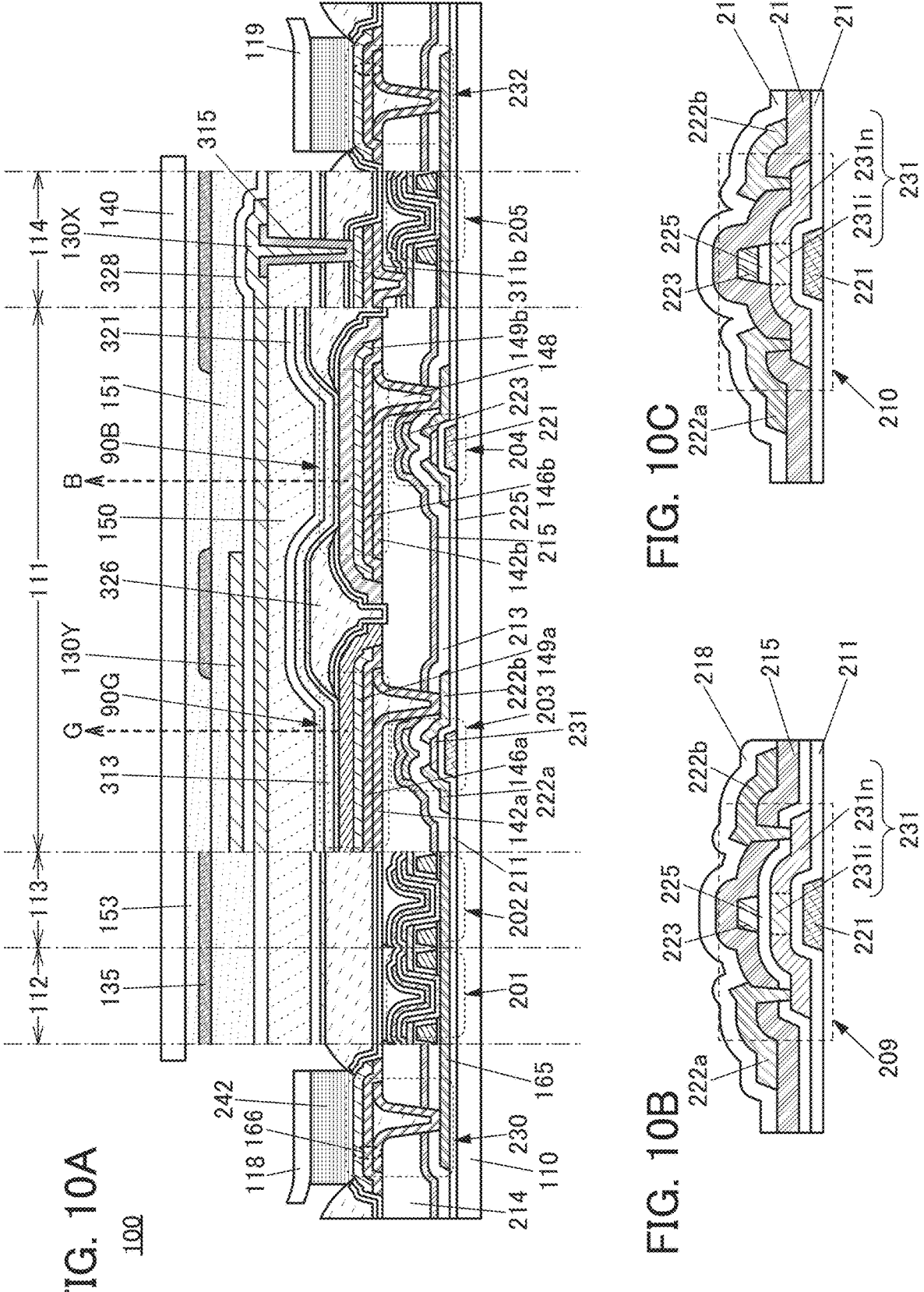
FIG. 10A is a diagram illustrating a structure example of a display device.
FIG. 10B and FIG. 10C are diagrams each illustrating a transistor.

The display device 100 illustrated in FIG. 10A includes a transistor 201, a transistor 202, a transistor 203, a transistor 204, a transistor 205, the light-emitting device 90G that emits green light, the light-emitting device 90B that emits blue light, the sensor electrode 130X, the sensor electrode 130Y, and the like between the substrate 110 and the substrate 140.

The light-emitting device 90G includes a conductive layer 142a, a conductive layer 146a over the conductive layer 142a, and a conductive layer 149a over the conductive layer 146a. All of the conductive layers 142a, 146a, and 149a can be referred to as pixel electrodes, or one or two of them can be referred to as pixel electrodes.

The light-emitting device 90G includes a conductive layer 142b, a conductive layer 146b over the conductive layer 142b, and a conductive layer 149b over the conductive layer 146b.

The conductive layer 142a is connected to a conductive layer 222b included in the transistor 203 through an opening provided in an insulating layer 214. An end portion of the conductive layer 146a is positioned outward from an end portion of the conductive layer 142a. The end portion of the conductive layer 146a and an end portion of the conductive layer 149a are aligned or substantially aligned with each other. For example, a conductive layer functioning as a reflective electrode can be used as the conductive layer 142a and the conductive layer 146a, and a conductive layer functioning as a transparent electrode can be used as the conductive layer 149a.

Detailed description of the conductive layers 142b, 146b, and 149b in the light-emitting device 90B is omitted because these conductive layers are similar to the conductive layers 142a, 146a, and 149a in the light-emitting device 90G.

The conductive layers 142a and 142b each have a depressed portion covering the opening provided in the insulating layer 214. A layer 148 is embedded in each of the depressed portions.

The layer 148 has a planarization function for the depressed portions of the conductive layers 142a and 142b. The conductive layers 146a and 146b electrically connected to the conductive layers 142a and 142b, respectively, are provided over the conductive layers 142a and 142b and the layer 148. Thus, regions overlapping with the depressed portions of the conductive layers 142a and 142b can also be used as the light-emitting regions or the light-receiving regions, increasing the aperture ratio of the pixels.

The layer 148 may be an insulating layer or a conductive layer. Any of a variety of inorganic insulating materials, organic insulating materials, and conductive materials can be used for the layer 148 as appropriate. Specifically, the layer 148 is preferably formed using an insulating material and is particularly preferably formed using an organic insulating material. For the layer 148, an organic insulating material that can be used for the resin layer 326 can be used, for example.

A protective layer 321 is provided over the light-emitting devices 90G and 90B. A solid sealing layer 150 protecting the light-emitting devices is provided over the protective layer 321.

The display device 100 has a top-emission structure. Light emitted by the light-emitting device is emitted toward the substrate 140 side. For the substrate 140, a material having a high visible-light-transmitting property is preferably used. The pixel electrode contains a material that reflects visible light, and a counter electrode (a common electrode 313) contains a material that transmits visible light.

The transistor 201 to the transistor 205 are formed over the substrate 110. The transistor 203 and the transistor 204 can be manufactured using the same material in the same step. The transistor 201, the transistor 202, and the transistor 205 can be manufactured using the same material in the same step.

Figure 11:
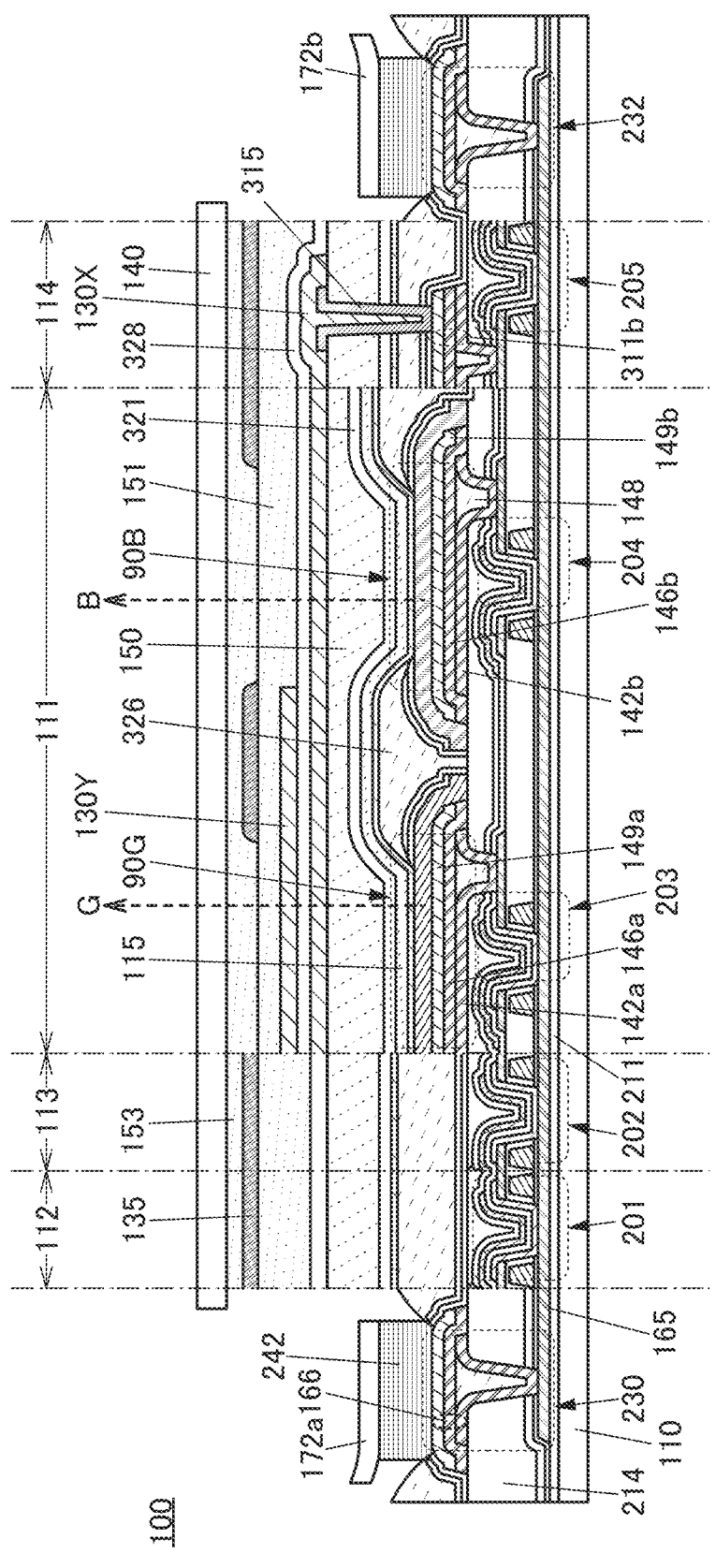
FIG. 11 is a diagram illustrating a structure example of a display device.

A vertical transistor can be used as each of the transistor 201, the transistor 202, and the transistor 205. Embodiment 2 can be referred to for the details of the vertical transistor. Note that as illustrated in FIG. 11, a vertical transistor may also be used as each of the transistor 203 and the transistor 204 included in the display portion 111.

An insulating layer 211, an insulating layer 213, an insulating layer 215, and the insulating layer 214 are provided in this order over the substrate 110. Part of the insulating layer 211 functions as a gate insulating layer of each transistor. Part of the insulating layer 213 functions as a gate insulating layer of each transistor. The insulating layer 215 is provided to cover the transistors. The insulating layer 214 is provided to cover the transistors and has a function of a planarization layer. Note that the number of gate insulating layers and the number of insulating layers covering the transistors are not limited and may each be one or two or more.

A material in which impurities such as water and hydrogen do not easily diffuse is preferably used for at least one of the insulating layers covering the transistors. In that case, the insulating layer can function as a barrier layer. Such a structure can effectively inhibit diffusion of impurities into the transistors from the outside and increase the reliability of the display device.

An inorganic insulating film is preferably used as each of the insulating layer 211, the insulating layer 213, and the insulating layer 215. As the inorganic insulating film, a silicon nitride film, a silicon oxynitride film, a silicon oxide film, a silicon nitride oxide film, an aluminum oxide film, or an aluminum nitride film can be used, for example. A hafnium oxide film, an yttrium oxide film, a zirconium oxide film, a gallium oxide film, a tantalum oxide film, a magnesium oxide film, a lanthanum oxide film, a cerium oxide film, a neodymium oxide film, or the like may be used. A stack including two or more of the above insulating films may also be used.

An organic insulating layer is suitable as the insulating layer 214 functioning as a planarization layer. Examples of materials that can be used for the organic insulating layer include an acrylic resin, a polyimide resin, an epoxy resin, a polyamide resin, a polyimide-amide resin, a siloxane resin, a benzocyclobutene-based resin, a phenol resin, and precursors of these resins. The insulating layer 214 may have a stacked-layer structure of an organic insulating layer and an inorganic insulating layer. The outermost layer of the insulating layer 214 preferably has a function of an etching protective layer. In that case, a depressed portion can be inhibited from being formed in the insulating layer 214 at the time of processing the conductive layer 142a, the conductive layer 146a, the conductive layer 149a, or the like. Alternatively, a depressed portion may be formed in the insulating layer 214 at the time of processing the conductive layer 142a, the conductive layer 146a, the conductive layer 149a, or the like.

Each of the transistor 202 and the transistor 203 includes a conductive layer 221 functioning as a gate, the insulating layer 211 functioning as a gate insulating layer, a conductive layer 222a and the conductive layer 222b functioning as a source and a drain, a semiconductor layer 231, the insulating layer 213 functioning as a gate insulating layer, and a conductive layer 223 functioning as a gate. Here, a plurality of layers obtained by processing the same conductive film are shown with the same hatching pattern. The insulating layer 211 is positioned between the conductive layer 221 and the semiconductor layer 231. The insulating layer 213 is positioned between the conductive layer 223 and the semiconductor layer 231.

There is no particular limitation on the structure of the transistors included in the display device of this embodiment. For example, a vertical transistor, a planar transistor, a fin-type transistor, a staggered transistor, an inverted staggered transistor, or the like can be used. A top-gate transistor structure or a bottom-gate transistor structure may be employed. Alternatively, gates may be provided above and/or below the semiconductor layer where a channel is formed.

The structure where the semiconductor layer where a channel is formed is held between two gates is used for the transistor 202 and the transistor 203. The two gates may be connected to each other and supplied with the same signal to drive the transistor. Alternatively, a transistor may be driven by a potential for threshold voltage control supplied to one of the two gates and a potential for driving supplied to the other.

There is no particular limitation on the crystallinity of a semiconductor material used for the transistors, and any of an amorphous semiconductor, a single crystal semiconductor, and a semiconductor having crystallinity other than single crystal (a microcrystalline semiconductor, a polycrystalline semiconductor, or a semiconductor partly including crystal regions) may be used. A single crystal semiconductor or a semiconductor having crystallinity is preferably used because degradation of the transistor characteristics can be inhibited.

The semiconductor layer of the transistor preferably includes a metal oxide (also referred to as an oxide semiconductor). That is, an OS transistor including a metal oxide in its channel formation region is preferably used for the display device of this embodiment. For the metal oxide that can be used for the OS transistor, the description in Embodiment 2 can be referred to.

All the transistors included in the display device 100 can be OS transistors. Alternatively, all the transistors included in the display device 100 can be Si transistors. Alternatively, some of the transistors included in the display device 100 may be OS transistors and the rest may be Si transistors.

Alternatively, an OS transistor may be provided over a Si transistor. Alternatively, the OS transistor may be stacked.

As examples of silicon, single crystal silicon, polycrystalline silicon, amorphous silicon, and the like can be given. In particular, a transistor containing low-temperature polysilicon (LTPS) in its semiconductor layer (hereinafter also referred to as an LTPS transistor) can be used. The LTPS transistor has high field-effect mobility and favorable frequency characteristics.

With the use of Si transistors such as LTPS transistors, a circuit required to be driven at a high frequency (e.g., a source driver) can be formed on the same substrate as a display portion. Thus, external circuits mounted on the display device can be simplified, and parts costs and mounting costs can be reduced.

For example, when both an LTPS transistor and an OS transistor are used in the display portion 111, the display device can have low power consumption and high driving capability. Note that a structure where an LTPS transistor and an OS transistor are used in combination is referred to as LTPO in some cases. Note that as a further suitable example, a structure can be given where an OS transistor is used as, for example, a transistor functioning as a switch for controlling conduction and non-conduction between wirings and an LTPS transistor is used as, for example, a transistor for controlling current.

For example, one of the transistors included in the display portion 111 functions as a transistor for controlling current flowing through the light-emitting device and can be referred to as a driving transistor. One of a source and a drain of the driving transistor is electrically connected to the pixel electrode of the light-emitting device. An LTPS transistor is preferably used as the driving transistor. In that case, the amount of current flowing through the light-emitting device can be increased in the pixel circuit.

Another transistor included in the display portion 111 functions as a switch for controlling selection and nonselection of the pixel and can be referred to as a selection transistor. A gate of the selection transistor is electrically connected to a gate line, and one of a source and a drain thereof is electrically connected to a source line (signal line). An OS transistor is preferably used as the selection transistor. In that case, the gray level of the pixel can be maintained even with an extremely low frame frequency (e.g., lower than or equal to 1 fps); thus, power consumption can be reduced by stopping the driver in displaying a still image.

As described above, the display device of one embodiment of the present invention can have all of a high aperture ratio, high resolution, high display quality, and low power consumption.

Note that the display device of one embodiment of the present invention has a structure including the OS transistor and the light-emitting device having an MML (metal mask-less) structure. With this structure, the leakage current that might flow through the transistor and the leakage current that might flow between adjacent light-emitting devices (also referred to as lateral leakage current, side leakage current, or the like) can be extremely low. With the structure, a viewer can notice any one or more of the image crispness, the image sharpness, a high chroma, and a high contrast ratio in an image displayed on the display device. When the leakage current that would flow through the transistor and the lateral leakage current between the light-emitting devices are extremely low, light leakage that might occur in black display (what is called black-level degradation) or the like can be minimized.

In particular, in the case where a light-emitting device having the MML structure employs the above-described SBS structure, a layer provided between light-emitting devices (for example, also referred to as an organic layer or a common layer which is commonly used between the light-emitting devices) is disconnected; accordingly, side leakage can be prevented or be made extremely low.

FIG. 10B and FIG. 10C illustrate other structure examples of the transistor that can be used as the transistor 203 and the transistor 204.

A transistor 209 and a transistor 210 each include the conductive layer 221 functioning as a gate, the insulating layer 211 functioning as a gate insulating layer, the semiconductor layer 231 including a channel formation region 231i and a pair of low-resistance regions 231n, the conductive layer 222a connected to one of the pair of low-resistance regions 231n, the conductive layer 222b connected to the other of the pair of low-resistance regions 231n, an insulating layer 225 functioning as a gate insulating layer, the conductive layer 223 functioning as a gate, and the insulating layer 215 covering the conductive layer 223. The insulating layer 211 is positioned between the conductive layer 221 and the channel formation region 231i. The insulating layer 225 is positioned at least between the conductive layer 223 and the channel formation region 231i. Furthermore, an insulating layer 218 covering the transistor may be provided.

FIG. 10B illustrates an example of the transistor 209 in which the insulating layer 225 covers the top surface and the side surface of the semiconductor layer 231. The conductive layer 222a and the conductive layer 222b are connected to the low-resistance regions 231n through openings provided in the insulating layer 225 and the insulating layer 215. One of the conductive layer 222a and the conductive layer 222b functions as a source, and the other functions as a drain.

Meanwhile, in the transistor 210 illustrated in FIG. 10C, the insulating layer 225 overlaps with the channel formation region 231i of the semiconductor layer 231 and does not overlap with the low-resistance regions 231n. The structure illustrated in FIG. 10C can be formed by processing the insulating layer 225 with the conductive layer 223 as a mask, for example. In FIG. 10C, the insulating layer 215 is provided to cover the insulating layer 225 and the conductive layer 223, and the conductive layer 222*a* and the conductive layer 222*b* are connected to the low-resistance regions 231*n* through the openings in the insulating layer 215.

A connection portion 230 is provided in a region of the substrate 110 where the substrate 140 does not overlap. In the connection portion 230, the wiring 165 is electrically connected to the FPC 118 through a conductive layer 166 and a connection layer 242. An example is described in which the conductive layer 166 has a stacked-layer structure of a conductive film obtained by processing the same conductive film as the conductive layers 142*a* and 142*b*, a conductive film obtained by processing the same conductive film as the conductive layers 146*a* and 146*b*, and a conductive film obtained by processing the same conductive film as the conductive layers 149*a* and 149*b*. The conductive layer 166 is exposed on the top surface of the connection portion 230. Thus, the connection portion 230 and the FPC 118 can be electrically connected to each other through the connection layer 242.

For the connection layer 242, an anisotropic conductive film (ACF), an anisotropic conductive paste (ACP), or the like can be used.

Note that the connection portion 232 to which the FPC 119 is electrically connected can have a structure similar to the above.

One of the sensor electrode 130X and the sensor electrode 130Y functioning as electrodes of the touch sensor is provided over the solid sealing layer 150. The other of the sensor electrode 130X and the sensor electrode 130Y is provided with an insulating layer 328 therebetween.

Note that a structure may be employed in which the sensor electrode 130X and the sensor electrode 130Y are formed over the solid sealing layer 150 and the insulating layer 328 is provided between the sensor electrode 130X and the sensor electrode 130Y at an intersection portion therebetween.

The sensor electrode 130X extends in the direction where the driver circuit 114 is provided and is electrically connected to the connection electrode 311*b* through an opening provided in the solid sealing layer 150 and the like. Although FIG. 10 illustrates the mode in which the sensor electrode 130X and the connection electrode 311*b* are connected through the metal layer 315, the sensor electrode 130X and the connection electrode 311*b* may be in direct contact with each other. Note that the connection electrode 311*b* can have a structure similar to that of the pixel electrode.

An insulating layer 151 is provided over the insulating layer 328 and the other of the sensor electrode 130X and the sensor electrode 130Y. A light-blocking layer 135 is preferably provided over the insulating layer 151. The light-blocking layer 135 can be provided to include a region overlapping with a region between the adjacent light-emitting devices, and a region overlapping with the driver circuits 112, 113, and 114.

The insulating layer 151, the light-blocking layer 135, and the substrate 140 are bonded to each other with an adhesive layer 153. A variety of optical members such as a circular polarizing plate can be provided on the outer surface of the substrate 140.

As each of the substrate 110 and the substrate 140, a substrate made of the materials that can be used for the substrate 402 described in Embodiment 2 can be used.

Alternatively, a silicon substrate where an arithmetic circuit, a memory circuit, and the like are formed can be used. Alternatively, a glass epoxy resin or the like may be used.

At least part of this embodiment can be implemented in combination with any of the other embodiments described in this specification, as appropriate.

Embodiment 4

In this embodiment, modes of a sensor electrode that is applicable to display devices of embodiments of the present invention will be described.

Figure 12A:
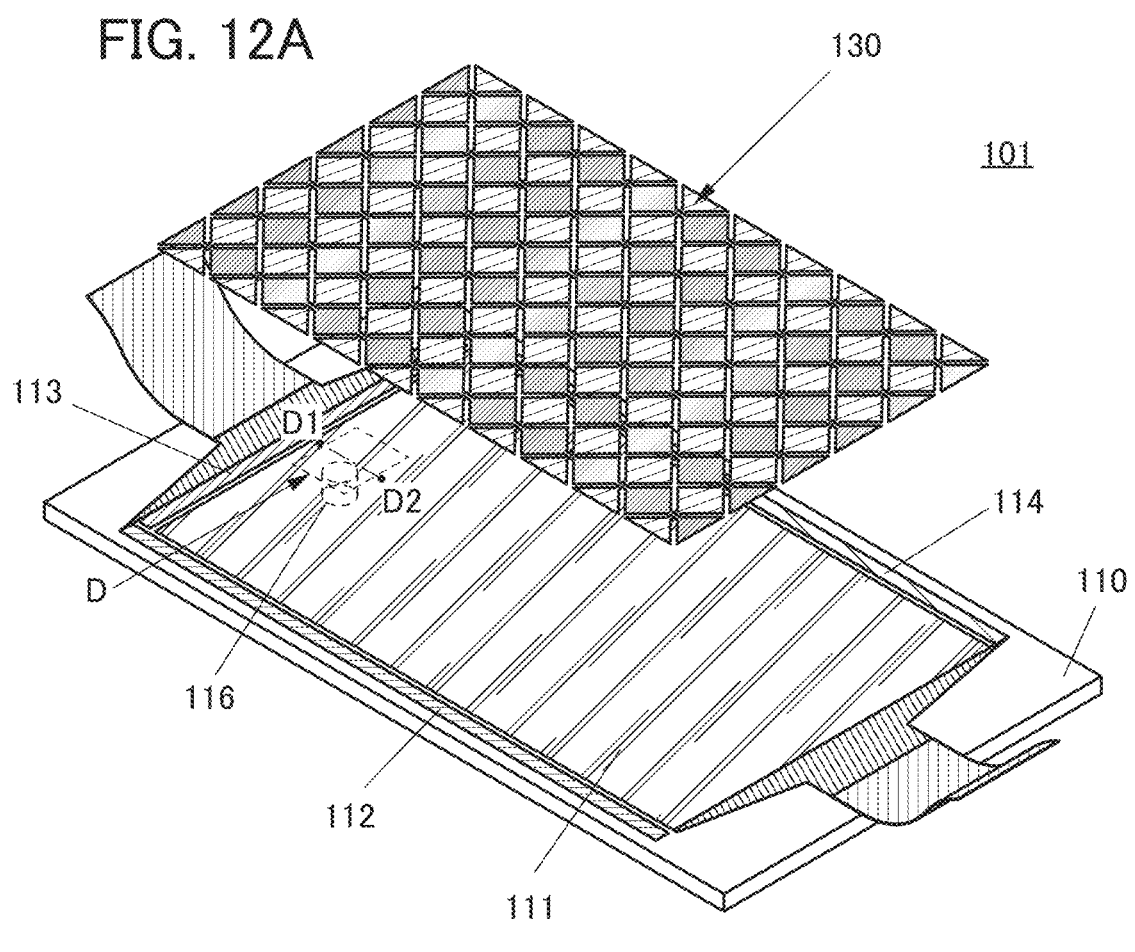
FIG. 12A to FIG. 12C are diagrams each illustrating a structure example of a display device.

FIG. 12A is a diagram illustrating a mode of a display device 101 including a camera in a region overlapping with the display portion. Note that the basic structure of the display device 101 can be similar to that of the display device 100 described in Embodiment 1 and the like, and a camera 116 is provided on the rear surface side (the surface side opposite to the display portion 111) of the substrate 110. The camera 116 is a camera mainly used for image capturing by a user and is also referred to as a front camera. FIG. 12A does not illustrate the substrate 140 that faces the substrate 110. A region where the display portion 111 and the camera 116 overlap with each other and the vicinity thereof are referred to as a region D.

Figures 12B, 12C:
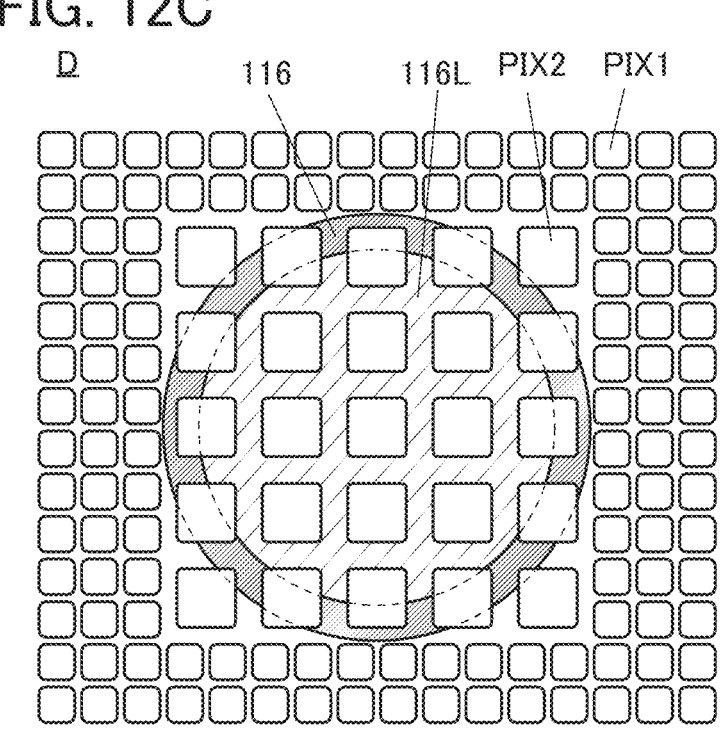

FIG. 12B is a diagram illustrating a cross section of the region D (a cross section along D1-D2 in FIG. 12A). FIG. 12C is a top view of the region D. Note that the sensor electrode 130 is not illustrated in FIG. 12C.

As illustrated in FIG. 12C, a pixel PIX1 is positioned in a region not overlapping with the camera 116, and a pixel PIX2 is positioned in a region overlapping with the camera 116 or a lens 116L included in the camera 116. Note that the pixels PIX1 and PIX2 described here may each have a function of a subpixel. In the following description, the camera 116 can be replaced with the lens 116L as appropriate.

In a region where the pixels PIX2 are placed, the pixel pitch is larger than that in a region where the pixels PIX1 are placed. In other words, the pixel density is low. The pixel PIX2 has a larger size than the pixel PIX1. In other words, the area of the light-emitting device of the pixel PIX2 is larger than that of the pixel PIX1.

With such a structure, the amount of light entering the camera 116 can be increased as compared to the case where the camera 116 overlaps with the region where the pixels PIX1 are placed; thus, a large amount of data on image capturing can be obtained. A portion that is hidden by being the shadow of the pixel PIX2 can be filled by image correction with reference to a peripheral image. Thus, image capturing is possible even when the pixel PIX2 is placed over the camera 116.

The resolution of the region where the pixels PIX2 are placed is lower than that of the region where the pixels PIX1 are placed; however, when the pixel size (the area of the light-emitting device) is increased, the luminance of the region where the pixels PIX2 can be equivalent to that of the region where the pixels PIX1 are placed. The region where the pixels PIX2 are placed is a region that is sufficiently small with respect to the entire display portion; thus, the user can see display without unnaturalness.

In this manner, the camera 116 can be placed in a region overlapping with the display portion 111, so that the area of the display portion 111 can be increased. In addition, a pinhole or a notch, which is necessary in the case where display portion 111 and the camera 116 are placed to overlap with each other, can be omitted.

Figure 13A:
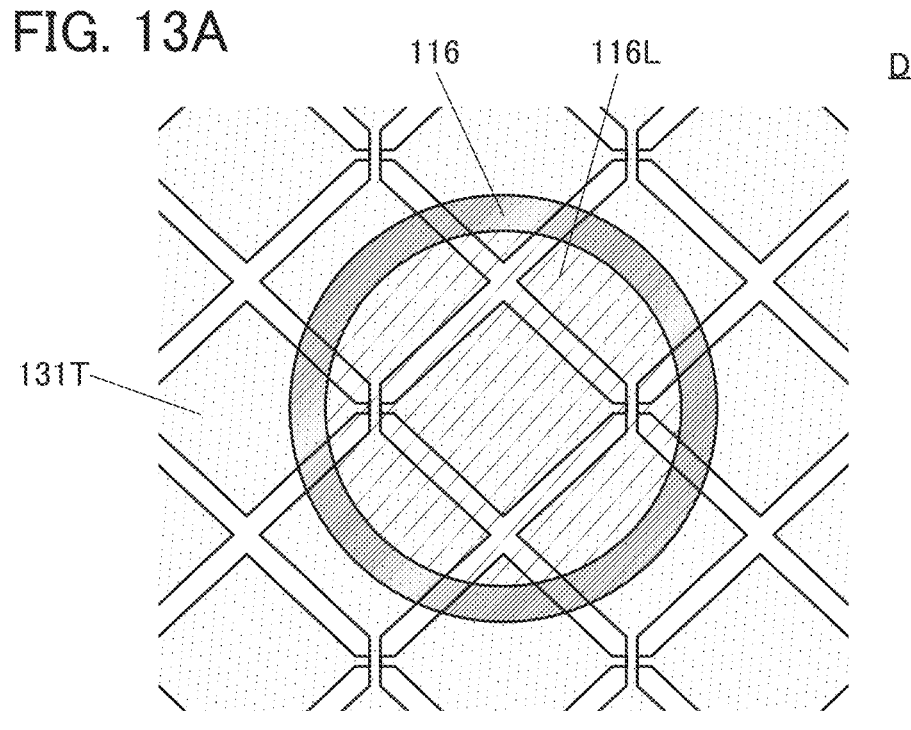
FIG. 13A and FIG. 13B are diagrams each illustrating a sensor electrode.
Figure 13B:
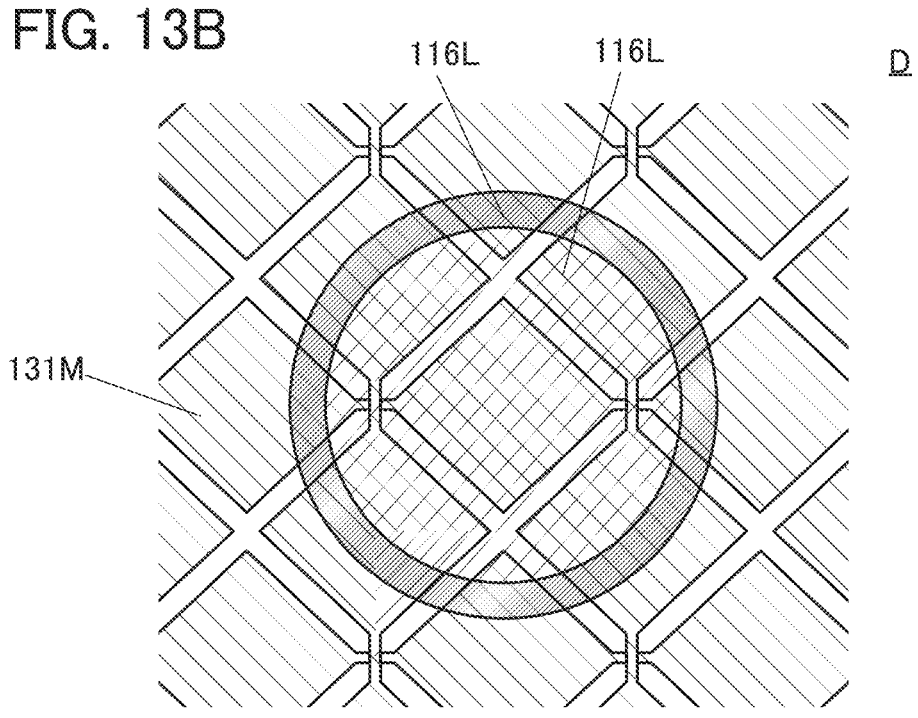

FIG. 13A and FIG. 13B are top views of the region D and illustrate the sensor electrode 130. Note that the pixels PIX1 and PIX2 are not illustrated for clarity. In the description here, a conductive layer connected in the X direction and a conductive layer connected in the Y direction in the sensor electrode 130 are not distinguished from each other.

FIG. 13A is a top view in the case where a light-transmitting conductive film 131T is used as the sensor electrode 130. The light-transmitting conductive film 131T has a sufficient light-transmitting property, and thus can be placed to overlap with the camera 116.

Figure 14A:
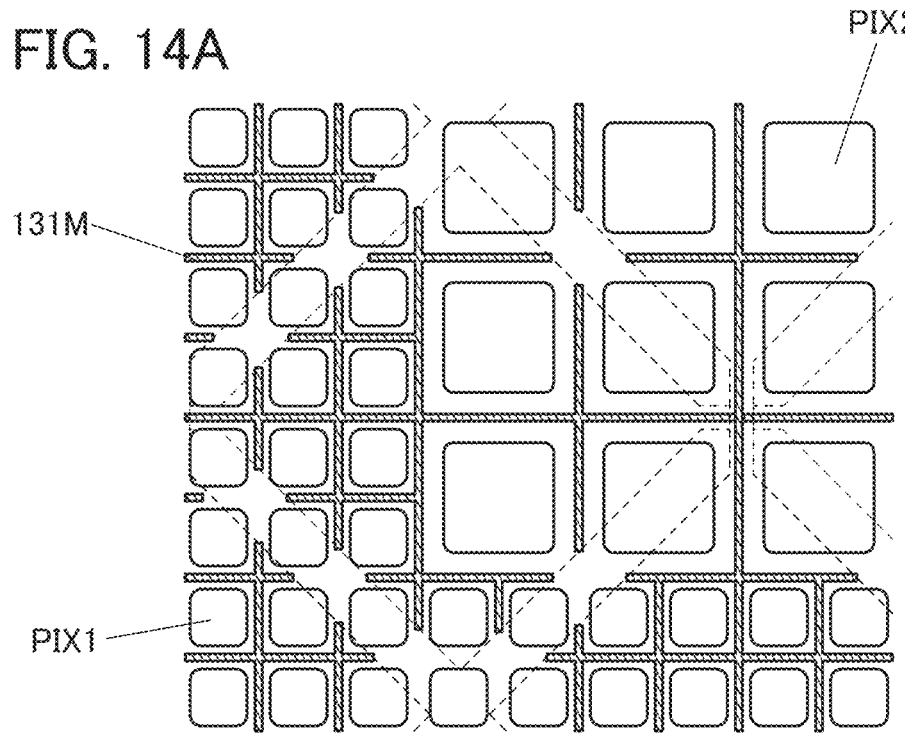
FIG. 14A and FIG. 14B are diagrams each illustrating a sensor electrode.

FIG. 13B is a top view in the case where a metal layer 131M is used as the sensor electrode 130. Since the metal layer 131M does not basically have a light-transmitting property, the metal layer 131M is positioned in a region not overlapping with the pixel PIX1 or the pixel PIX2 as illustrated in FIG. 14A. Note that in FIG. 14A, a portion corresponding to the outer shape of the sensor electrode 130 is denoted by a dashed line.

Figure 14B:
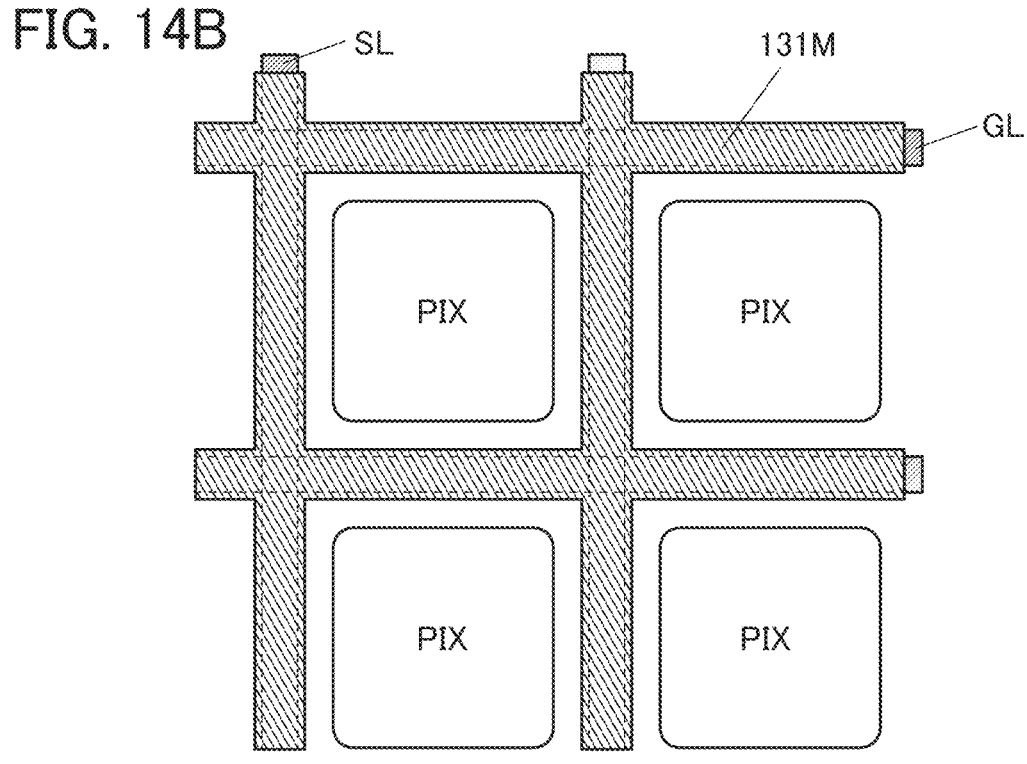

As illustrated in FIG. 14B, the metal layer 131M is preferably provided to include a region overlapping with the gate line GL and a source line SL electrically connected to the pixels PIX (the pixels PIX1 and PIX2) with an insulating layer (not illustrated) therebetween. With this structure, light from the light-emitting device can be emitted to the outside without being blocked.

Here, in the region where the pixels PIX2 are placed, the area of the metal layer 131M is preferably smaller than that of the region where the pixels PIX1 are placed. With this structure, a reduction in the amount of light entering the camera 116 can be reduced as much as possible.

Figure 15A:
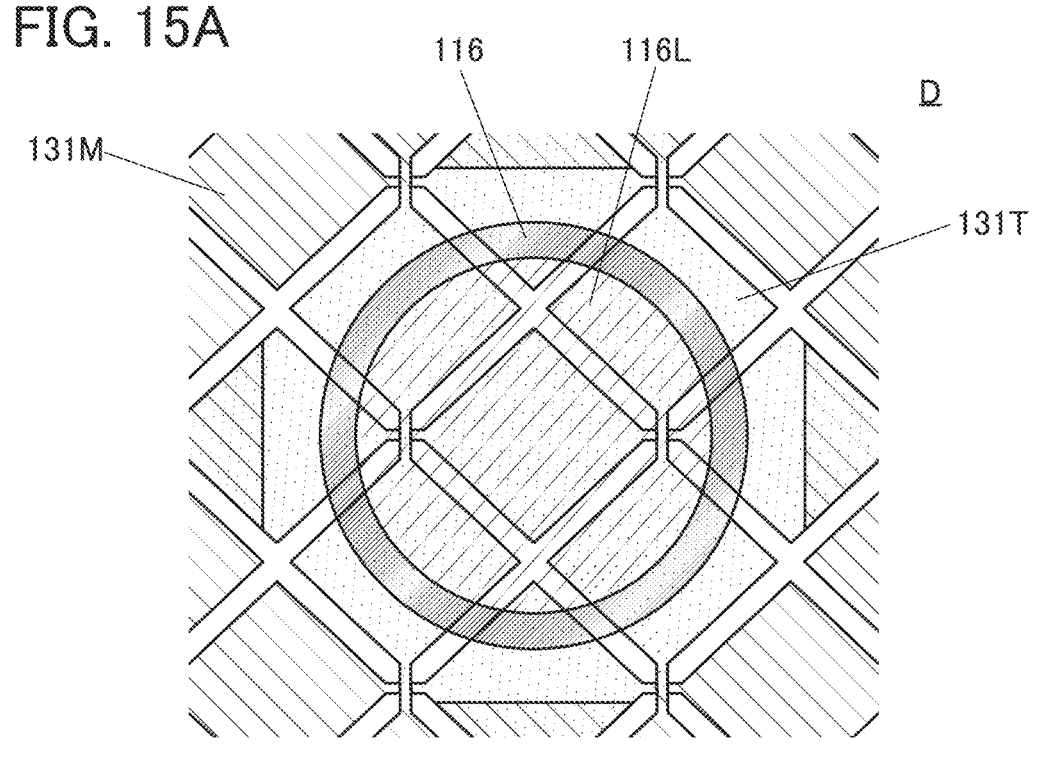
FIG. 15A and FIG. 15B are diagrams each illustrating a sensor electrode.
Figure 15B:
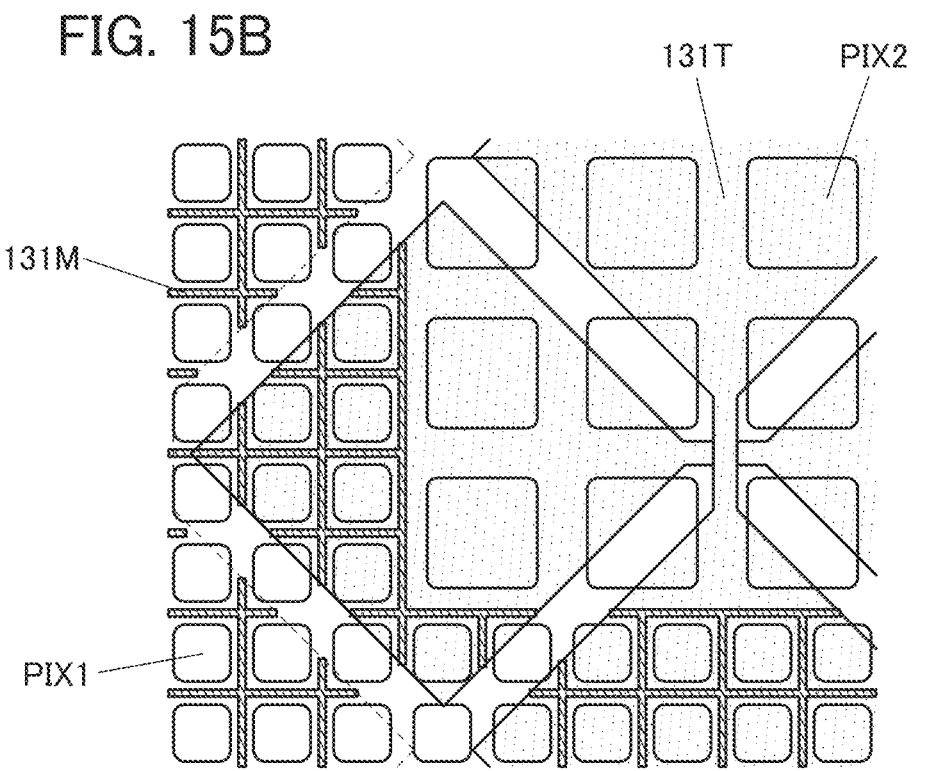

FIG. 15A is a top view in the case where the light-transmitting conductive film 131T and the metal layer 131M are used for the sensor electrode 130. As illustrated in FIG. 15B, the sensor electrode 130 is provided using the metal layer 131M in the region overlapping with the pixel PIX1, and the sensor electrode 130 is provided using the light-transmitting conductive film 131T in the region overlapping with the pixel PIX2. Note that in the vicinity of an end portion of the region where the pixels PIX2 are provided, the light-transmitting conductive film 131T and the metal layer 131M that extend in the region overlapping with the pixel PIX1 are in contact with each other, so that they can be electrically connected.

Figure 16A:
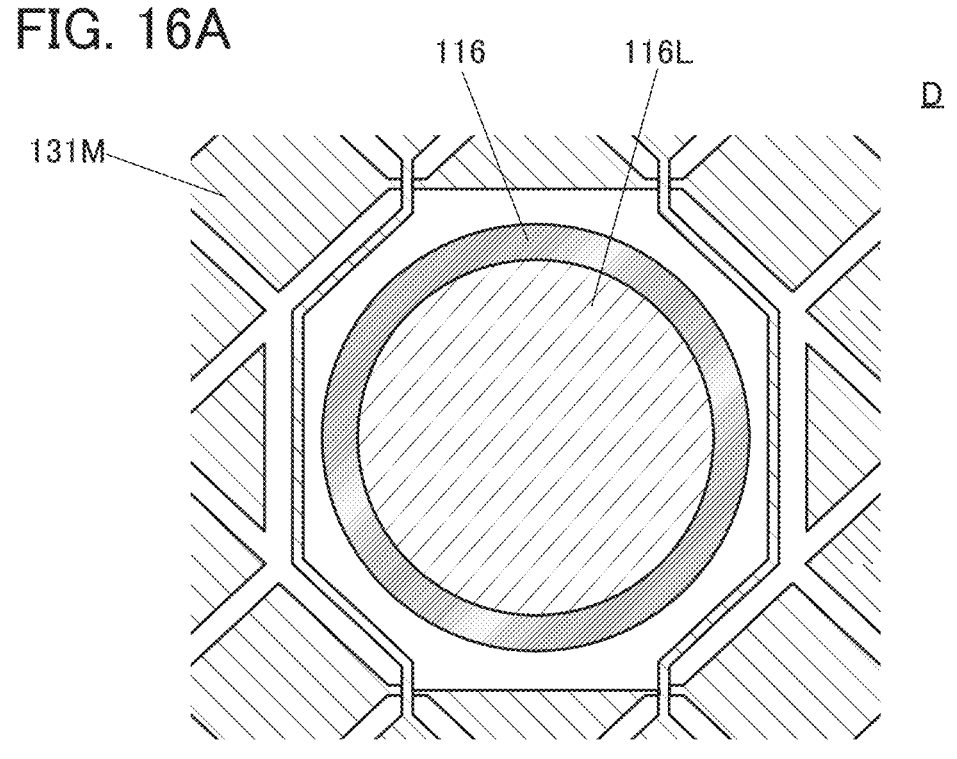
FIG. 16A and FIG. 16B are diagrams each illustrating a sensor electrode.
Figure 16B:
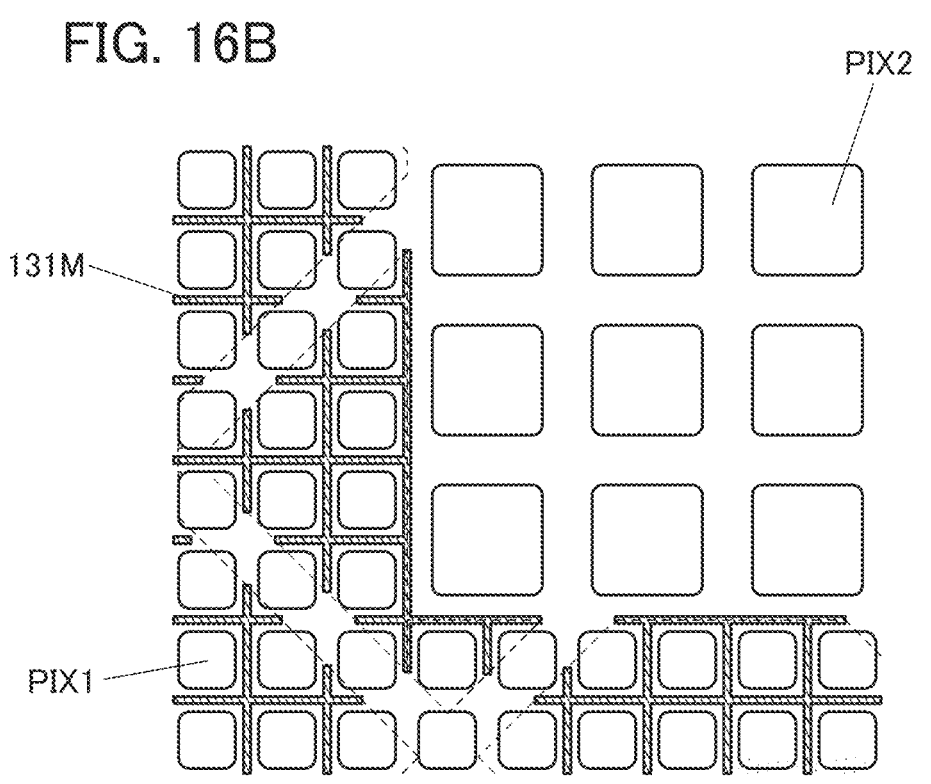

In FIG. 16A and FIG. 16B, the sensor electrode 130 is provided using the metal layer 131M in the region overlapping with the pixel PIX1, and the sensor electrode 130 is not provided in the region overlapping with the pixel PIX2. Since the diameter of the lens 116L is smaller than that of a fingertip or the like, there is no problem depending on the application even when a structure is employed in which the sensor electrode 130 is not provided over the camera 116. With this structure, an obstacle that blocks light entering the lens 116L is reduced to the minimum, so that the image capturing function can be easily increased.

Figure 17A:
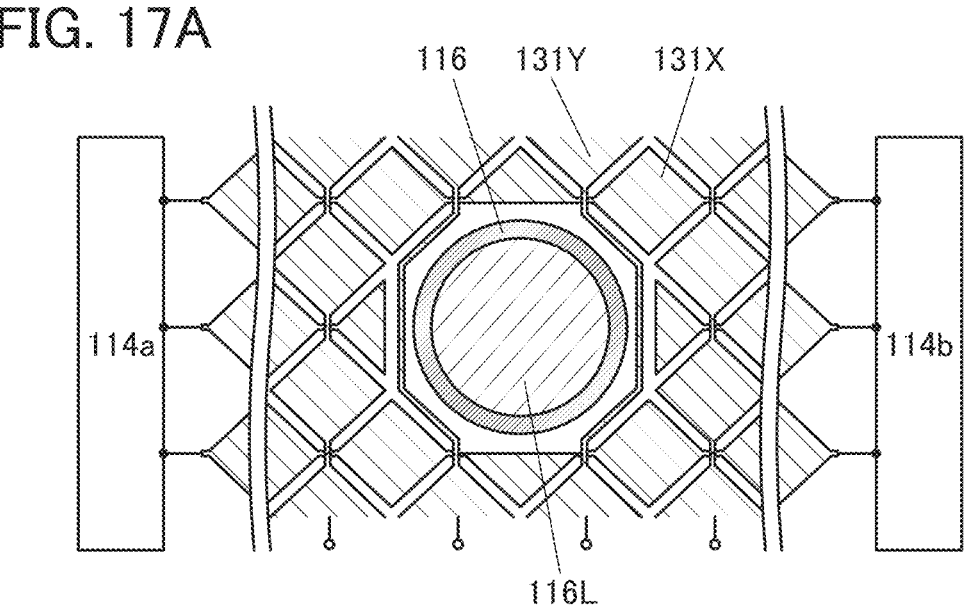
FIG. 17A and FIG. 17B are diagrams each illustrating a connection mode between a sensor electrode and driver circuits.

Note that in the structure illustrated in FIG. 16A and FIG. 16B, the sensor electrode 130 in a region overlapping with the camera 116 might be disconnected in one or both of the X direction and the Y direction. For example, in the case where the sensor electrode 130 is disconnected in the X direction, the driver circuits 114 (driver circuits 114a and 114b) are provided on both sides of the sensor electrode 130 and scanning is performed from both sides at the same timing to input pulse voltage as illustrated in FIG. 17A. In this case, since the disconnection does not occur in the Y direction, reading may be performed from one side in all the columns.

Figure 17B:
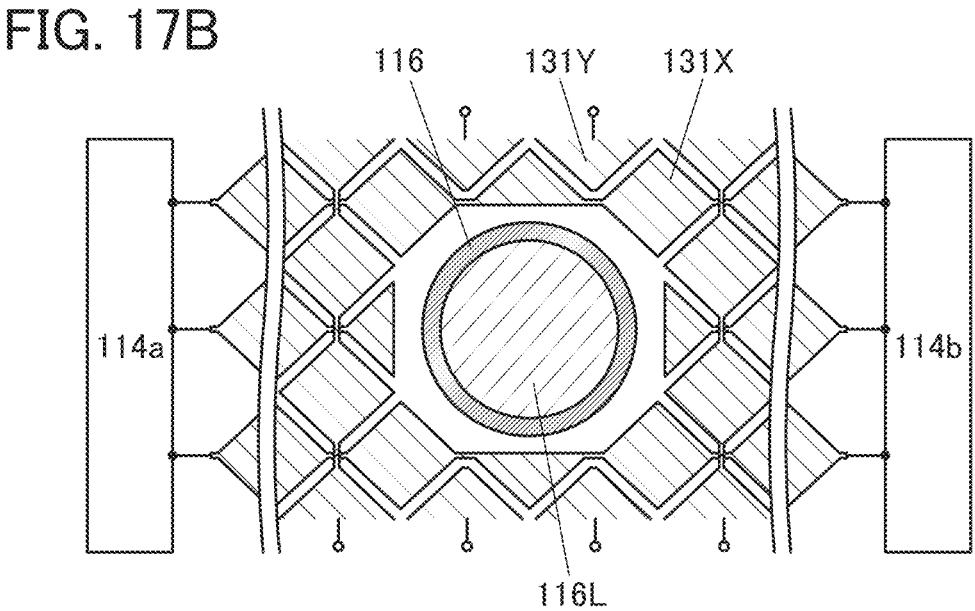

In the case where the sensor electrode 130 is disconnected in both the X direction and the Y direction, as illustrated in FIG. 17B, the driver circuits 114 (the driver circuits 114a and 114b) are provided on both sides of the sensor electrode 130 as in FIG. 17A. Then, scanning is performed from both sides at the same timing to input pulse voltage, and reading is performed from both sides of a column divided by disconnection of the sensor electrode 130 in the Y direction.

Note that in the above-described mode including the metal layer 131M, for example, the angle between the major axis of the metal layer 131M and the side of the outer periphery of the display portion is 45°; however, as illustrated in FIG. 18A, the metal layer 131M may be parallel to the side of the outer periphery of the sensor electrode 130. With this structure, the external light reflected by the metal layer 131M can be less likely to be seen.

In the above-described mode including the metal layer 131M, for example, the metal layer 131M is provided to surround one pixel PIX; however, the metal layer 131M may be provided to surround a plurality of pixels, such as three or six of pixels as illustrated in FIG. 18B and FIG. 18C.

At least part of this embodiment can be implemented in combination with any of the other embodiments described in this specification, as appropriate.

Embodiment 5

In this embodiment, examples of an electronic device including the above display device will be described with reference to FIG. 19A to FIG. 19F.

Examples of electronic devices including the display device of one embodiment of the present invention include display devices of televisions, monitors, and the like; lighting devices; desktop or laptop personal computers; word processors; image reproduction devices that reproduce still images and moving images stored in recording media such as DVD (Digital Versatile Disc); portable CD players; radios; tape recorders; headphone stereos; stereos; table clocks; wall clocks; cordless phone handsets; transceivers; mobile phones; car phones; portable game machines; tablet terminals; large-sized game machines such as pachinko machines; calculators; portable information terminals; electronic notebooks; e-book readers; electronic translators; audio input devices; video cameras; digital still cameras; electric shavers; high-frequency heating appliances such as microwave ovens; electric rice cookers; electric washing machines; electric vacuum cleaners; water heaters; electric fans; hair dryers; air-conditioning systems such as air conditioners, humidifiers, and dehumidifiers; dishwashers; dish dryers; clothes dryers; futon dryers; electric refrigerators; electric freezers; electric refrigerator-freezers; freezers for preserving DNA; flashlights; tools such as chain saws; smoke detectors; and medical equipment such as dialyzers. Other examples include industrial equipment such as guide lights, traffic lights, conveyor belts, elevators, escalators, industrial robots, power storage systems, and power storage devices for leveling the amount of power supply and smart grid.

In addition, moving objects and the like driven by electric motors using electric power from the power storage devices are also included in the category of electronic devices. Examples of the moving objects include electric vehicles (EVs), hybrid electric vehicles (HVs) that include both an internal-combustion engine and a motor, plug-in hybrid electric vehicles (PHVs), tracked vehicles in which caterpillar tracks are substituted for wheels of these vehicles, motorized bicycles including motor-assisted bicycles, motorcycles, electric wheelchairs, golf carts, boats, ships, submarines, helicopters, aircraft, rockets, artificial satellites, space probes, planetary probes, and spacecraft.

The display device of one embodiment of the present invention can be used for display portions and communication devices in any of the electronic devices.

The electronic devices may include a sensor (a sensor having a function of detecting, finding, or measuring force, displacement, position, speed, acceleration, angular velocity, rotational frequency, distance, light, liquid, magnetism, temperature, chemical substance, sound, time, hardness, electric field, current, voltage, electric power, radiation, flow rate, humidity, gradient, oscillation, odor, or infrared rays), for example.

The electronic device can have a variety of functions. For example, the electronic device can have a function of displaying a variety of data (a still image, a moving image, a text image, and the like) on the display portion, a touch panel function, a function of displaying a calendar, date, time, and the like, a function of executing a variety of software (programs), a wireless communication function, and a function of reading out a program or data stored in a recording medium.

FIG. 19A to FIG. 19F illustrate examples of electronic devices.

Figure 19A:
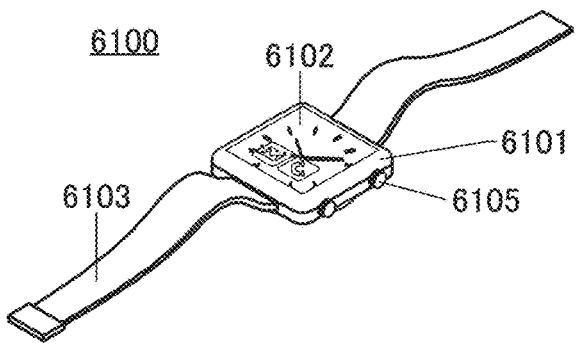
FIG. 19A to FIG. 19F are diagrams each illustrating a structure example of an electronic device.

FIG. 19A illustrates an example of a watch-type portable information terminal. A portable information terminal 6100 includes a housing 6101, a display portion 6102, a band 6103, operation buttons 6105, and the like. The use of the display device of one embodiment of the present invention in the display portion 6102 enables downsizing of the portable information terminal 6100.

Figure 19B:
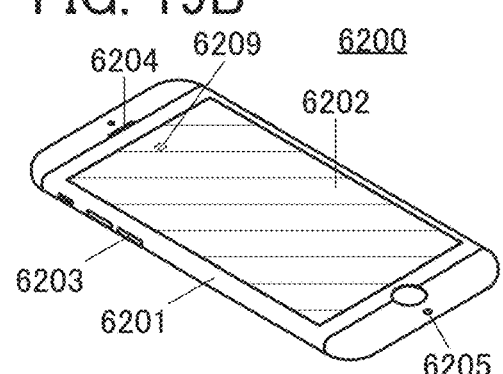

FIG. 19B illustrates an example of a portable telephone. A portable information terminal 6200 includes a display portion 6202 incorporated in a housing 6201, operation buttons 6203, a speaker 6204, a microphone 6205, and the like. The display portion 6202 includes a touch sensor and functions as a touch panel.

The portable information terminal 6200 further includes a camera 6209 in a region overlapping with the display portion 6202. With this structure, a pinhole or a notch formed in the display portion 6202 to place the camera can be omitted.

The use of the display device of one embodiment of the present invention in the display portion 6202 enables downsizing of the portable information terminal 6200.

Figure 19C:
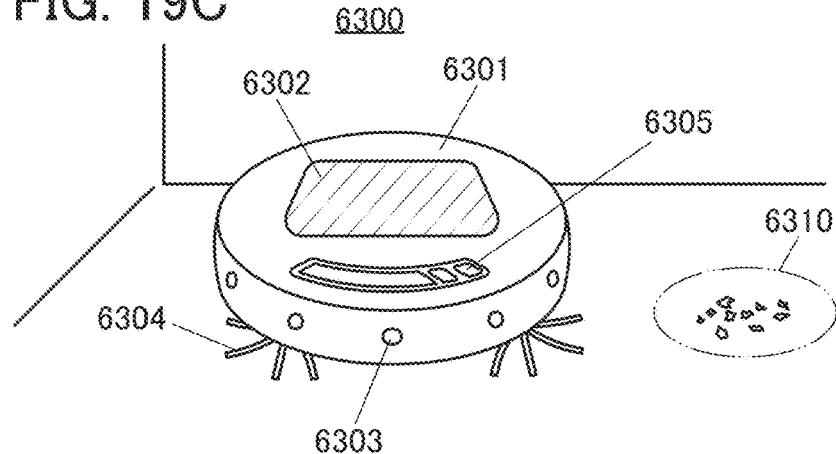

FIG. 19C illustrates an example of a cleaning robot. A cleaning robot 6300 includes a display portion 6302 placed on atop surface of a housing 6301, a plurality of cameras 6303 placed on a side surface of the housing 6301, a brush 6304, operation buttons 6305, a variety of sensors, and the like. The display portion 6302 includes a touch sensor and functions as a touch panel. Although not illustrated, the cleaning robot 6300 is provided with a tire, an inlet, and the like. The cleaning robot 6300 is self-propelled, detects dust 6310, and sucks up the dust through the inlet provided on a bottom surface.

For example, the cleaning robot 6300 can determine whether there is an obstacle such as a wall, furniture, or a step by analyzing images taken by the cameras 6303. In the case where the cleaning robot 6300 detects an object, e.g., wiring, that is likely to be caught in the brush 6304 by image analysis, the rotation of the brush 6304 can be stopped. The use of the display device of one embodiment of the present invention in the display portion 6302 enables downsizing of the cleaning robot 6300.

Figure 19D:
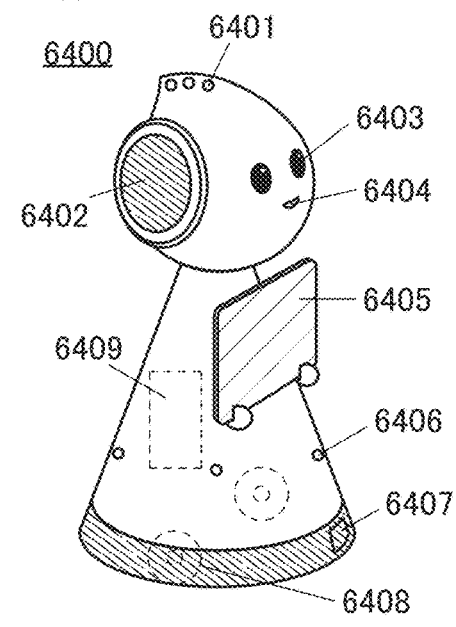

FIG. 19D illustrates an example of a robot. A robot 6400 illustrated in FIG. 19D includes an arithmetic device 6409, an illuminance sensor 6401, a microphone 6402, an upper camera 6403, a speaker 6404, a display portion 6405, a lower camera 6406, an obstacle sensor 6407, and a moving mechanism 6408.

The microphone 6402 has a function of detecting a speaking voice of a user, an environmental sound, and the like. The speaker 6404 has a function of outputting sound. The robot 6400 can communicate with a user using the microphone 6402 and the speaker 6404.

The display portion 6405 has a function of displaying various kinds of information. The robot 6400 can display information desired by a user on the display portion 6405. The display portion 6405 includes a touch sensor and functions as a touch panel. Moreover, the display portion 6405 may be a detachable information terminal, in which case charging and data communication can be performed when the display portion 6405 is set at the home position of the robot 6400.

The display portion 6405 includes an illuminance sensor, a camera, an operation button, or the like, and the display portion 6405 can be operated by a touch with a stylus pen or the like. The functions of the display portion 6405 include a voice call, a video call, e-mailing, an appointment organizer, Internet communication, music reproduction, and the like.

The upper camera 6403 and the lower camera 6406 have a function of capturing an image of the surroundings of the robot 6400. The obstacle sensor 6407 can detect an obstacle in the direction where the robot 6400 advances with the moving mechanism 6408. The robot 6400 can move safely by recognizing the surroundings with the upper camera 6403, the lower camera 6406, and the obstacle sensor 6407. The light-emitting apparatus of one embodiment of the present invention can be used for the display portion 6405.

The use of the display device of one embodiment of the present invention in the display portion 6302 enables downsizing of the robot 6400.

Figure 19E:
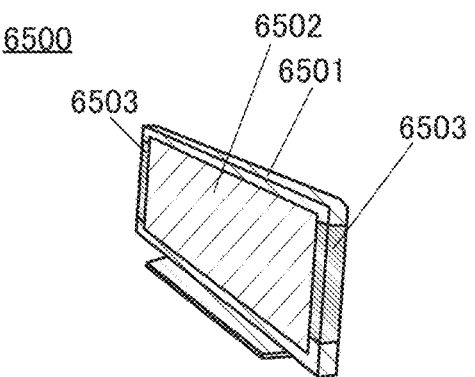

FIG. 19E illustrates an example of a television receiver. A television receiver 6500 illustrated in FIG. 19E includes a housing 6501, a display portion 6502, a speaker 6503, and the like.

The use of the display device of one embodiment of the present invention in the display portion 6502 enables downsizing of the television receiver 6500. The display portion 6202 includes a touch sensor and functions as a touch panel.

Figure 19F:
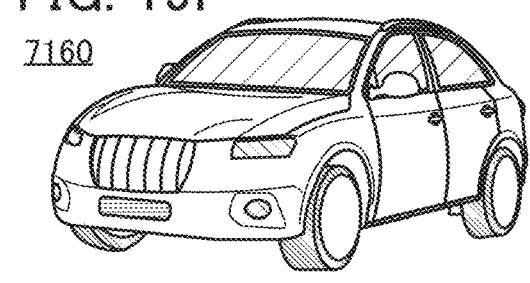

FIG. 19F illustrates an example of an automobile. An automobile 7160 includes an engine, tires, a brake, a steering gear, a camera, and the like. The automobile 7160 further includes the display device of one embodiment of the present invention inside. The display device includes a touch sensor and functions as a touch panel.

Figure 20A:
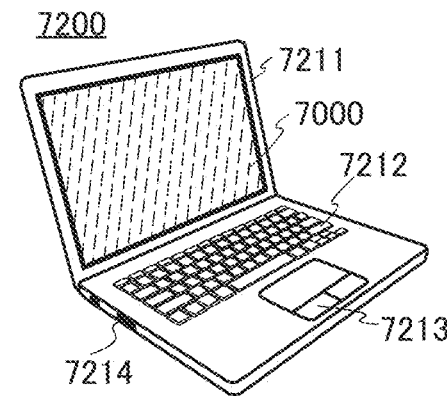
FIG. 20A to FIG. 20C are diagrams each illustrating a structure example of an electronic device.

FIG. 20A illustrates an example of a laptop personal computer. A laptop personal computer 7200 includes a housing 7211, a keyboard 7212, a pointing device 7213, an external connection port 7214, and the like. A display portion 7000 is incorporated in the housing 7211. The display portion 7000 includes a touch sensor and functions as a touch panel.

Figure 20B:
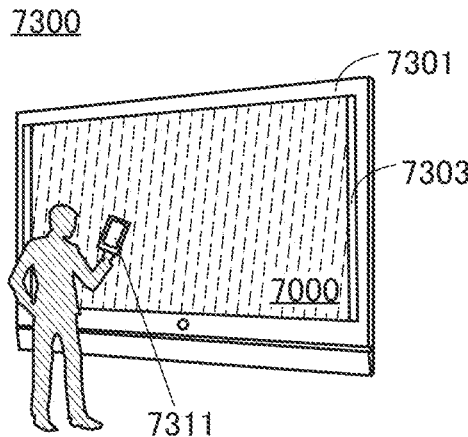
Figure 20C:
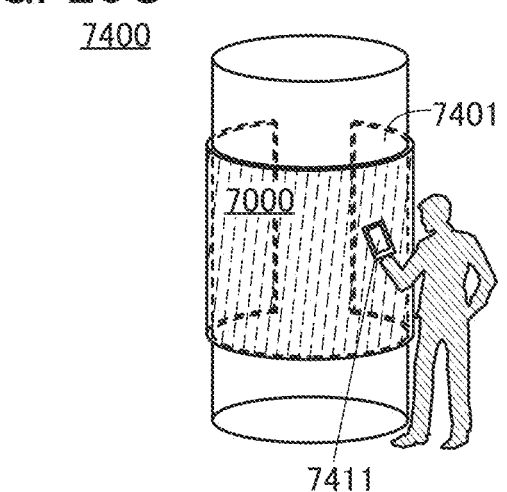

FIG. 20B and FIG. 20C illustrate examples of digital signage.

Digital signage 7300 illustrated in FIG. 20B includes a housing 7301, the display portion 7000, a speaker 7303, and the like. The digital signage 7300 can also include an LED lamp, an operation key (including a power switch or an operation switch), a connection terminal, a variety of sensors, a microphone, and the like.

FIG. 20C is digital signage 7400 attached to a cylindrical pillar 7401. The digital signage 7400 includes the display portion 7000 provided along a curved surface of the pillar 7401.

In FIG. 20B and FIG. 20C, the display portion 7000 includes a touch sensor and functions as a touch panel.

Next, an example of an electronic device provided with a foldable display device will be described with reference to FIG. 21A and FIG. 21B. An electronic device 500 provided with the display device of one embodiment of the present invention has the display device including a region 501A, a region 501B, and a region 501C in a housing 502, as illustrated in FIG. 21A. Since the display device is foldable, the region 501B and the region 501C in a folded shape can be stored in the housing 502; thus, the region 501B and the region 501C can be placed in bent portions.

FIG. 21B is a cross-sectional view taken along X1-X2 of the electronic device 500 illustrated in FIG. 21A. As illustrated in FIG. 21B, in the electronic device 500, the display device with the folded substrate 110 and substrate 140 is stored in the housing 502. A substrate 540 connected to the display device is also provided in the housing 502. The housing 502 protects the display device and the like from external stress.

The region 501A, the region 501B, and the region 501C that correspond to a display portion can be placed not only in flat portions but also in bent portions of the housing 502. The region 501A, the region 501B, and the region 501C each include a touch sensor and function as a touch panel.

An example of an electronic device provided with a foldable display device, which is different from that in FIG. 21A and FIG. 21B, will be described with reference to FIG. 21C. An electronic device 500A provided with the display device of one embodiment of the present invention includes a display device 501 stored in the foldable housing 502, as illustrated in FIG. 21C. The housing 502 and the display device 501 are both foldable display devices, and thus a foldable electronic device can be provided.

As illustrated in FIG. 21C, the electronic device 500A includes the substrate 110 and the substrate 140 which are provided along the housing 502. The display device 501 can be provided regardless of the shape of the electronic device 500. The structure of the electronic device in FIG. 21C makes it possible to obtain a structure that can be changed in shape.

The structures, configurations, methods, and the like described in this embodiment can be used in combination as appropriate with the structures, configurations, methods, and the like described in the other embodiments.

REFERENCE NUMERALS

AL: wiring, CL: wiring, GL: gate line, PIX: pixel, RL: wiring, SL: source line, 90B: light-emitting device, 90G: light-emitting device, 90R: light-emitting device, 100T: transistor, 100: display device, 110: substrate, 111: display portion, 112: driver circuit, 113: driver circuit, 114a: driver circuit, 114b: driver circuit, 114: driver circuit, 116L: lens, 116: camera, 118: FPC, 119: FPC, 120a: pixel, 120b: pixel, 120: pixel, 121: pixel array, 122a: subpixel, 122b: subpixel, 122c: subpixel, 122: subpixel, 130X: sensor electrode, 130Y: sensor electrode, 130: sensor electrode, 131M: metal layer, 131T: light-transmitting conductive film, 131X: conductive layer, 131Y: conductive layer, 132: conductive layer, 135: light-blocking layer, 140: substrate, 142a: conductive layer, 142b: conductive layer, 146a: conductive layer, 146b: conductive layer, 148: layer, 149a: conductive layer, 149b: conductive layer, 150: solid sealing layer, 151: insulating layer, 153: adhesive layer, 165: wiring, 166: conductive layer, 201: transistor, 202: transistor, 203: transistor, 204: transistor, 205: transistor, 209: transistor, 210: transistor, 211: insulating layer, 213: insulating layer, 214: insulating layer, 215: insulating layer, 218: insulating layer, 221: conductive layer, 222a: conductive layer, 222b: conductive layer, 223: conductive layer, 225: insulating layer, 230: connection portion, 231i: channel formation region, 231n: low-resistance region, 231: semiconductor layer, 232: connection portion, 242: connection layer, 301: insulating layer, 311a: connection electrode, 311b: connection electrode, 311B: pixel electrode, 311G: pixel electrode, 311: pixel electrode, 312B: organic layer, 312G: organic layer, 313: common electrode, 315: metal layer, 321: protective layer, 322: insulating layer, 325: insulating layer, 326: resin layer, 327B: protective layer, 327G: protective layer, 328: insulating layer, 330a: connection portion, 330b: connection portion, 340: insulating layer, 402: substrate, 404e: conductive layer, 404: conductive layer, 406: insulating layer, 407a: insulating layer, 407b: insulating layer, 407c: insulating layer, 407: insulating layer, 408: semiconductor layer, 412a: conductive layer, 412a_1: conductive layer, 412a_2: conductive layer, 412b: conductive layer, 415: conductive layer, 441: opening, 500A: electronic device, 500: electronic device, 501A: region, 501B: region, 501C: region, 501: display device, 502: housing, 540: substrate, 6100: portable information terminal, 6101: housing, 6102: display portion, 6103: band, 6105: operation button, 6200: portable information terminal, 6201: housing, 6202: display portion, 6203: operation button, 6204: speaker, 6205: microphone, 6209: camera, 6300: cleaning robot, 6301: housing, 6302: display portion, 6303: camera, 6304: brush, 6305: operation button, 6310: dust, 6400: robot, 6401: illuminance sensor, 6402: microphone, 6403: upper camera, 6404: speaker, 6405: display portion, 6406: lower camera, 6407: obstacle sensor, 6408: moving mechanism, 6409: arithmetic device, 6500: television receiver, 6501: housing, 6502: display portion, 6503: speaker, 7000: display portion, 7160: automobile, 7200: laptop personal computer, 7211: housing, 7212: keyboard, 7213: pointing device, 7214: external connection port, 7300: digital signage, 7301: housing, 7303: speaker, 7400: digital signage, 7401: pillar

The invention claimed is:

1. A display device comprising:

a pixel circuit comprising a first transistor;

a light-emitting device comprising a first electrode electrically connected to one of a source and a drain of the first transistor, a second electrode, and a light-emitting layer between the first electrode and the second electrode;

a first insulating layer over the second electrode;

a sensor electrode over the first insulating layer; and a first driver circuit comprising a second transistor, wherein the first driver circuit is configured to supply a signal potential to the sensor electrode, wherein the pixel circuit and the first driver circuit are over a first substrate, wherein the pixel circuit is in a display portion, wherein the second electrode is electrically connected to a power supply line in a connection portion outside the display portion, wherein the first insulating layer comprises an opening outside the connection portion, wherein the sensor electrode is electrically connected to one of a source and a drain of the second transistor through the opening, and wherein a channel formation region of the second transistor is along a side surface of a second insulating layer over the first substrate.

2. The display device according to claim 1, wherein the sensor electrode is electrically connected to one of the source and the drain of the second transistor through a connection electrode.

3. The display device according to claim 2, wherein the connection electrode is on a same surface as the first electrode.

4. The display device according to claim 1, wherein a channel formation region of the first transistor is along the side surface of the second insulating layer.

5. The display device according to claim 1, wherein the channel formation region of the second transistor comprises a metal oxide.

6. The display device according to claim 1, comprising a second driver circuit, wherein the pixel circuit comprises a third transistor, wherein the second driver circuit is a gate driver and comprises a fourth transistor, wherein one of a source and a drain of the fourth transistor is electrically connected to a gate of the third transistor, and wherein a channel formation region of the fourth transistor is along the side surface of the second insulating layer.

7. The display device according to claim 6, wherein the channel formation region of the fourth transistor comprises a metal oxide.

8. The display device according to claim 1, comprising a third driver circuit, wherein the pixel circuit comprises a fifth transistor, wherein the third driver circuit is a source driver and comprises a sixth transistor, wherein one of a source and a drain of the sixth transistor is electrically connected to one of a source and a drain of the fifth transistor, and wherein a channel formation region of the sixth transistor is along the side surface of the second insulating layer.

9. The display device according to claim 8, wherein the channel formation region of the sixth transistor comprises a metal oxide.

10. The display device according to claim 1, wherein a camera is on a second surface side of the first substrate opposite to a first surface provided with the pixel circuit, and wherein a first region of the display portion overlapping with a lens of the camera has a first pixel pitch larger than a second pixel pitch of a second region of the display portion not overlapping with the lens of the camera.

11. The display device according to claim 10, wherein in the first region and the second region, the sensor electrode comprises a metal layer and overlaps with a wiring electrically connected to the pixel circuit.

12. The display device according to claim 10, wherein in the first region, the sensor electrode comprises a light-transmitting conductive film, wherein in the second region, the sensor electrode comprises a metal layer and overlaps with a wiring electrically connected to the pixel circuit, and wherein the light-transmitting conductive film extends to the second region and electrically connected to the metal layer.

13. The display device according to claim 10, wherein in the second region, the sensor electrode comprises a metal layer and overlaps with a wiring electrically connected to the pixel circuit, and wherein in the first region, the sensor electrode is not provided.

14. An electronic device comprising the display device according to claim 1, and a speaker.

15. A display device comprising:

a pixel circuit comprising a first transistor;

a light-emitting device comprising a first electrode electrically connected to one of a source and a drain of the first transistor, a second electrode, and a light-emitting layer between the first electrode and the second electrode;

a first insulating layer over the second electrode;

a sensor electrode over the first insulating layer; and a first driver circuit comprising a second transistor, wherein the first driver circuit is configured to supply a signal potential to the sensor electrode, wherein the pixel circuit and the first driver circuit are over a first substrate, wherein the pixel circuit is in a display portion, wherein the second electrode is electrically connected to a power supply line in a connection portion outside the display portion, wherein the first insulating layer comprises an opening outside the connection portion, and wherein the sensor electrode is electrically connected to one of a source and a drain of the second transistor through the opening.

16. The display device according to claim 15, wherein the sensor electrode is electrically connected to one of the source and the drain of the second transistor through a connection electrode.

17. The display device according to claim 16, wherein the connection electrode is on a same surface as the first electrode.

18. The display device according to claim 15, wherein a camera is on a second surface side of the first substrate opposite to a first surface provided with the pixel circuit, and wherein a first region of the display portion overlapping with a lens of the camera has a first pixel pitch larger than a second pixel pitch of a second region of the display portion not overlapping with the lens of the camera.

* * * * *